(12) United States Patent
Wang et al.

(10) Patent No.: US 10,418,435 B2
(45) Date of Patent: Sep. 17, 2019

(54) PIXEL STRUCTURE AND DISPLAY PANEL

(71) Applicants: Industrial Technology Research Institute, Hsinchu (TW); Intellectual Property Innovation Corporation, Hsinchu (TW)

(72) Inventors: Tai-Jui Wang, Kaohsiung (TW); Chieh-Wei Feng, Taoyuan (TW); Meng-Jung Yang, Taoyuan (TW); Wei-Han Chen, Taipei (TW); Shao-An Yan, New Taipei (TW); Tsu-Chiang Chang, New Taipei (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/691,755

(22) Filed: Aug. 31, 2017

(65) Prior Publication Data

US 2019/0013378 A1    Jan. 10, 2019

(30) Foreign Application Priority Data

Jul. 5, 2017    (TW) .............................. 106122484 A

(51) Int. Cl.
*H01L 27/12*    (2006.01)
*H01L 27/32*    (2006.01)

(52) U.S. Cl.
CPC ...... *H01L 27/3276* (2013.01); *H01L 27/3262* (2013.01); *H01L 27/3265* (2013.01);
(Continued)

(58) Field of Classification Search
CPC ............. H01L 27/3276; H01L 27/3262; H01L 27/3265; H01L 27/3272; H01L 27/1218;
(Continued)

(56) References Cited

U.S. PATENT DOCUMENTS 7,154,119 B2    12/2006   Yamazaki et al.
9,653,496 B2    3/2017    Sun et al.
(Continued)

FOREIGN PATENT DOCUMENTS

CN         103441137        12/2013
CN         103681690         3/2014
(Continued)

OTHER PUBLICATIONS

"Office Action of Related U.S. Appl. No. 14/983,548," dated Sep. 5, 2017, p. 1-p. 26.
(Continued)

*Primary Examiner* — Asok K Sarkar
*Assistant Examiner* — Dmitriy Yemelyanov
(74) *Attorney, Agent, or Firm* — JCIPRNET

(57) ABSTRACT

A pixel structure including a substrate, a power wire, a planarization layer, a drive circuit and a conductive structure is provided. The substrate has a layout area and a light-transmitting area located outside the layout area. The power wire is disposed on the layout area of the substrate. The power wire includes a shielding layer. The planarization layer is disposed on the substrate and covers the power wire. The drive circuit is disposed on the planarization layer and corresponds to the layout area. The drive circuit includes a first active device. The shielding layer overlaps with the first active device. The conductive structure is disposed in the planarization layer and distributed corresponding to the layout area. The power wire is electrically connected with the drive circuit through the conductive structure. A display panel is also provided.

20 Claims, 47 Drawing Sheets

(52) U.S. Cl.
CPC ........ *H01L 27/3272* (2013.01); *H01L 27/124* (2013.01); *H01L 27/1218* (2013.01); *H01L 27/1255* (2013.01); *H01L 27/1262* (2013.01); *H01L 2227/323* (2013.01)

(58) Field of Classification Search
CPC ............... H01L 27/124; H01L 27/1255; H01L 27/1262; H01L 2227/323
See application file for complete search history.

(56) References Cited

U.S. PATENT DOCUMENTS

| | | | |
|---|---|---|---|
| 9,627,462 | B2 | 4/2017 | Kwon et al. |
| 2003/0155860 | A1 | 8/2003 | Choi et al. |
| 2005/0247937 | A1 | 11/2005 | Yamazaki et al. |
| 2005/0258426 | A1* | 11/2005 | Shin .................. H01L 27/3248 257/72 |
| 2008/0153214 | A1* | 6/2008 | Jung ................ H01L 21/02532 438/164 |
| 2008/0252203 | A1 | 10/2008 | Lee |
| 2012/0140424 | A1 | 6/2012 | Sato |
| 2014/0319546 | A1 | 10/2014 | Xi et al. |
| 2015/0060809 | A1 | 3/2015 | Kim et al. |
| 2015/0091005 | A1 | 4/2015 | Park |
| 2015/0206929 | A1* | 7/2015 | Sato ..................... H01L 27/32 257/40 |
| 2015/0357349 | A1 | 12/2015 | Lee et al. |
| 2015/0364505 | A1 | 12/2015 | Lee |
| 2017/0186367 | A1 | 6/2017 | Jhong et al. |

FOREIGN PATENT DOCUMENTS

| | | |
|---|---|---|
| CN | 104157678 | 11/2014 |
| CN | 104299980 | 1/2015 |
| CN | 106229297 | 12/2016 |
| TW | I230918 | 4/2005 |
| TW | 201214628 | 4/2012 |
| TW | 201521196 | 6/2015 |
| TW | 201533628 | 9/2015 |
| TW | 201533897 | 9/2015 |
| TW | I528563 | 4/2016 |
| TW | I569426 | 2/2017 |

OTHER PUBLICATIONS

"Office Action of Related U.S. Appl. No. 14/983,548," dated Dec. 14, 2017, p. 1-p. 22.
"Office Action of Related U.S. Appl. No. 14/983,548," dated Apr. 20, 2018, p. 1-p. 19.
"Allowance of Taiwan Related Application, application No. 104143653", dated Dec. 6, 2016, p. 1-p. 3.
"Office Action of Taiwan Counterpart Application," dated Dec. 29, 2017, p. 1-p. 7.
"Office Action of China Related Application, application No. 201610090201.4", dated Mar. 5, 2019, p. 1-p. 7.

* cited by examiner

PIXEL STRUCTURE AND DISPLAY PANEL

CROSS-REFERENCE TO RELATED APPLICATION

This application claims the priority benefit of a Taiwan application serial no. 106122484, filed on Jul. 5, 2017. The entirety of the above-mentioned patent application is hereby incorporated by reference herein.

BACKGROUND OF THE DISCLOSURE

Field of the Disclosure

The disclosure relates to a pixel structure, and particularly relates to a pixel structure having a shielding layer and a display panel using the pixel structure.

Description of Related Art

Along with development of technology, various display devices are continually developed. In some display devices, besides that a viewer may view images displayed on a display panel, the viewer may also see through the display panel to view a scene behind the display panel. These display devices gradually draw more and more attentions because of their light-transmitting characteristic.

However, the light-transmitting display panels are liable to be interfered by an external environment (ex. an external light or static electricity) to influence a display quality thereof. When the display device is used, the external light irradiates the display panel to cause a current leakage of the display panel, which decreases the display quality of the display panel. Moreover, when the display device is used, the static electricity generated by friction may also decrease the display quality of the display panel. Therefore, a method for resolving the above problems is required.

SUMMARY OF THE DISCLOSURE

An embodiment of the disclosure provides a pixel structure including a substrate, a power wire, a planarization layer, a driving circuit and a conductive structure. The substrate has a layout area and a light-transmitting area located outside the layout area. The power wire is disposed on the layout area of the substrate. The power wire includes a shielding layer. The planarization layer is disposed on the substrate to cover the power wire. The driving circuit is disposed on the planarization layer and corresponds to the layout area. The driving circuit includes a first active device. The shielding layer is overlapped with the first active device. The conductive structure is disposed in the planarization layer and distributed corresponding to the layout area. The power wire is electrically connected with the driving circuit through the conductive structure.

An embodiment of the disclosure provides a display panel including the aforementioned pixel structure and a display device. The display device is electrically connected to the driving circuit.

In order to make the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

FIGS. 1A-1F are top views of a method for manufacturing a pixel structure of a display panel according to a first embodiment of the disclosure. FIGS. 2A-2F are cross-sectional views of FIGS. 1A-1F along section lines AA', BB', CC' and DD'.

Figure 1A:
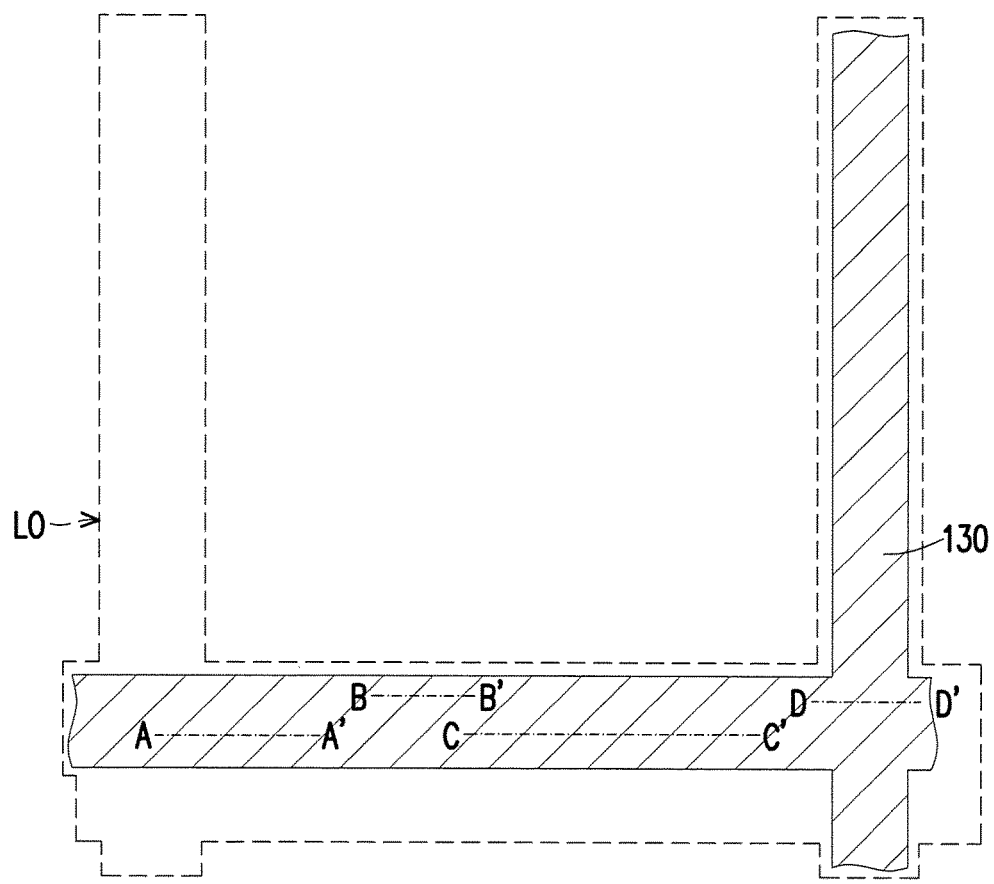
FIGS. 1A-1F are top views of a method for manufacturing a pixel structure of a display panel according to a first embodiment of the disclosure.
Figure 2A:
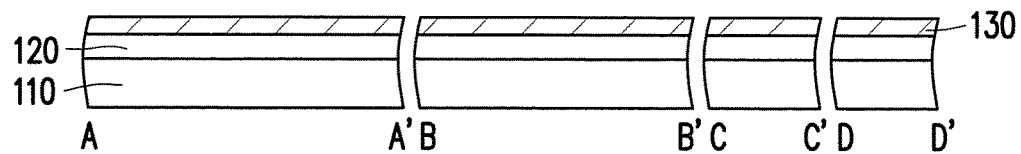
FIGS. 2A-2F are cross-sectional views of FIGS. 1A-1F along section lines AA', BB', CC' and DD'.

Referring to FIG. 1A and FIG. 2A, in the pixel structure of the display panel, a substrate 110 has a layout area LO and a light-transmitting area located outside the layout area LO. A shielding layer 130 is formed on the layout area LO of the substrate 110, and is a part of a power wire. A method for forming the shielding layer 130 is, for example, a photoengraving process. In some embodiments, a material of the shielding layer 130 includes titanium, copper, cobalt, nickel, aluminum, molybdenum, tungsten, gold, silver or other conductive material. In some embodiments, the substrate 110 may be a flexible substrate, and a material of the substrate is, for example, polyethylene terephthalate (PET), polyethylene naphthalate (PEN), polyester (PES), polymethylmethacrylate (PMMA), polycarbonate (PC), polyimide (PI) or a metal foil, or other flexible materials. In an embodiment, the substrate 110 is a transparent substrate.

In some embodiments, a barrier layer 120 may be disposed between the shielding layer 130 and the substrate 110, where the barrier layer 120 is, for example, a water and gas barrier layer. In some embodiments, a material of the barrier layer 120, for example, includes silicon oxide, silicon nitride, aluminium oxide or a combination thereof. In some embodiments, a thickness of the barrier layer 120 is, for example, from about 100 nm to about 1000 nm, and in an embodiment, the thickness of the barrier layer 120 is, for example, from about 100 nm to about 600 nm, and in an embodiment, the thickness of the barrier layer 120 is, for example, about 300 nm. In some embodiments, the barrier layer 120 may include a multi-layered structure. In some embodiments, the substrate 110 may have a function for blocking water and gas, so that it is unnecessary to additionally form the barrier layer 120.

Figure 1B:
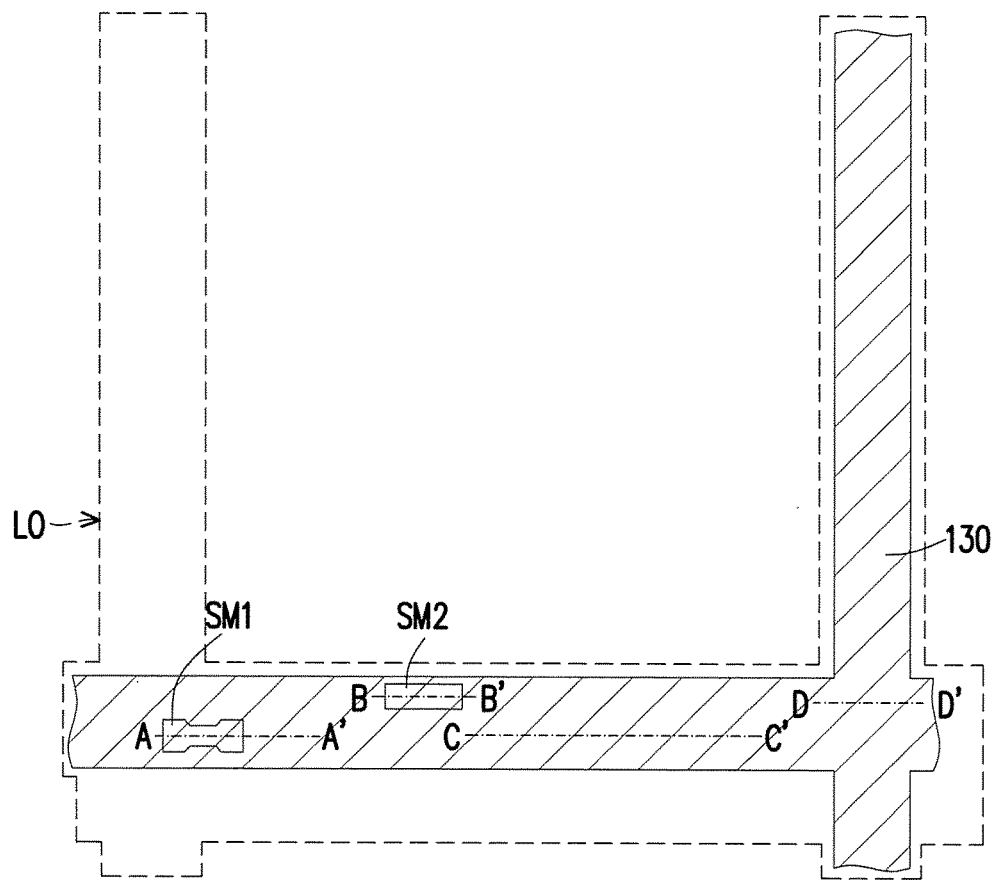
Figure 2B:
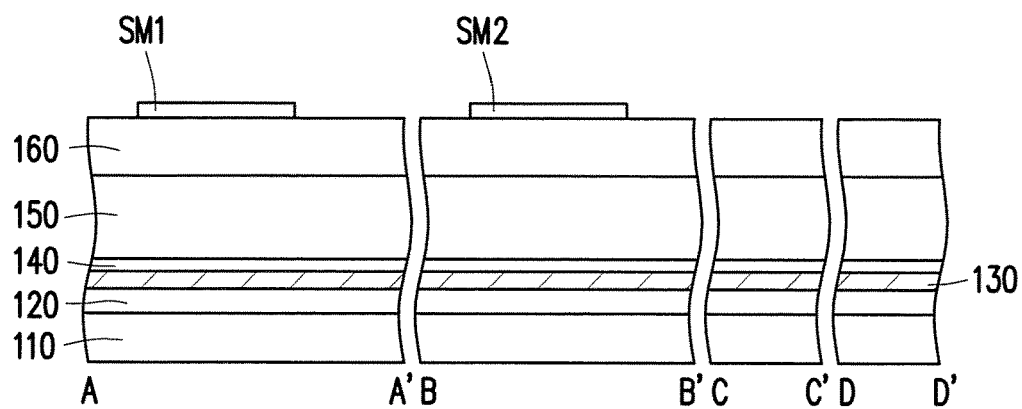

Then, referring to FIG. 1B and FIG. 2B, a planarization layer 150 is formed on the substrate 110, where the planarization layer 150 covers the shielding layer 130. In some embodiments, the planarization layer 150 covers the power wire including the shielding layer 130. In some embodiments, a material of the planarization layer 150 is, for example, a non-photosensitive dielectric material or a photosensitive dielectric material. In some embodiments, the material of the planarization layer 150 may be a non-photosensitive polymer materials or a photosensitive polymer material, for example, phenol-formaldehyde, polyimide, siloxane, polymethylmethacrylate, polyetherimide, phenolics, polybenzoxazole, benzocyclobutene, or other proper materials or a combination thereof. In some embodiments, a method for forming the planarization layer 150, for example, includes a coating process. In some embodiments, a thickness of the planarization layer 150 is, for example, greater than or equal to 0.1 μm. In some embodiments, the thickness of the planarization layer 150 is, for example, from about 0.5 μm to about 1.5 μm. In some embodiments, the thickness of the planarization layer 150 is, for example, about 0.65 μm. The planarization layer 150 may planarize step difference caused by a conductive structure (for example, the power wire) to avoid a situation that the step difference caused by the conductive structure influences an electrical property of a thin-film transistor (TFT). A flatness of the planarization layer 150 is equal to [1-(a surface height difference after the planarization layer is formed/a surface height difference before the planarization layer is formed)]*100%. In some embodiments, the flatness of the planarization layer 150 is greater than or substantially equal to 50%. In some embodiments, by configuring the planarization layer 150, increase of a parasitic capacitance is mitigated and a problem caused by electrical abnormity of a subsequently formed driving circuit is mitigated.

In some embodiments, an inter-layer 140 is disposed between the planarization layer 150 and the shielding layer 130. In some embodiments, a material of the inter-layer 140 includes silicon nitride. In some embodiments, a thickness of the inter-layer 140 is, for example, from about 100 nm to about 600 nm, and in an embodiment, the thickness of the inter-layer 140 is, for example, about 300 nm. In some embodiments, the shielding layer 130 made of an inorganic material and the planarization layer 150 made of an organic material may be separated by the inter-layer 140, which mitigates abnormity probably generated during an annealing process of the shielding layer 130. In some embodiments, the material of the inter-layer 140, for example, includes an inorganic material such as $SiO_x$, $SiN_x$, SiON, $Al_2O_3$ or a combination thereof.

Then, a first channel layer SM1 and a second channel layer SM2 are formed on the layout area LO of the substrate 110. In some embodiments, a buffer layer 160 is first formed on the planarization layer 150, and then the first channel layer SM1 and the second channel layer SM2 are formed on the buffer layer 160. In other words, in some embodiments, the buffer layer 160 is disposed between the first channel layer SM1 and the planarization layer 150, and the buffer layer 160 is also disposed between the second channel layer SM2 and the planarization layer 150. A method for forming the first channel layer SM1 and the second channel layer SM2 includes a patterning process. In some embodiments, the method for forming the first channel layer SM1 and the second channel layer SM2 includes depositing amorphous silicon first, and then transforming the amorphous silicon into polysilicon by using a laser annealing process. In an embodiment, a grain size of the first channel layer SM1 and the second channel layer SM2 ranges between about 0.1 μm and about 1 μm.

Figure 1C:
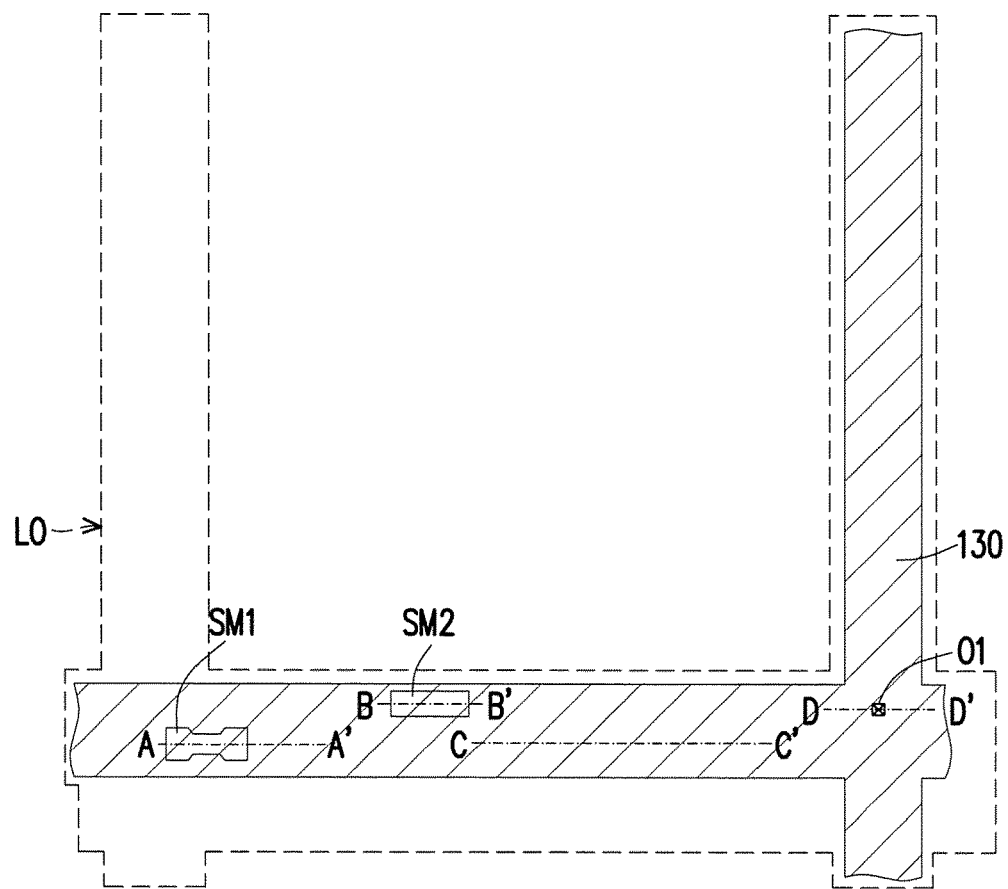
Figure 2C:
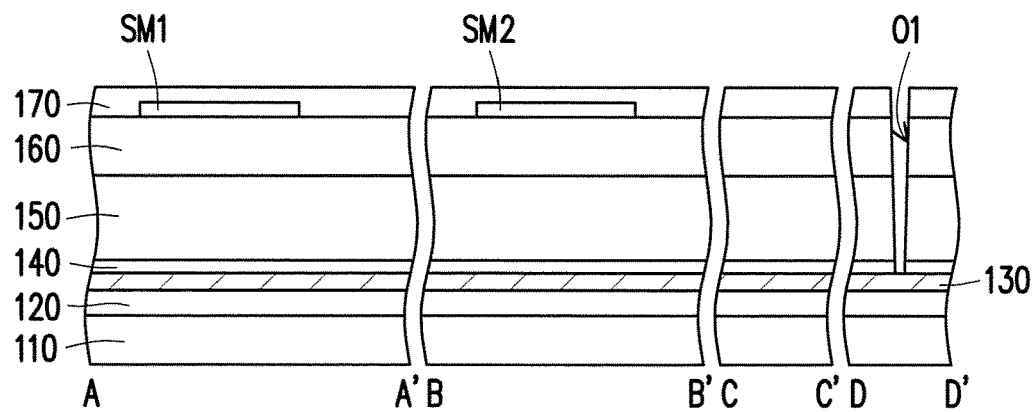

Then, referring to FIG. 1C and FIG. 2C, a gate insulation layer 170 is formed on the first channel layer SM1 and the second channel layer SM2. The gate insulation layer 170 covers the first channel layer SM1 and the second channel layer SM2. An opening O1 is formed by an etching process, and the opening O1 exposes a part of the shielding layer 130. In some embodiments, the opening O1 penetrates through the inter-layer 140, the planarization layer 150, the buffer layer 160 and the gate insulation layer 170.

Figure 1D:
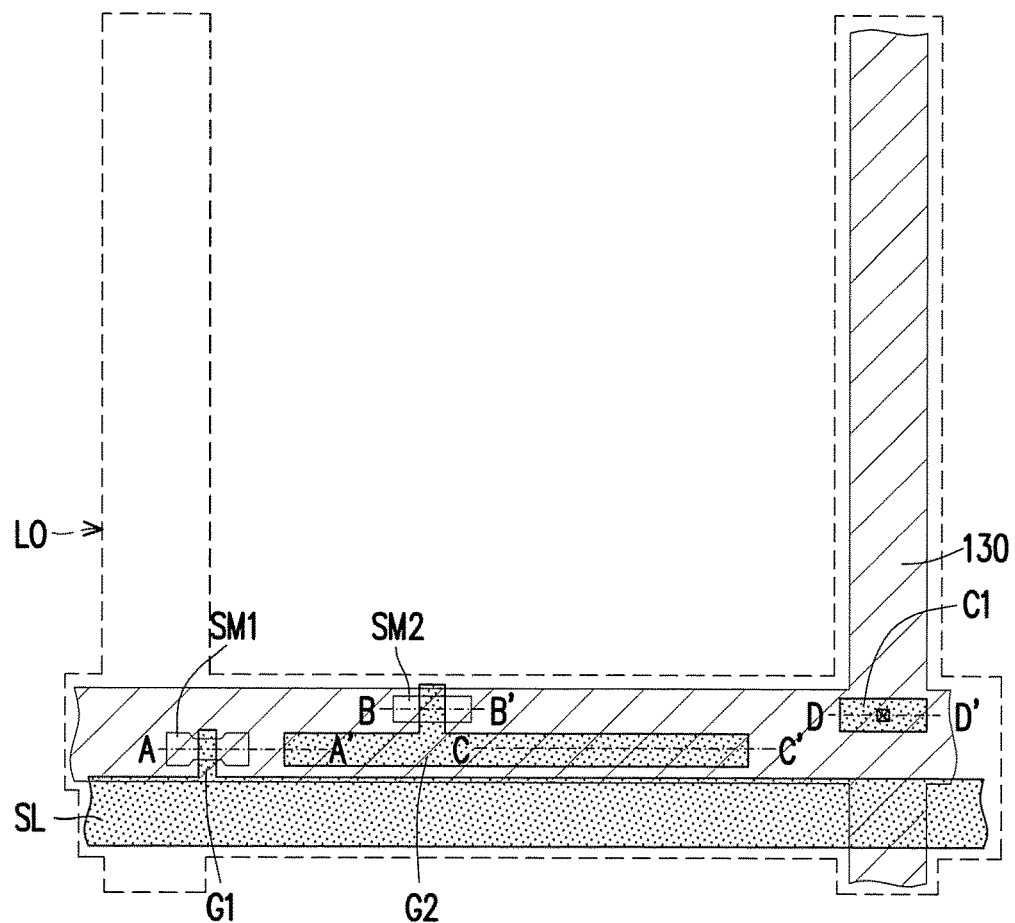
Figure 2D:
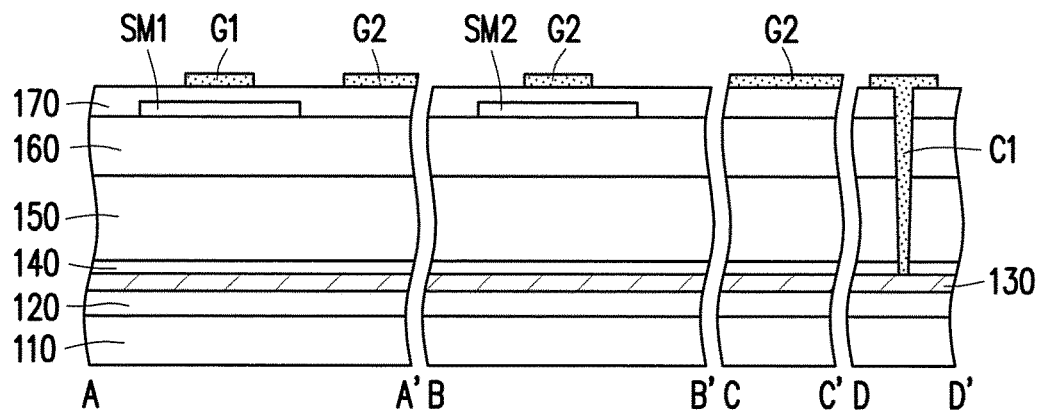

Referring to FIG. 1D and FIG. 2D, a scan line SL, a first gate G1 and a second gate G2 are formed on the gate insulation layer 170. The scan line SL, the first gate G1 and the second gate G2 are, for example, located on the layout area LO of the substrate 110. The scan line SL is connected to the first gate G1. The first gate G1 and the scan line SL are separated from the second gate G2. The first gate G1 is formed on the first channel layer SM1, and the gate insulation layer 170 is configured between the first gate G1 and the first channel layer SM1. The second gate G2 is formed on the second channel layer SM2, and the gate insulation layer 170 is configured between the second gate G2 and the second channel layer SM2. In an embodiment, while the scan line SL, the first gate G1 and the second gate G2 are formed, a conductive structure C1 is formed in the opening O1, and the conductive structure C1 is, for example, located in the inter-layer 140, the planarization layer 150, the buffer layer 160 and the gate insulation layer 170. The conductive structure C1, the scan line SL, the first gate G1 and the second gate G2 belong to a same film layer. The scan line SL, the first gate G1, the second gate G2 are separated from the conductive structure C1. The conductive structure C1 is electrically connected to the shielding layer 130 of the power wire.

Figure 1E:
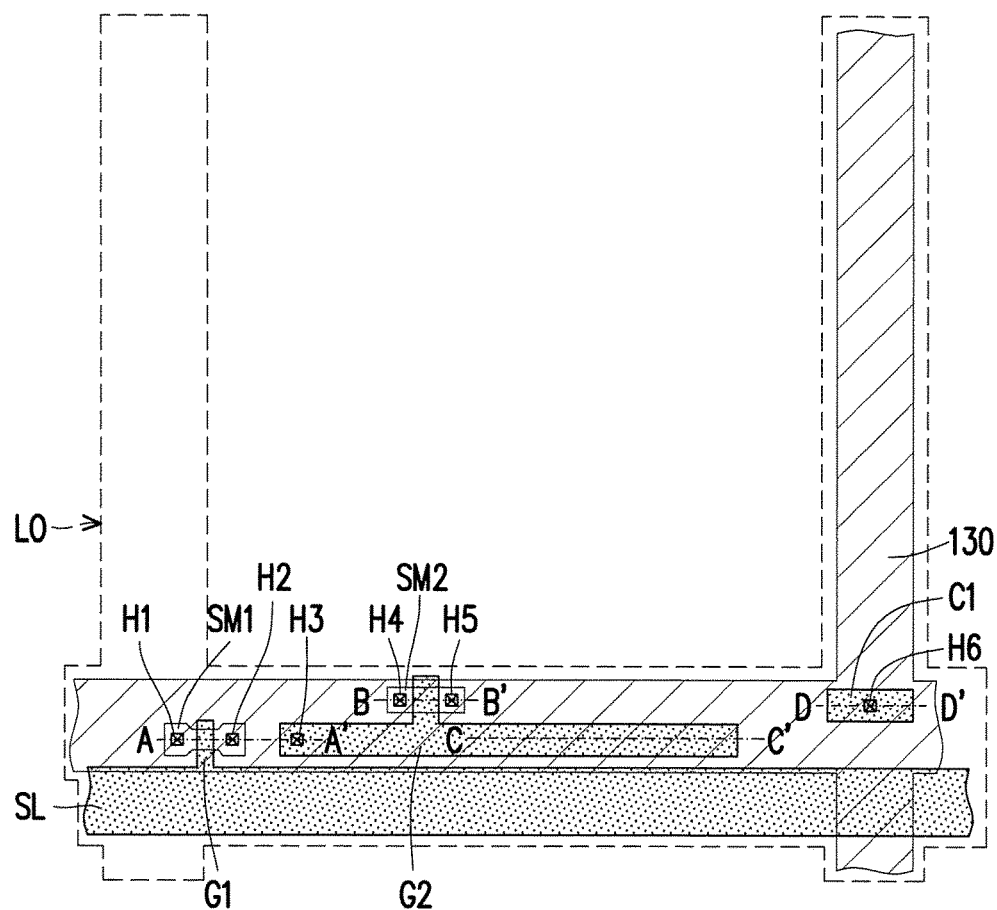
Figure 2E:
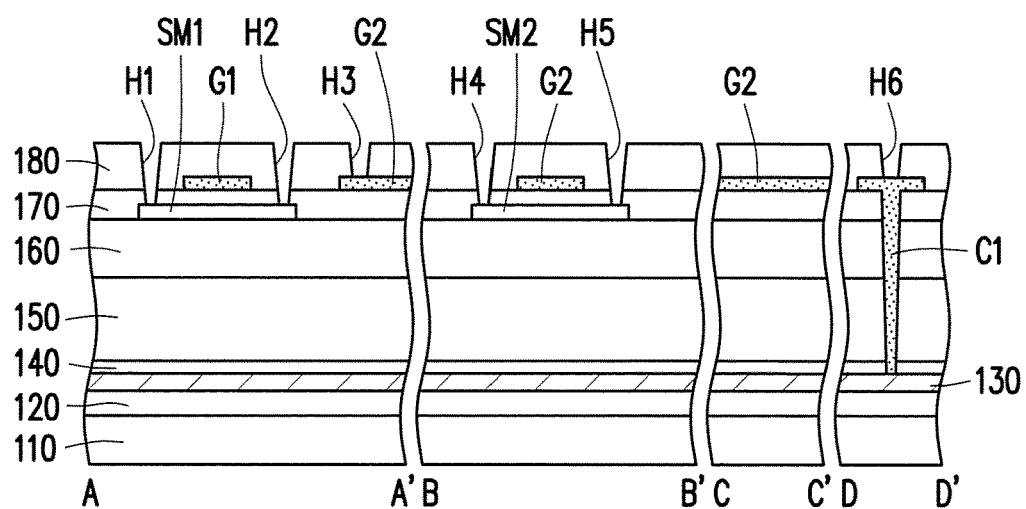

Referring to FIG. 1E and FIG. 2E, a dielectric layer 180 is formed on the first gate G1 and the second gate G2. The dielectric layer 180, for example, covers the conductive structure C1, the scan line SL, the first gate G1 and the second gate G2. An opening H1, an opening H2, an opening H3, an opening H4, an opening H5 and an opening H6 are formed in the dielectric layer 180 by using an etching process. The opening H1 and the opening H2 expose a part of the first channel layer SM1, and the opening H4 and the opening H5 expose a part of the second channel layer SM2. In some embodiments, the opening H1, the opening H2, the opening H4 and the opening H5 are located in the dielectric layer 180 and the gate insulation layer 170. The opening H3 exposes a part of the second gate G2, and the opening H6 exposes a part of the conductive structure C1. In some embodiments, the opening H3 and the opening H6 are located in the dielectric layer 180.

Figure 1F:
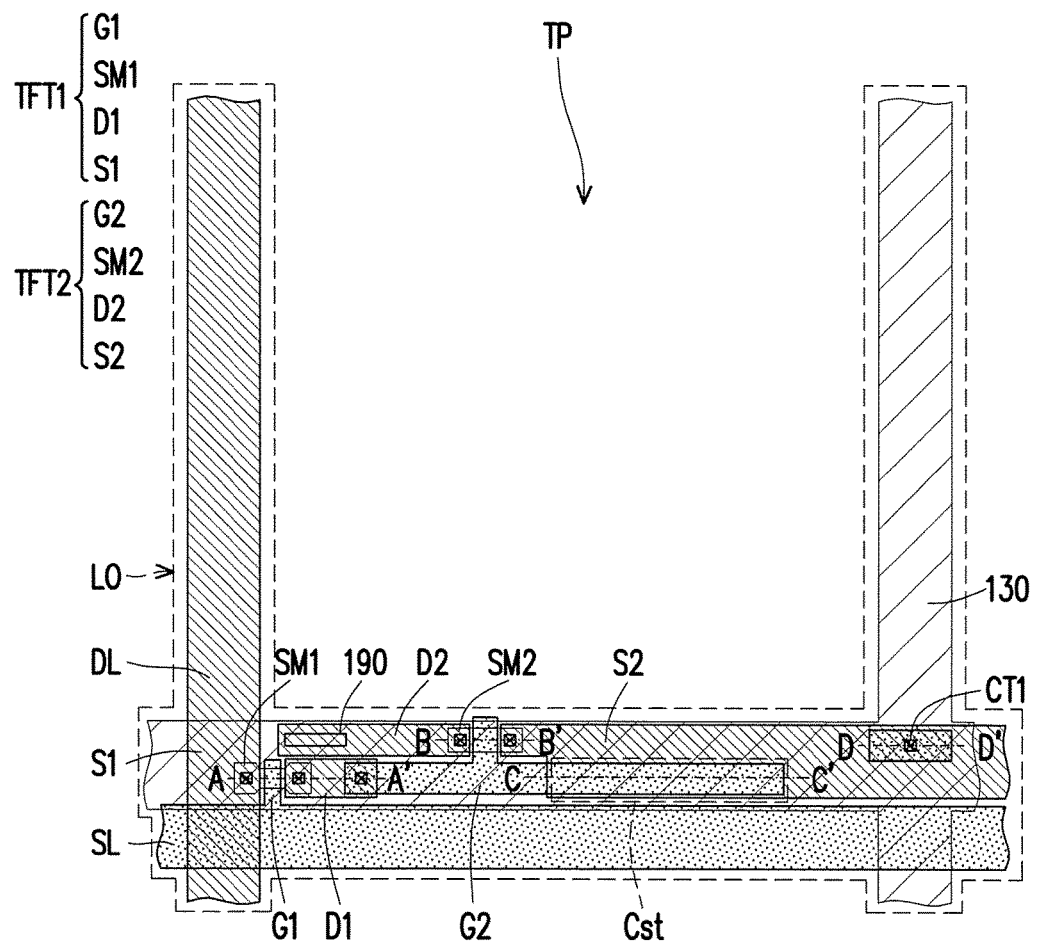
Figure 2F:
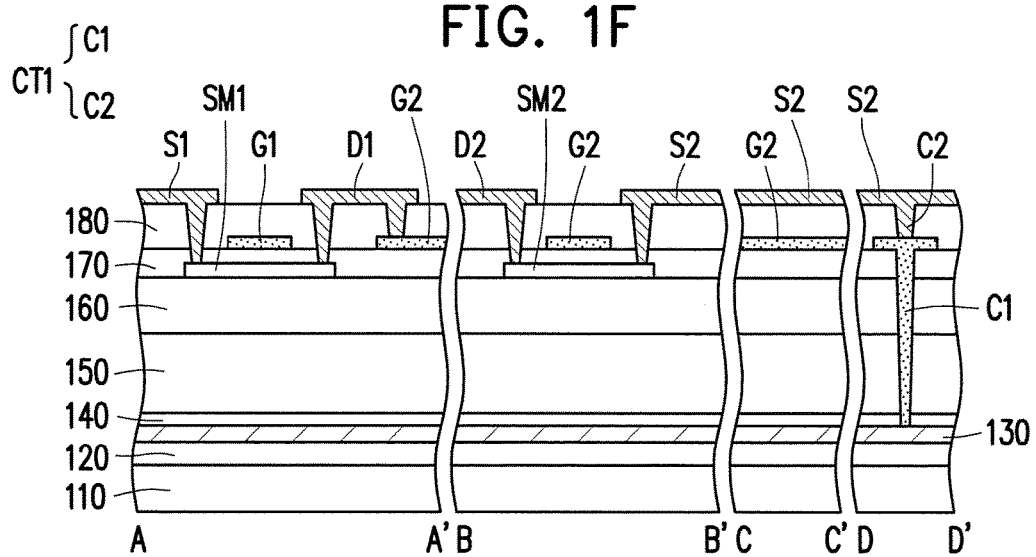

Then, referring to FIG. 1F and FIG. 2F, a data line DL, a first source S1, a first drain D1, a second source S2 and a second drain D2 are formed on the dielectric layer 180. The data line DL, the first source S1, the first drain D1, the second source S2 and the second drain D2, for example, correspond to the layout area LO of the substrate 110. The scan line SL and the data line DL may be arranged in an interleaving manner. In an embodiment, the first source S1 is electrically connected to the data line DL. The first source S1 and the first drain D1 are electrically connected to the first channel layer SM1 through the opening H1 and the opening H2, respectively. The first drain D1 is electrically connected to the second gate G2 through the opening H3.

The second drain D2 and the second source S2 are electrically connected to the second channel layer SM2 through the opening H4 and the opening H5, respectively. The second drain D2 is electrically connected to the display device 190. The display device 190 is, for example, located on the layout area LO of the substrate 110. In some embodiments, the display device 190 is, for example, an organic light-emitting device. The organic light-emitting device may include an anode, an organic light-emitting layer and a cathode (not shown). The anode and the cathode may be made of a conductive material such as metal or metal oxide, etc. If the anode and the cathode are made of a transparent conductive material, the fabricated organic electroluminescent display device is a double-sided light-emitting display device. If one of the anode and the cathode is made of the transparent conductive material, the fabricated organic electroluminescent display device is a bottom light-emitting type or top light-emitting type display device. The organic light-emitting layer is a small molecule organic light-emitting material or a polymer organic light-emitting material, for example. In some embodiments, the organic light-emitting device may include an electron transmission layer (ETL), an electron injection layer (EIL), a hole transmission layer (HTL) and a hole injection layer (HIL) (not shown). Moreover, a surface of the organic light-emitting device may be covered by a barrier layer (not shown), and the barrier layer may be made of an organic material or an inorganic material.

A conductive structure C2 is filled in the opening H6, the conductive structure C2 is, for example, located in the dielectric layer 180, and the second source S2 is electrically connected to the conductive structure C1 through the conductive structure C2. In the present embodiment, the second source S2 is electrically connected to the shielding layer 130 through a conductive structure CT1, where the conductive structure CT1 is a multi-layered structure including the conductive structure C1 and the conductive structure C2, though the invention is not limited thereto. In other embodiments, the second source S2 may be electrically connected to the shielding layer 130 through the single layered conductive structure C2. In the present embodiment, an orthogonal projection of a part of the second gate G2 on the substrate 110 may be overlapped with an orthogonal projection of a part of the second source S2 on the substrate 110, and a storage capacitor Cst is formed between the second gate G2 and the second source S2.

In the present embodiment, the driving circuit includes the scan line SL, the data line DL, a first active device TFT1 and a second active device TFT2. The first active device TFT1 includes the first channel layer SM1, the first gate G1, the first source S1 and the first drain D1, and the second active device TFT2 includes the second channel layer SM2, the second gate G2, the second source S2 and the second drain D2. In some embodiments, the substrate 110 has a light-transmitting area TP and the layout area LO, the driving circuit corresponds to the layout area LO, and the driving circuit exposes the light-transmitting area TP of the substrate 110. In an embodiment, the light-transmitting area TP is, for example, a region on the substrate 110 that is not shielded by the driving circuit, so that light may penetrate through the light-transmitting area TP without being reflected by the driving circuit. In an embodiment, the light-transmitting area TP is, for example, a region on the substrate 110 that is not shielded by any metal or opaque material.

In the present embodiment, although the first active device TFT1 is electrically connected to the second active device TFT2, the invention is not limited thereto. In other embodiments, the first active device TFT1 may be electrically connected to the display device 190.

The shielding layer 130 is a part of the power wire, the shielding layer 130 is connected to a signal voltage (VDD), and the shielding layer 130 connected to the second source S2 may transmit the signal voltage (VDD) to the second active device TFT2. In the present embodiment, the shielding layer 130 used for transmitting the signal voltage may be partially located under the first active device TFT1 and/or the second active device TFT2. An orthogonal projection of the shielding layer 130 used for transmitting the signal voltage (VDD) on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 may mitigate an influence of the external light and/or static electricity on the first active device TFT1 and the second active device TFT2.

Figure 3:
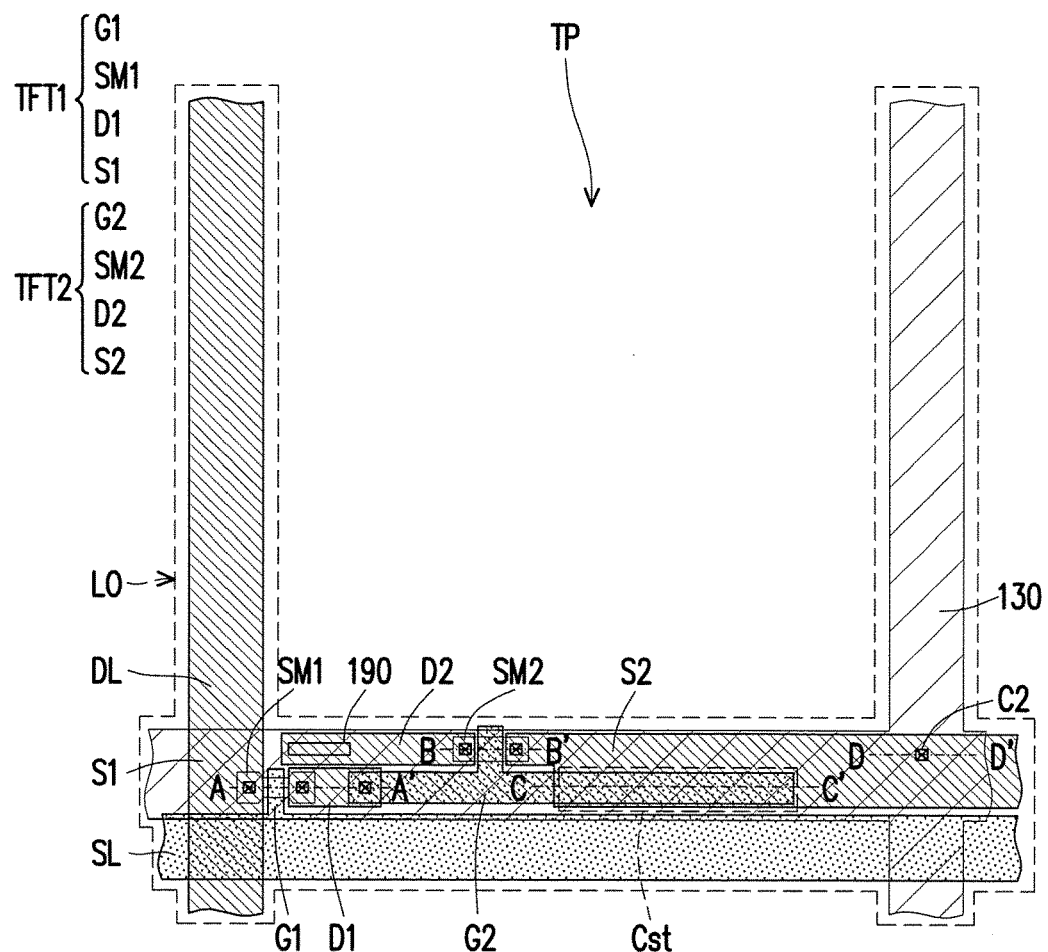
FIG. 3 is a top view of a method for manufacturing a pixel structure of a display panel according to a second embodiment of the disclosure.
Figure 4:
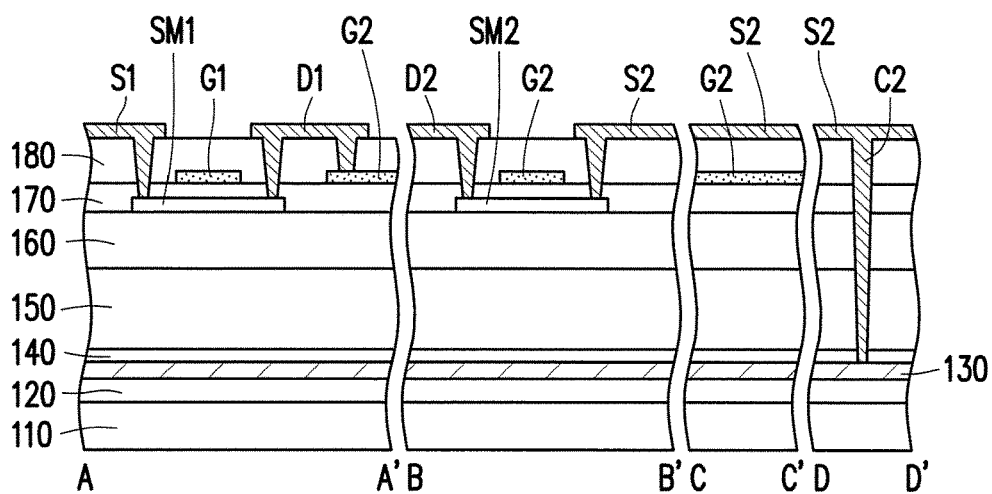
FIG. 4 is a cross-sectional view of FIG. 3 along section lines AA', BB', CC' and DD'.

FIG. 3 is a top view of a method for manufacturing a pixel structure of a display panel according to a second embodiment of the disclosure. FIG. 4 is a cross-sectional view of FIG. 3 along section lines AA', BB', CC' and DD'. It should be noted that reference numbers of the components and a part of contents of the first embodiment of FIGS. 1A-1F and FIGS. 2A-2F are also used in the second embodiment of FIG. 3 and FIG. 4, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, the second source S2 of the pixel structure is electrically connected to the shielding layer 130 through the single layered conductive structure C2. The conductive structure C2 is located in the inter-layer 140, the planarization layer 150, the buffer layer 160, the gate insulation layer 170 and the dielectric layer 180. Since the second source S2 of the present embodiment is electrically connected to the shielding layer 130 through the single layered conductive structure C2, a problem of inaccurate alignment of the conductive structure is not liable to be occurred, which improves a product yield. In some embodiments, by setting the conductive structure C2 in an opening formed by an etching process, more circuit layout space is acquired to improve an aperture ratio of the display panel.

In the present embodiment, the shielding layer 130 is a part of the power wire, a part of the orthogonal projection of the shielding layer 130 used for transmitting the signal voltage (VDD) on the substrate 110 may be overlapped with the orthogonal projection of the first active device TFT1 and/or the second active device TFT2 on the substrate 110. The light-transmitting area TP on the substrate 110 may have a larger area, so as to improve the transparency of the display panel. The shielding layer 130 may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 may mitigate an influence of the external light and/or static electricity on the first active device TFT1 and the second active device TFT2.

FIGS. 5A-5G are top views of a method for manufacturing a pixel structure of a display panel according to a third embodiment of the disclosure. FIG. 6 is a cross-sectional view of FIG. 5G along section lines AA', BB', CC' and DD'. It should be noted that reference numbers of the components and a part of contents of the first embodiment of FIGS. 1A-1F and FIGS. 2A-2F are also used in the third embodiment of FIGS. 5A-5G and FIG. 6, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 5A:
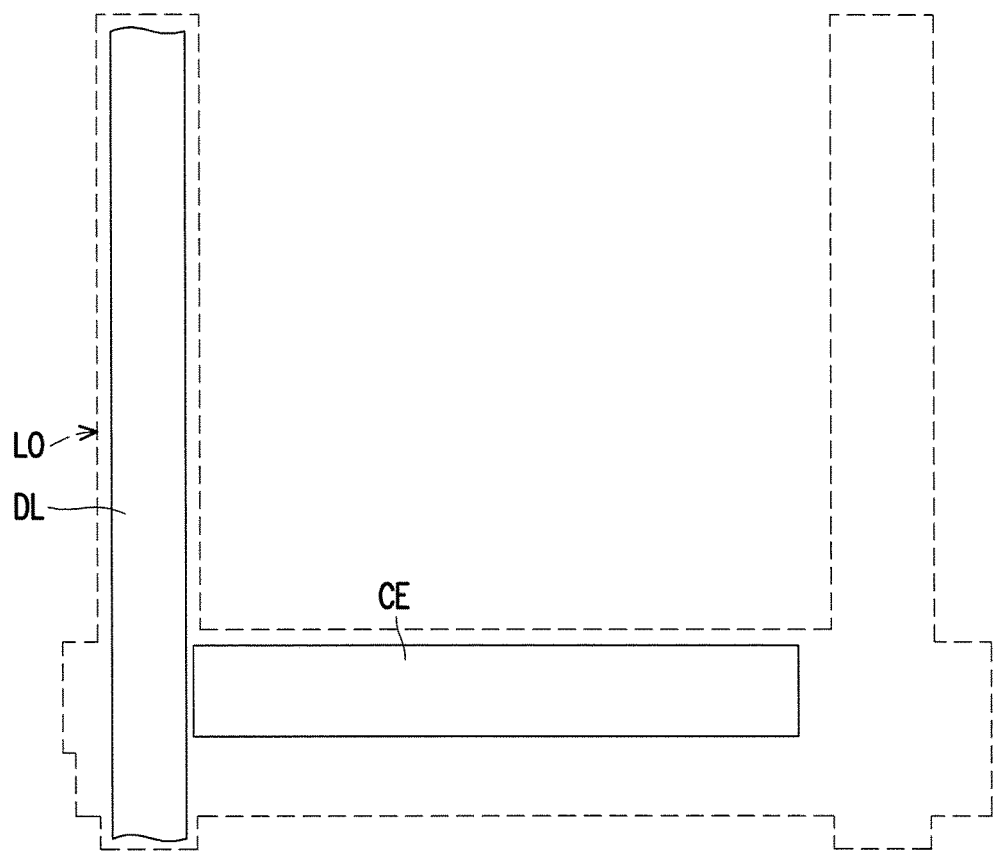
FIGS. 5A-5G are top views of a method for manufacturing a pixel structure of a display panel according to a third embodiment of the disclosure.
Figure 6:
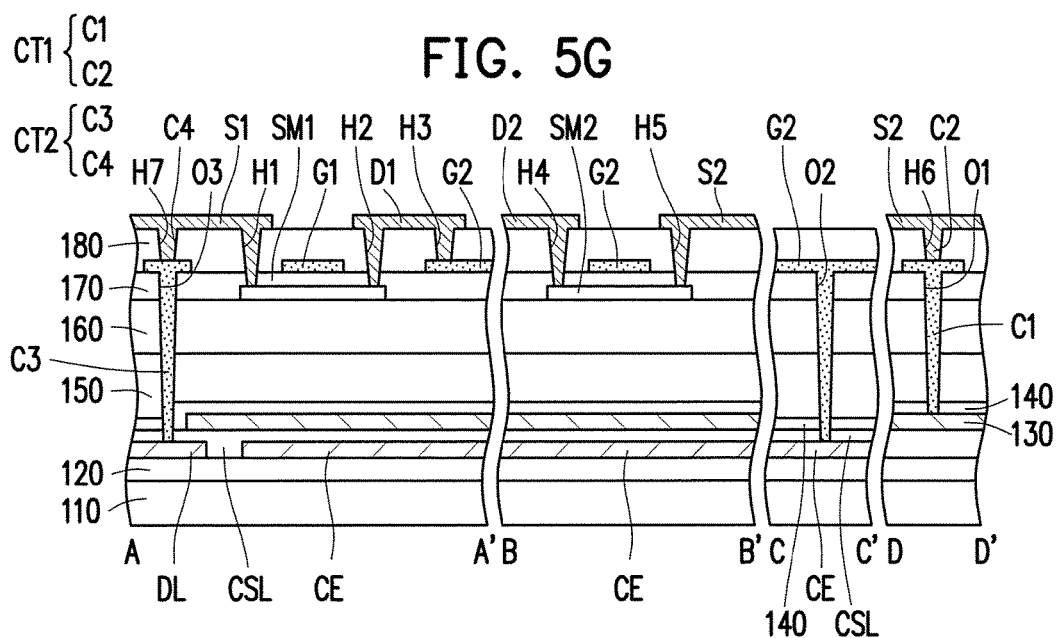
FIG. 6 is a cross-sectional view of FIG. 5G along section lines AA', BB', CC' and DD'.

Referring to FIG. 5A, the data line DL and a capacitor electrode CE are formed on the layout area LO of the substrate 110 (shown in FIG. 6). In an embodiment, the data line DL and the capacitor electrode CE are separated from each other. In the present embodiment, the data line DL and the capacitor electrode CE belong to a same film layer. In the present embodiment, the barrier layer 120 (shown in FIG. 6) is further disposed between the data line DL and the substrate 110 and between the capacitor electrode CE and the substrate 110. The data line DL and the capacitor electrode CE are formed on the barrier layer 120 and are contact the barrier layer 120.

Figure 5B:
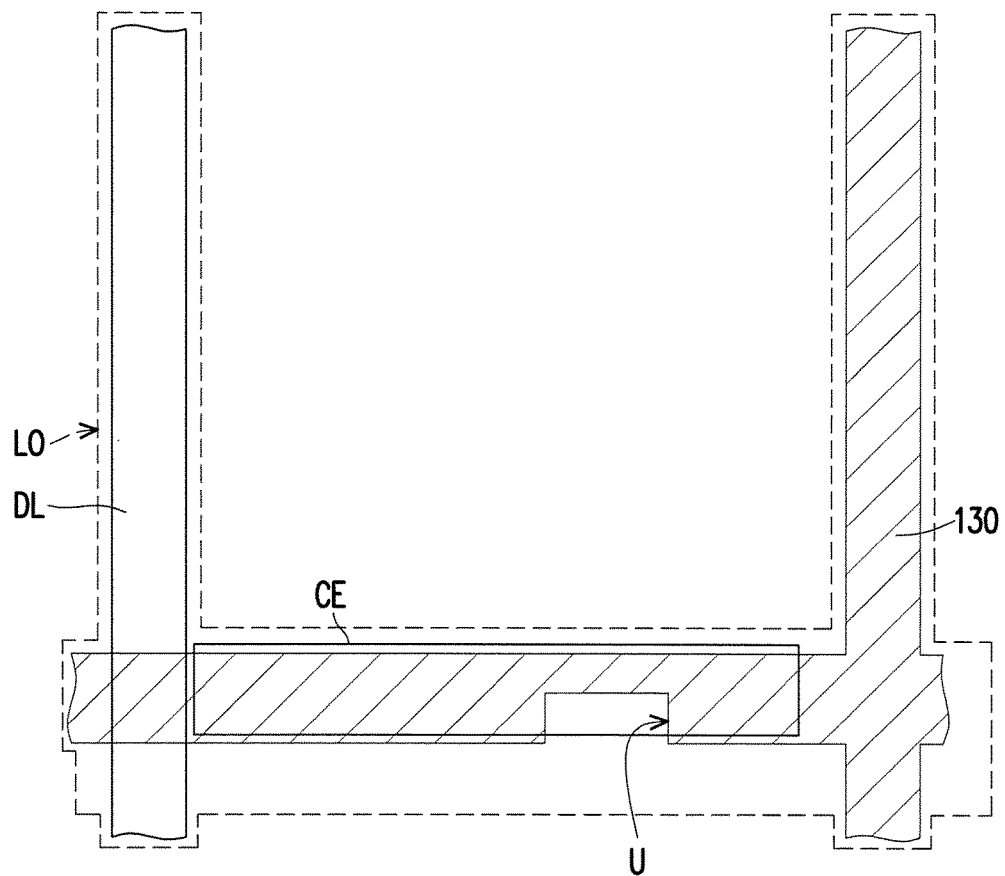

Referring to FIG. 5B, a dielectric layer CSL (shown in FIG. 6) is formed on the data line DL and the capacitor electrode CE. Then, the shielding layer 130 is formed on the dielectric layer CSL. In the present embodiment, the film layer where the data line DL and the capacitor electrode CE belong to may be located between a film layer where the shielding layer 130 belongs to and the substrate 110. The shielding layer 130 has an opening U corresponding to the capacitor electrode CE, and an area where the opening U is located is partially overlapped with a part of the capacitor electrode CE. In the present embodiment, the opening U of the shielding layer 130 is a rectangle, though the invention is not limited thereto. In other embodiments, the opening U may also has a round shape, a triangular shape or other geometric shapes.

Figure 5C:
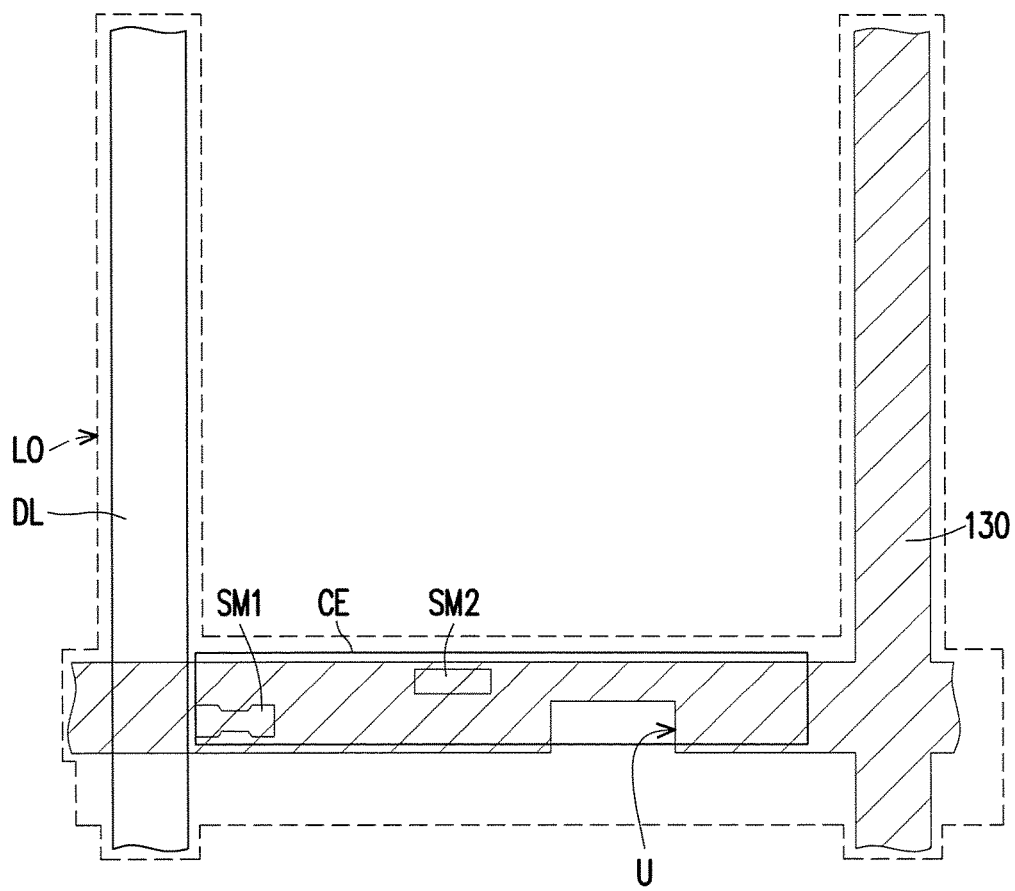

Referring to FIG. 5C, the first channel layer SM1 and the second channel layer SM2 are formed on the shielding layer 130. The first channel layer SM1 and the second channel layer SM2 are, for example, located on the layout layer LO of the substrate 110. In some embodiments, the inter-layer 140, the planarization layer 150 and the buffer layer 160 may be disposed between the shielding layer 130 and the first channel layer SM1 and between the shielding layer 130 and the second channel layer SM2 (as shown in FIG. 6). The methods for forming the inter-layer 140, the planarization layer 150, the buffer layer 160, the first channel layer SM1 and the second channel layer SM2 may be similar to that of the aforementioned embodiments. After the first channel layer SM1 and the second channel layer SM2 are fabricated, the gate insulation layer 170 covering the first channel layer SM1 and the second channel layer SM2 is formed (as shown in FIG. 6).

Figure 5D:
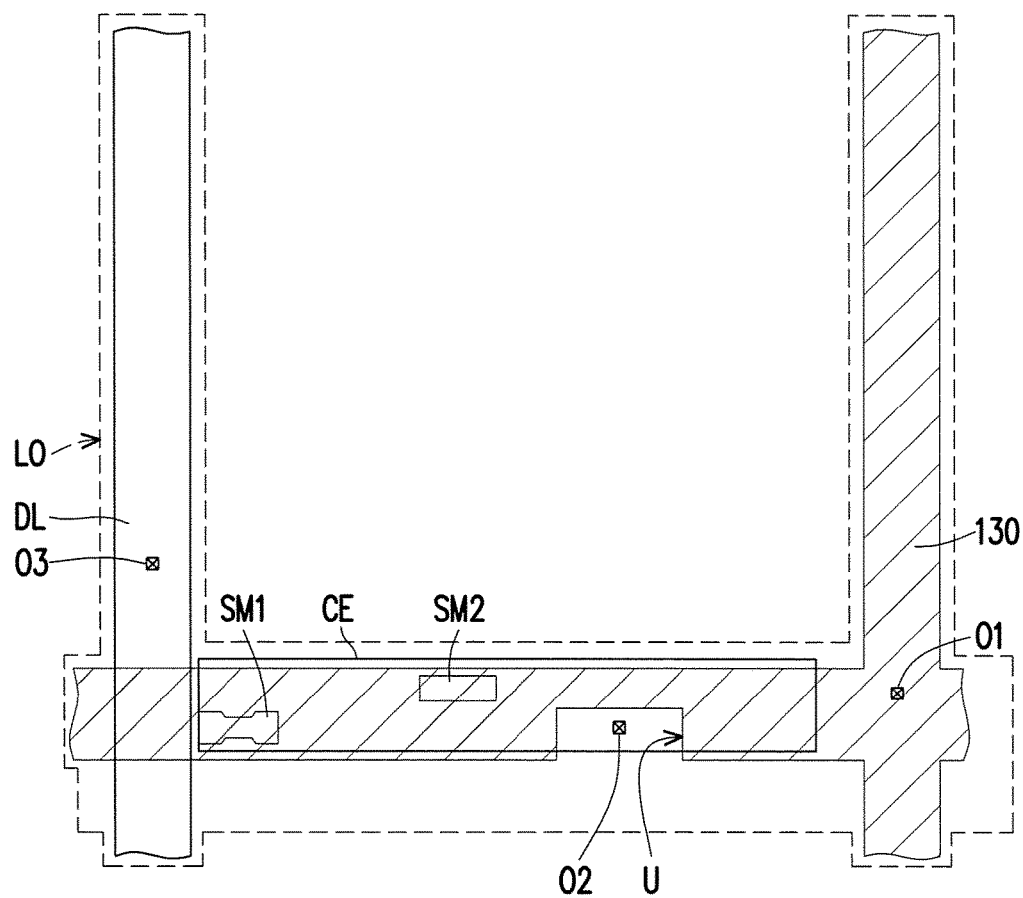

Referring to FIG. 5D, an etching process is adopted to form the opening O1, the opening O2 and the opening O3. The opening O1 is, for example, located in the inter-layer 140, the planarization layer 150, the buffer layer 160 and the gate insulation layer 170 (as shown in FIG. 6). The opening O1 exposes a part of the shielding layer 130. The opening O2 and the opening O3 are, for example, located in the dielectric layer CSL, the inter-layer 140, the planarization layer 150, the buffer layer 160 and the gate insulation layer 170 (as shown in FIG. 6). The opening O2 exposes a part of the capacitor electrode CE. The opening O3 exposes a part of the data line DL.

Figure 5E:
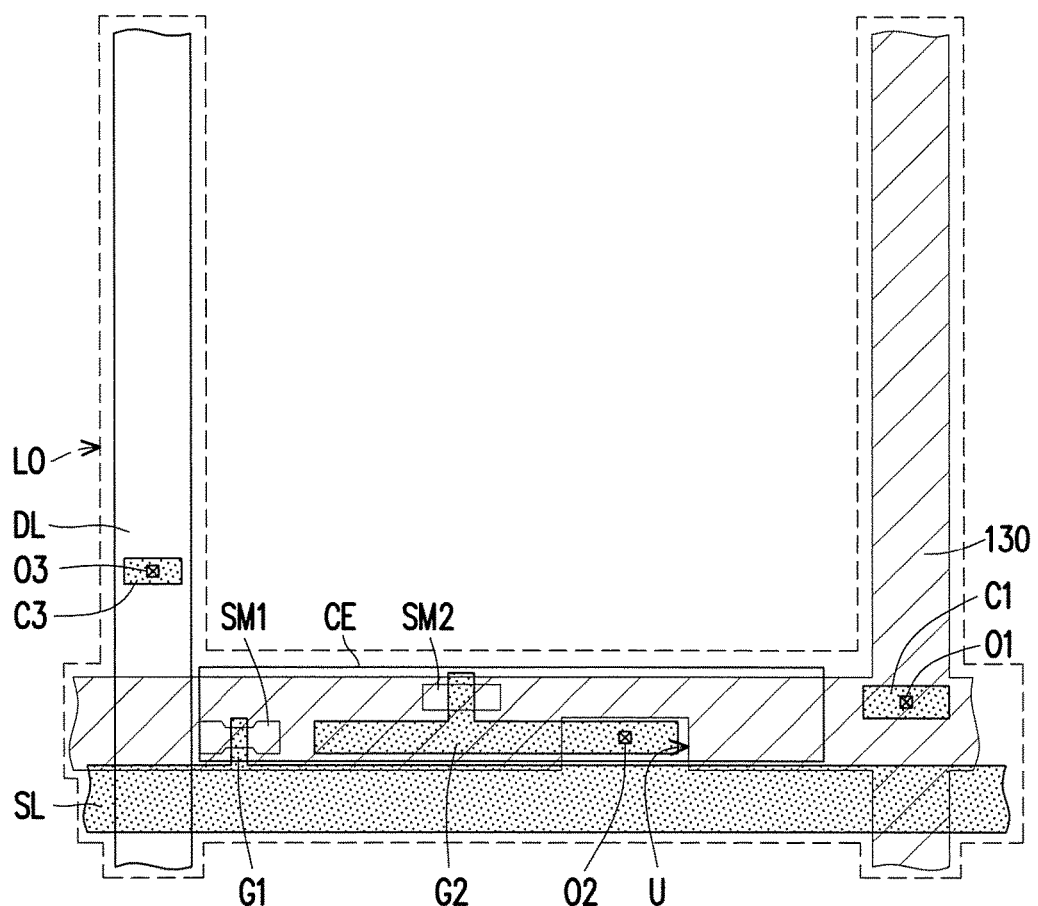

Referring to FIG. 5E, the scan line SL, the first gate G1, the second gate G2, the conductive structure C1 and a conductive structure C3 are formed. The scan line SL, the first gate G1, the second gate G2, the conductive structure C1 and the conductive structure C3 are, for example, located on the layout area LO of the substrate 110. The first gate G1 is connected to the scan line SL, and is located on the first channel layer SM1. The first gate G1 and the scan line SL are separated from the second gate G2. The second gate G2 is located on the second channel layer SM2. In the present embodiment, a part of the second gate G2 may be extended to the top of the opening U of the shielding layer 130, and the second gate G2 is electrically connected to the capacitor electrode CE through the opening O2. In an embodiment, the first drain D1 and the second gate G2 are electrically connected to the capacitor electrode CE. The conductive structure C1 is filled in the opening O1 and electrically connected to the shielding layer 130. The conductive structure C3 is filled in the opening O3 and electrically connected to the data line DL. The conductive structure C1 is, for example, located in the inter-layer 140, the planarization layer 150, the buffer layer 160 and the gate insulation layer 170, and the conductive structure C3 is, for example, located in the dielectric layer CSL, the inter-layer 140, the planarization layer 150, the buffer layer 160 and the gate insulation layer 170.

Figure 5F:
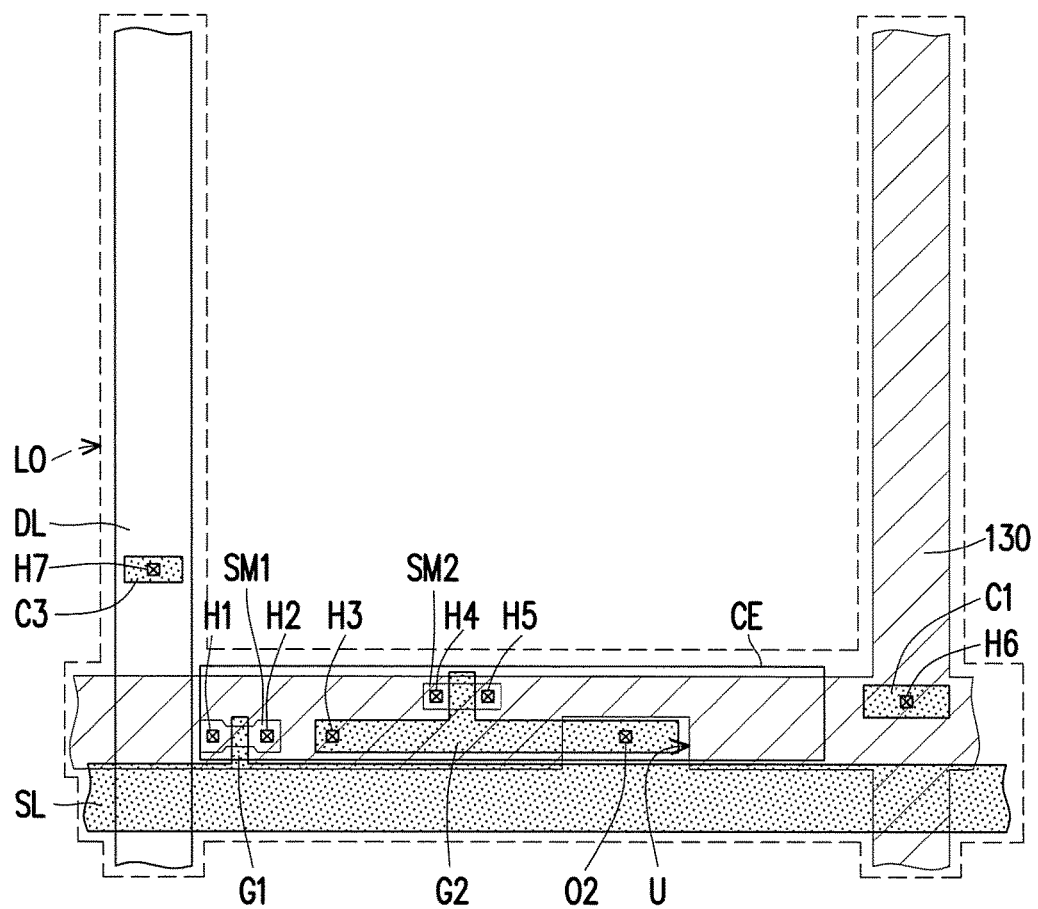

Then, referring to FIG. 5F, the dielectric layer 180 is formed on the first gate G1 and the second gate G2 (as shown in FIG. 6). The dielectric layer 180, for example, covers the conductive structure C1, the conductive structure C3, the scan line SL, the first gate G1 and the second gate G2. An etching process is adopted to form the opening H1, the opening H2, the opening H3, the opening H4, the opening H5, the opening H6 and an opening H7 on the dielectric layer 180. In some embodiments, the opening H1, the opening H2, the opening H4 and the opening H5 are located in the dielectric layer 180 and the gate insulation layer 170. The opening H1 and the opening H2 expose a part of the first channel layer SM1, and the opening H4 and the opening H5 expose a part of the second channel layer SM2. In some embodiments, the opening H3, the opening H6 and the opening H7 are located in the dielectric layer 180. The opening H3 exposes a part of the second gate G2, the opening H6 exposes a part of the conductive structure C1, and the opening H7 exposes a part of the conductive structure C3.

Figure 5G:
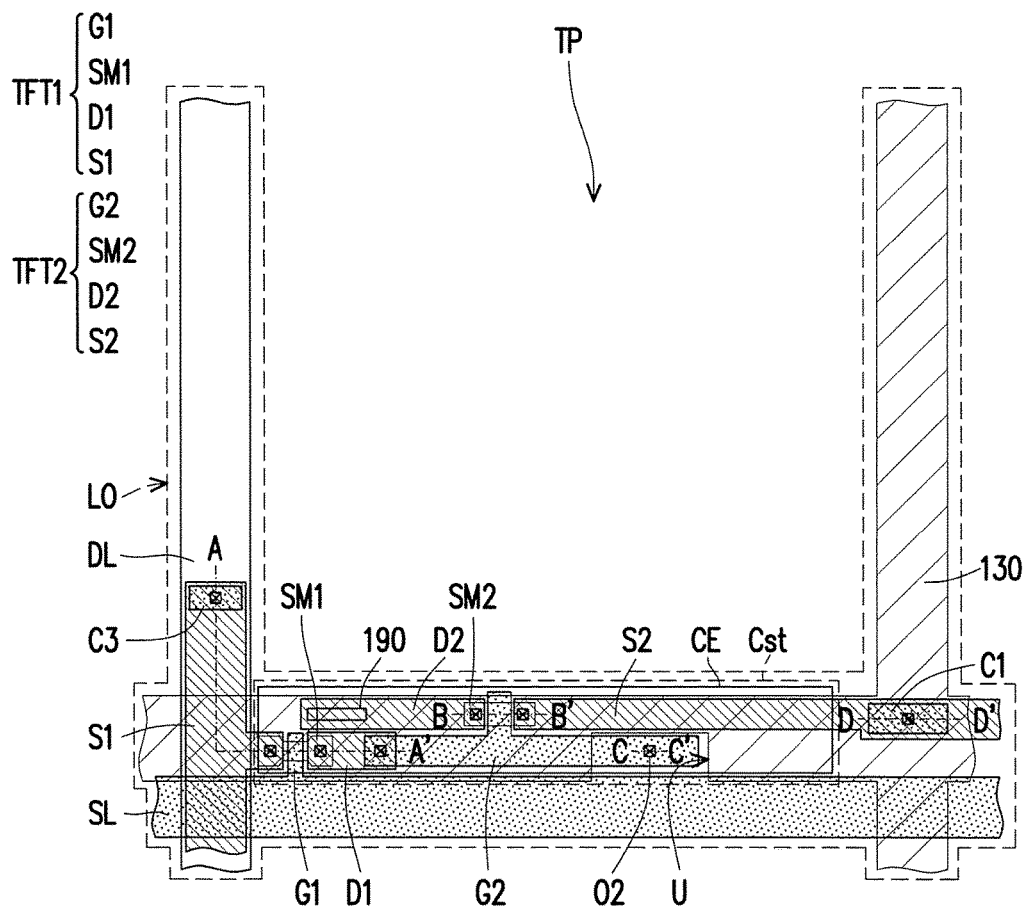

Referring to FIG. 5G and FIG. 6, the first source S1, the first drain D1, the second source S2 and the second drain D2 are formed on the dielectric layer 180.

The first source S1 and the first drain D1 are electrically connected to the first channel layer SM1 through the opening H1 and the opening H2, respectively. The first drain D1 is electrically connected to the second gate G2 through the opening H3.

A conductive structure C4 corresponds to the layout area LO of the substrate 110, and is filled in the opening H7, and the conductive structure C4 is, for example, located in the dielectric layer 180. The first source S1 is electrically connected to the conductive structure C3 through the conductive structure C4. In the present embodiment, the first source S1 is electrically connected to the data line DL through a conductive structure CT2, where the conductive structure CT2 is a multi-layered structure including the conductive structure C3 and the conductive structure C4, though the invention is not limited thereto. In other embodiments, the first source S1 may be electrically connected to the data line DL through the single layered conductive structure C4.

The second drain D2 and the second source S2 are electrically connected to the second channel layer SM2 through the opening H4 and the opening H5, respectively. The second drain D2 may be electrically connected to the display device 190.

The conductive structure C2 corresponds to the layout area LO of the substrate 110, and is filled in the opening H6, and the conductive structure C2 is, for example, located in the dielectric layer 180. The second source S2 is electrically connected to the conductive structure C1 through the conductive structure C2. In the present embodiment, the second source S2 is electrically connected to the shielding layer 130 through a conductive structure CT1, where the conductive structure CT1 is a multi-layered structure including the conductive structure C1 and the conductive structure C2, though the invention is not limited thereto. In other embodiments, the second source S2 may be electrically connected to the shielding layer 130 through the single layered conductive structure C2.

In the present embodiment, the driving circuit located on the layout area LO of the substrate 110 includes the scan line SL, the data line DL, the first active device TFT1 and the second active device TFT2. The first active device TFT1 includes the first channel layer SM1, the first gate G1, the first source S1 and the first drain D1, and the second active device TFT2 includes the second channel layer SM2, the second gate G2, the second source S2 and the second drain D2. In the present embodiment, the shielding layer 130 electrically connected to the second source S2 may be overlapped with the capacitor electrode CE electrically connected to the second gate G2, and a storage capacitor Cst is formed between the shielding layer 130 and the capacitor electrode CE. In some embodiments, the storage capacitor Cst may be located under the first active device TFT1 and the second active device TFT2.

The shielding layer 130 connected to the second source S2 may transmit the signal voltage (VDD) to the second active device TFT2. In the present embodiment, a part of the capacitor electrode CE and a part of the shielding layer 130 are located between the first active device TFT1 and the substrate 110 and/or between the second active device TFT2 and the substrate 110. An orthogonal projection of the shielding layer 130 used for transmitting the signal voltage (VDD) and the capacitor electrode CE on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 and the capacitor electrode CE may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 and the capacitor electrode CE may mitigate an influence of the external light and/or static electricity on the first active device TFT1 and the second active device TFT2.

Figure 7:
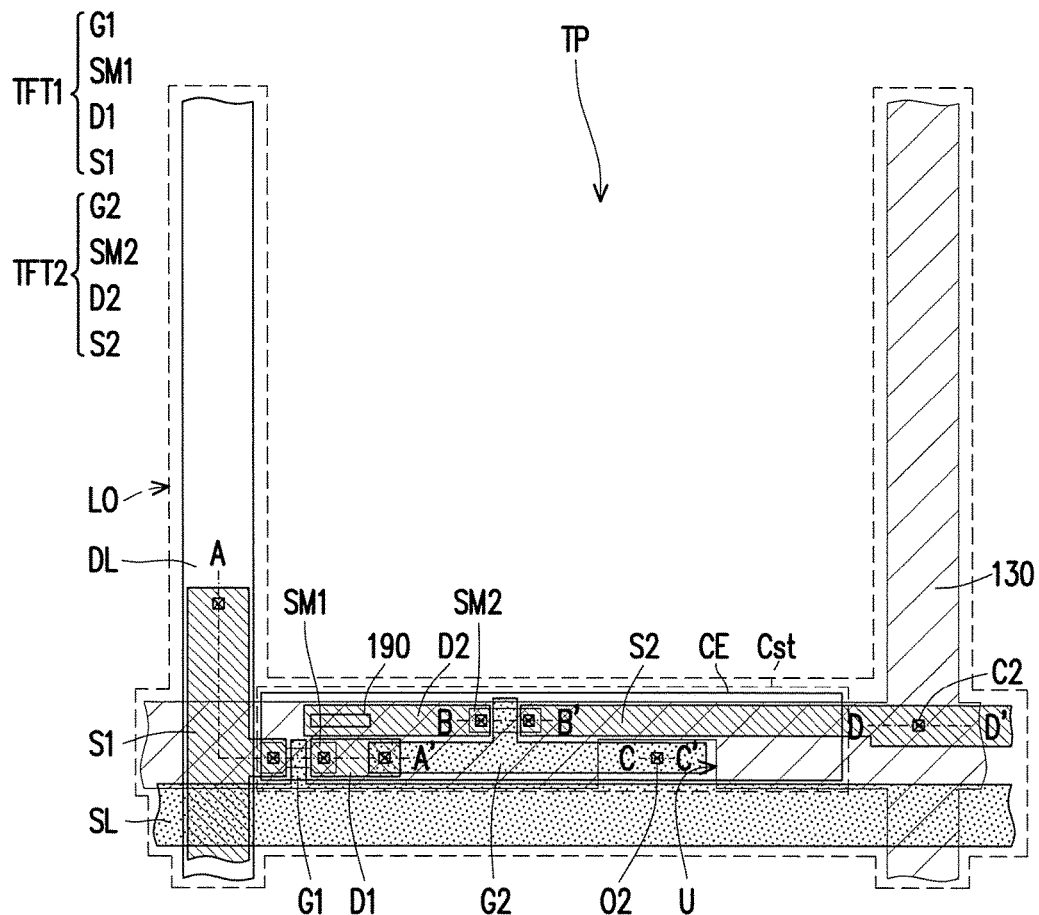
FIG. 7 is a top view of a method for manufacturing a pixel structure of a display panel according to a fourth embodiment of the disclosure.
Figure 8:
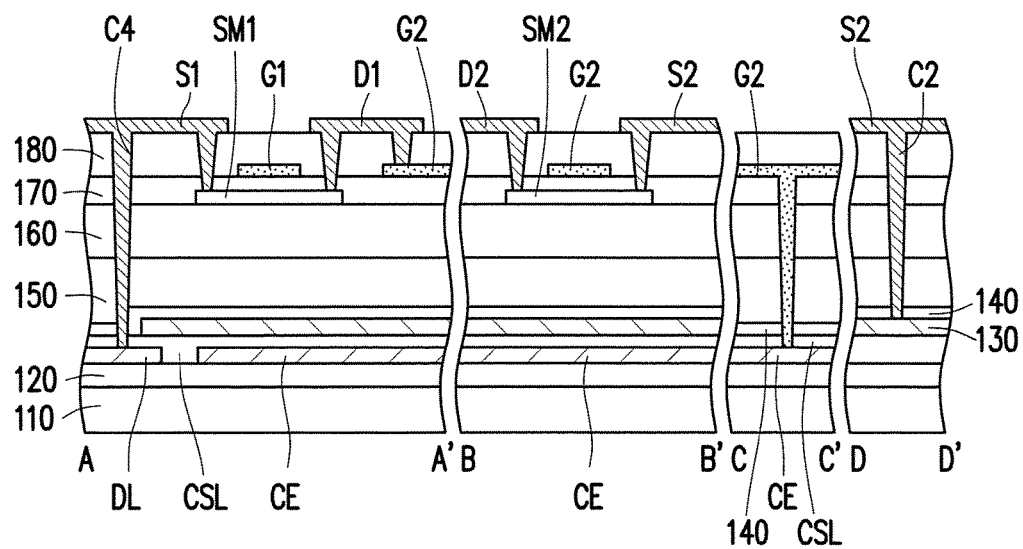
FIG. 8 is a cross-sectional view of FIG. 7 along section lines AA', BB', CC' and DD'.

FIG. 7 is a top view of a method for manufacturing a pixel structure of a display panel according to a fourth embodiment of the disclosure. FIG. 8 is a cross-sectional view of FIG. 7 along section lines AA', BB', CC' and DD'. It should be noted that reference numbers of the components and a part of contents of the third embodiment of FIGS. 5A-5G and FIG. 6 are also used in the fourth embodiment of FIG. 7 and FIG. 8, wherein the same reference numbers denote the same or like components, and descriptions of the same technical contents are omitted. The aforementioned embodiment can be referred for descriptions of the omitted parts, and detailed descriptions thereof are not repeated in the following embodiment.

The first source S1 of the present embodiment is electrically connected to the data line DL through the single layered conductive structure C4, and the second source S2 is electrically connected to the shielding layer 130 through the single layered conductive structure C2.

The conductive structure C2 is, for example, located in the inter-layer 140, the planarization layer 150, the buffer layer 160, the gate insulation layer 170 and the dielectric layer 180, and the conductive structure C4 is, for example, located in the dielectric layer CSL, the inter-layer 140, the planarization layer 150, the buffer layer 160, the gate insulation layer 170 and the dielectric layer 180. Since the first source S1 of the present embodiment is electrically connected to the data line DL through the single layered conductive structure C4, and the second source S2 is electrically connected to the shielding layer 130 through the single layered conductive structure C2, a problem of inaccurate alignment of the conductive structures is not liable to be occurred, which improves a product yield. In some embodiments, by setting the conductive structure C2 in an opening formed by an etching process, more circuit layout space is acquired to improve an aperture ratio of the display panel.

In the present embodiment, the power wire includes the shielding layer 130, where the shielding layer 130 connected to the second source S2 may transmit the signal voltage (VDD) to the second active device TFT2. In the present embodiment, a part of the capacitor electrode CE and a part of the shielding layer 130 are located between the first active device TFT1 and the substrate 110 and/or between the second active device TFT2 and the substrate 110. An orthogonal projection of the shielding layer 130 used for transmitting the signal voltage (VDD) and the capacitor electrode CE on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 and the capacitor electrode CE may be overlapped with the first active device TFT1 and/or the second active device TFT2. In an embodiment, a distance between the shielding layer 130 and the first active device TFT1 (and the second active device TFT2) ranges between 500 nm and 2500 nm. In an embodiment, an electric field intensity between the shielding layer 130 and the first active device TFT1 (and the second active device TFT2) is smaller than 0.3 MV/cm. The shielding layer 130 and the capacitor electrode CE may mitigate an influence of the external light and/or static electricity on the first active device TFT1 and the second active device TFT2.

FIGS. 9A-9G are top views of a method for manufacturing a pixel structure of a display panel according to a fifth embodiment of the disclosure. FIG. 10 is a cross-sectional view of FIG. 9G along section lines AA', BB', CC' and DD'. It should be noted that reference numbers of the components and a part of contents of the first embodiment of FIGS. 5A-5G and FIG. 6 are also used in the fifth embodiment of FIGS. 9A-9G and FIG. 10, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 9A:
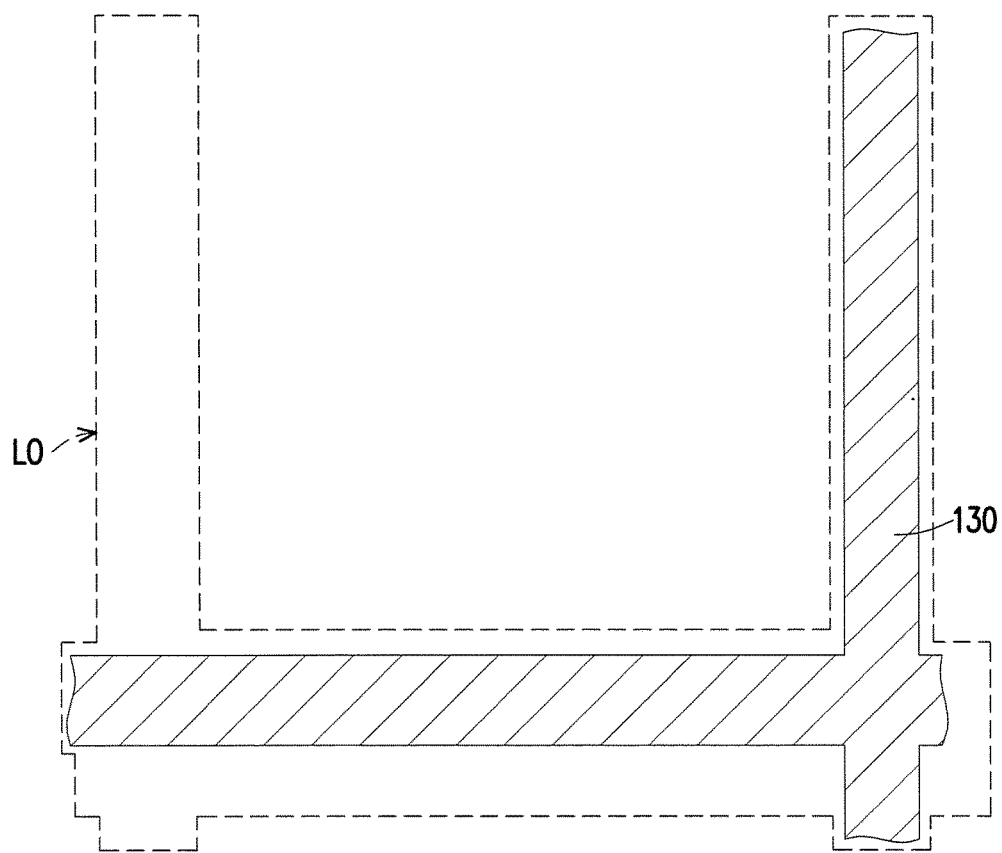
FIGS. 9A-9G are top views of a method for manufacturing a pixel structure of a display panel according to a fifth embodiment of the disclosure.
Figure 10:
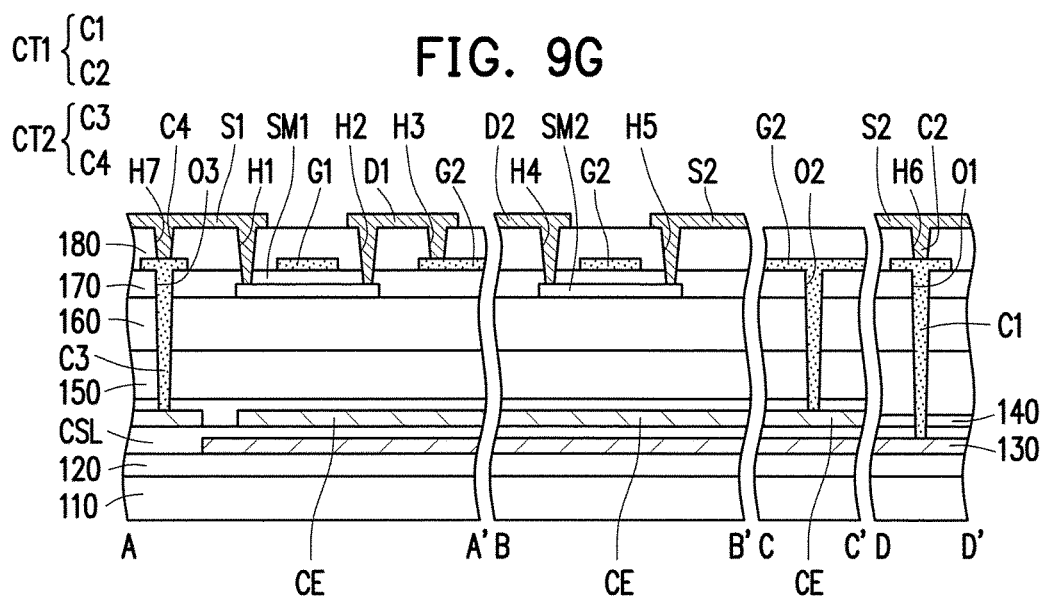
FIG. 10 is a cross-sectional view of FIG. 9G along section lines AA', BB', CC' and DD'.

Referring to FIG. 9A, the shielding layer 130 is formed on the layout area LO of the substrate 110 (as shown in FIG. 10). In the present embodiment, the barrier layer 120 (as shown in FIG. 10) is further disposed between the shielding layer 130 and the substrate 110. The shielding layer 130 is formed on the barrier layer 120, and contacts the barrier layer 120.

Figure 9B:
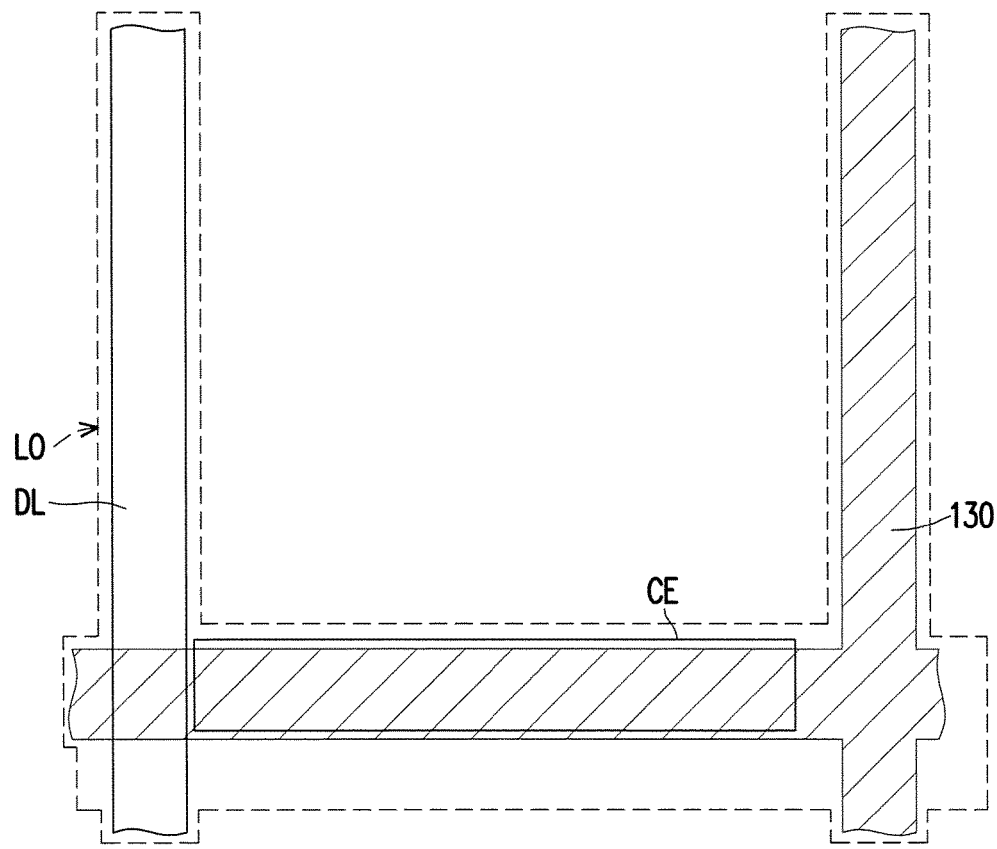

Referring to FIG. 9B, the dielectric layer CSL (as shown in FIG. 10) is formed on the shielding layer 130. Then, the data line DL and the capacitor electrode CE are formed on the dielectric layer CSL. In an embodiment, the data line DL and the capacitor electrode CE are separated from each other. In the present embodiment, the film layer where the shielding layer 130 belongs to may be located between a film layer where the data line DL and the capacitor electrode CE belong to and the substrate 110, and the data line DL and the capacitor electrode CE are, for example, located on the layout area LO of the substrate 110, and the data line DL and the capacitor electrode CE belong to the same film layer.

Figure 9C:
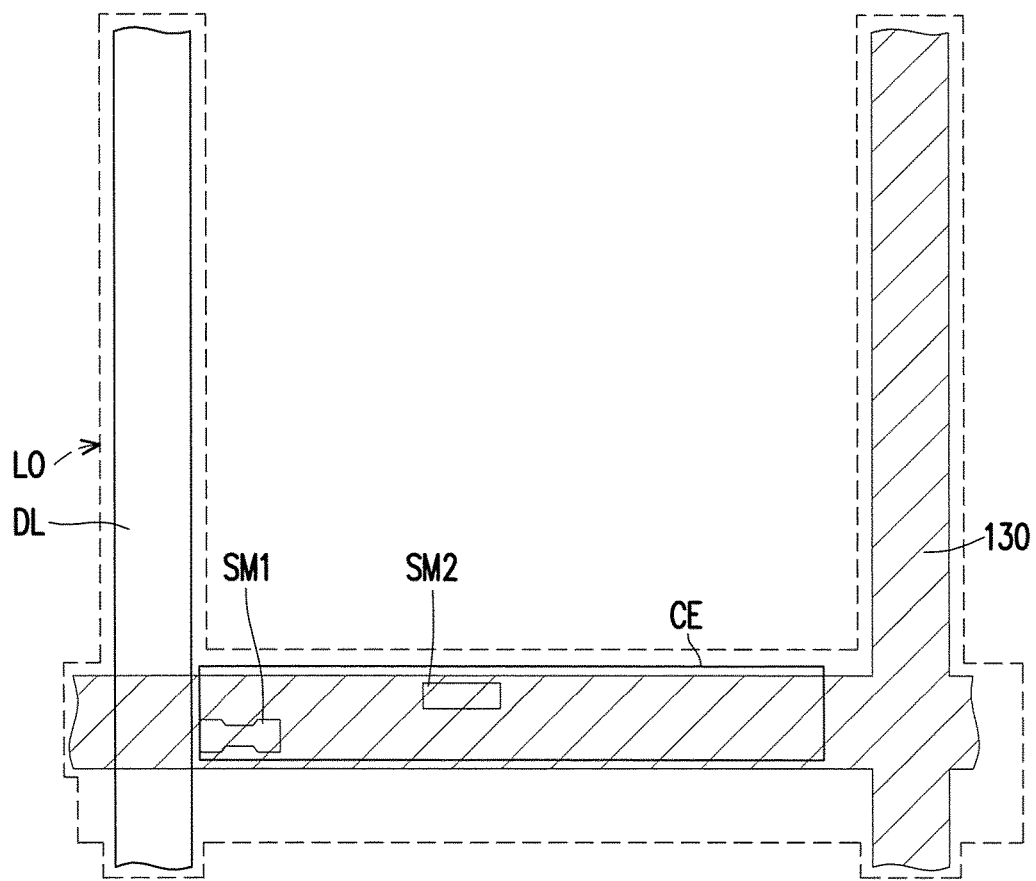

Referring to FIG. 9C, the first channel layer SM1 and the second channel layer SM2 are formed on the capacitor electrode CE. The first channel layer SM1 and the second channel layer SM2 are, for example, located on the layout area LO of the substrate 110. In some embodiments, the inter-layer 140, the planarization layer 150 and the buffer layer 160 are further disposed between the capacitor electrode CE and the first channel layer SM1 and between the capacitor electrode CE and the second channel layer SM2 (as shown in FIG. 10). The methods for forming the inter-layer 140, the planarization layer 150, the buffer layer 160, the first channel layer SM1 and the second channel layer SM2 may be similar to that of the aforementioned embodiments. After the first channel layer SM1 and the second channel layer SM2 are fabricated, the gate insulation layer 170 covering the first channel layer SM1 and the second channel layer SM2 is formed (as shown in FIG. 10).

Figure 9D:
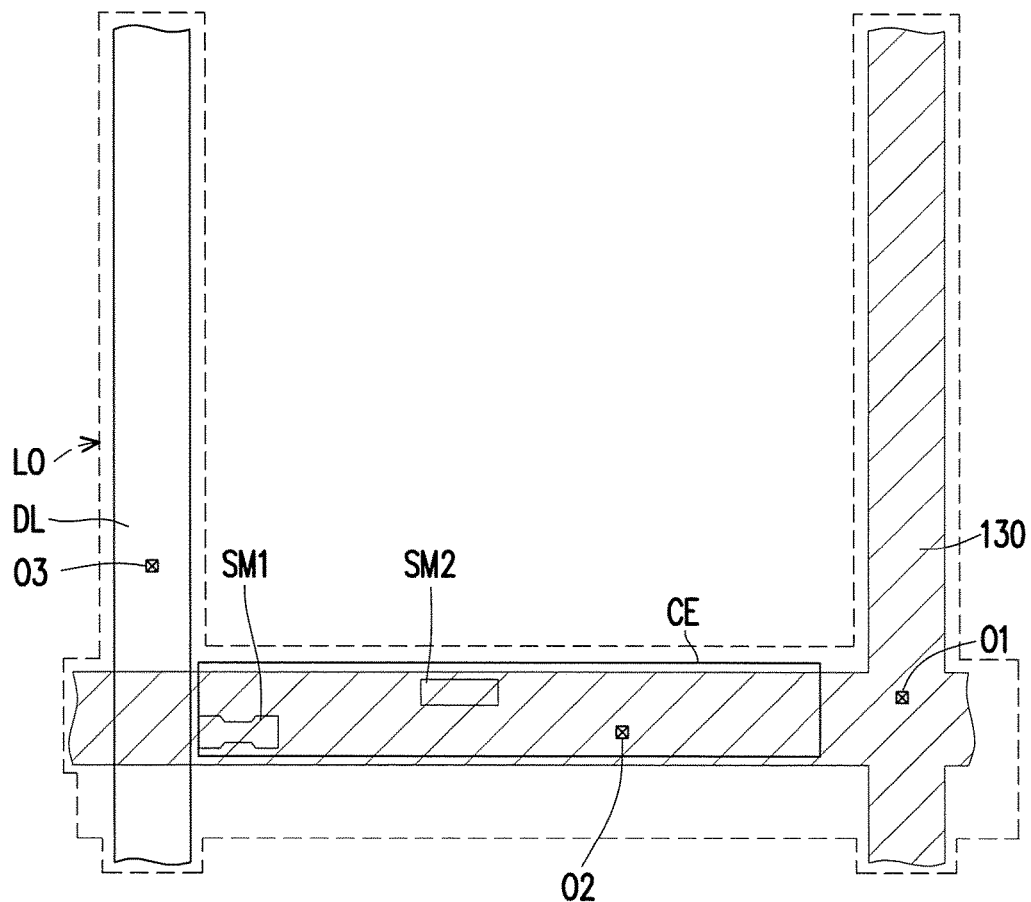

Referring to FIG. 9D, an etching process is adopted to form the opening O1, the opening O2 and the opening O3. The opening O1 is, for example, located in the dielectric layer CSL, the inter-layer 140, the planarization layer 150, the buffer layer 160 and the gate insulation layer 170 (as shown in FIG. 10). The opening O1 exposes a part of the shielding layer 130. The opening O2 and the opening O3 are, for example, located in the inter-layer 140, the planarization layer 150, the buffer layer 160 and the gate insulation layer 170 (as shown in FIG. 10). The opening O2 exposes a part of the capacitor electrode CE. The opening O3 exposes a part of the data line DL.

Figure 9E:
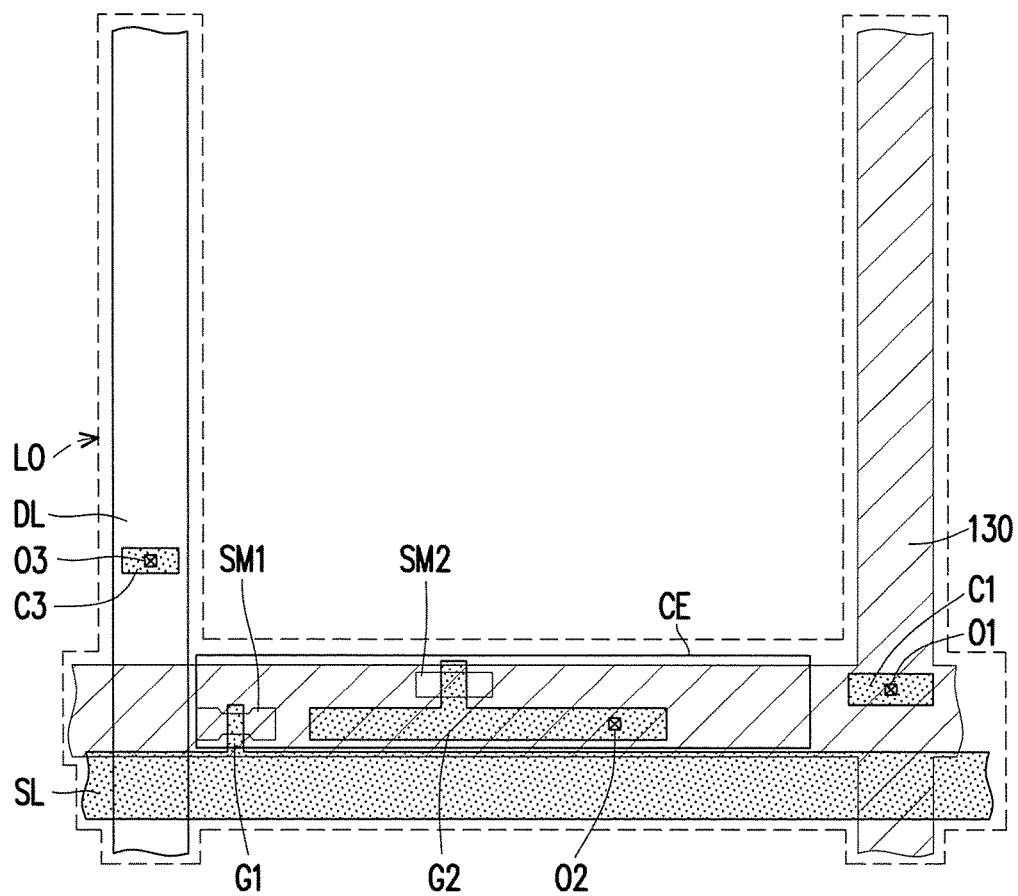

Referring to FIG. 9E, the scan line SL, the first gate G1, the second gate G2, the conductive structure C1 and the conductive structure C3 are formed. The scan line SL, the first gate G1, the second gate G2, the conductive structure C1 and the conductive structure C3, for example, correspond to the layout area LO of the substrate 110. The first gate G1 is connected to the scan line SL, and is located on the first channel layer SM1. The first gate G1 and the scan line SL are separated from the second gate G2. The second gate G2 is located on the second channel layer SM2. In the present embodiment, the second gate G2 is electrically connected to the capacitor electrode CE through the opening O2. The conductive structure C1 is filled in the opening O1 and electrically connected to the shielding layer 130, and the conductive structure C1 is, for example, located in the dielectric layer CSL, the inter-layer 140, the planarization layer 150, the buffer layer 160 and the gate insulation layer 170. The conductive structure C3 is filled in the opening O3 and electrically connected to the data line DL, and the conductive structure C3 is, for example, located in the inter-layer 140, the planarization layer 150, the buffer layer 160 and the gate insulation layer 170.

Figure 9F:
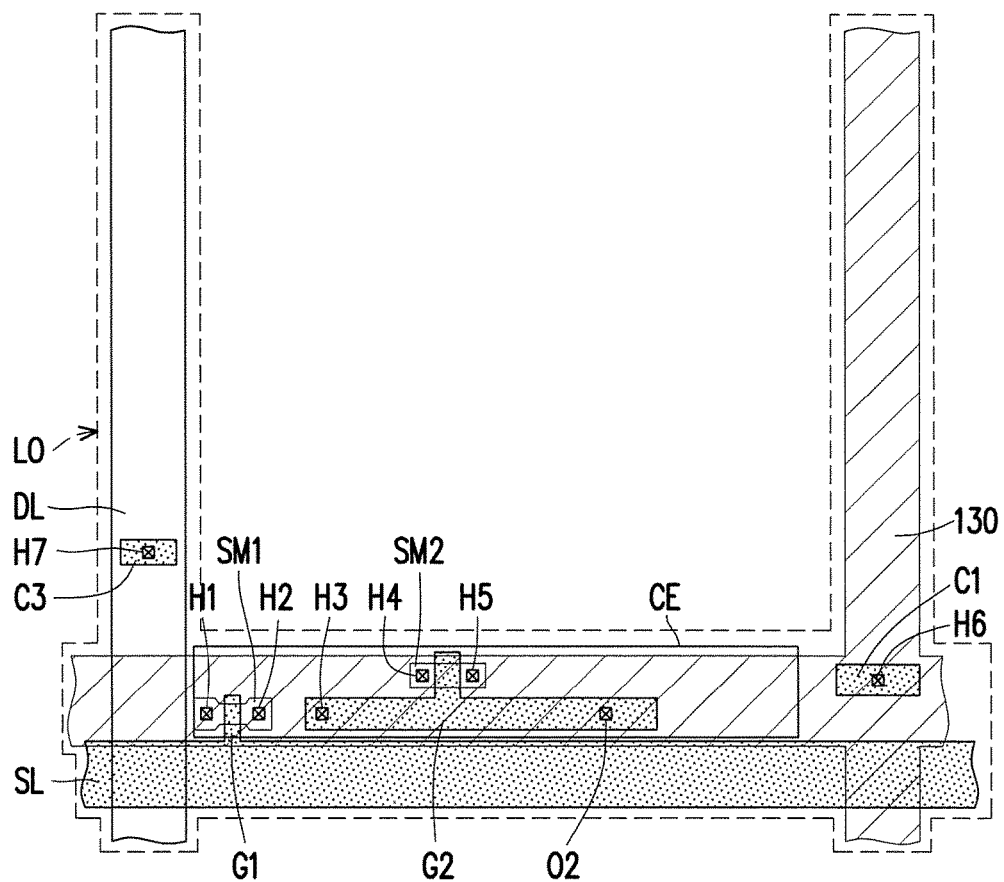

Then, referring to FIG. 9F, the dielectric layer 180 is formed on the first gate G1 and the second gate G2 (as shown in FIG. 10). The dielectric layer 180, for example, covers the conductive structure C1, the conductive structure C3, the scan line SL, the first gate G1 and the second gate G2. An etching process is adopted to form the opening H1, the opening H2, the opening H3, the opening H4, the opening H5, the opening H6 and the opening H7 on the dielectric layer 180. In some embodiments, the opening H1, the opening H2, the opening H4 and the opening H5 are located in the dielectric layer 180 and the gate insulation layer 170. The opening H1 and the opening H2 expose a part of the first channel layer SM1, and the opening H4 and the opening H5 expose a part of the second channel layer SM2. In some embodiments, the opening H3, the opening H6 and the opening H7 are located in the dielectric layer 180. The opening H3 exposes a part of the second gate G2, the opening H6 exposes a part of the conductive structure C1, and the opening H7 exposes a part of the conductive structure C3.

Figure 9G:
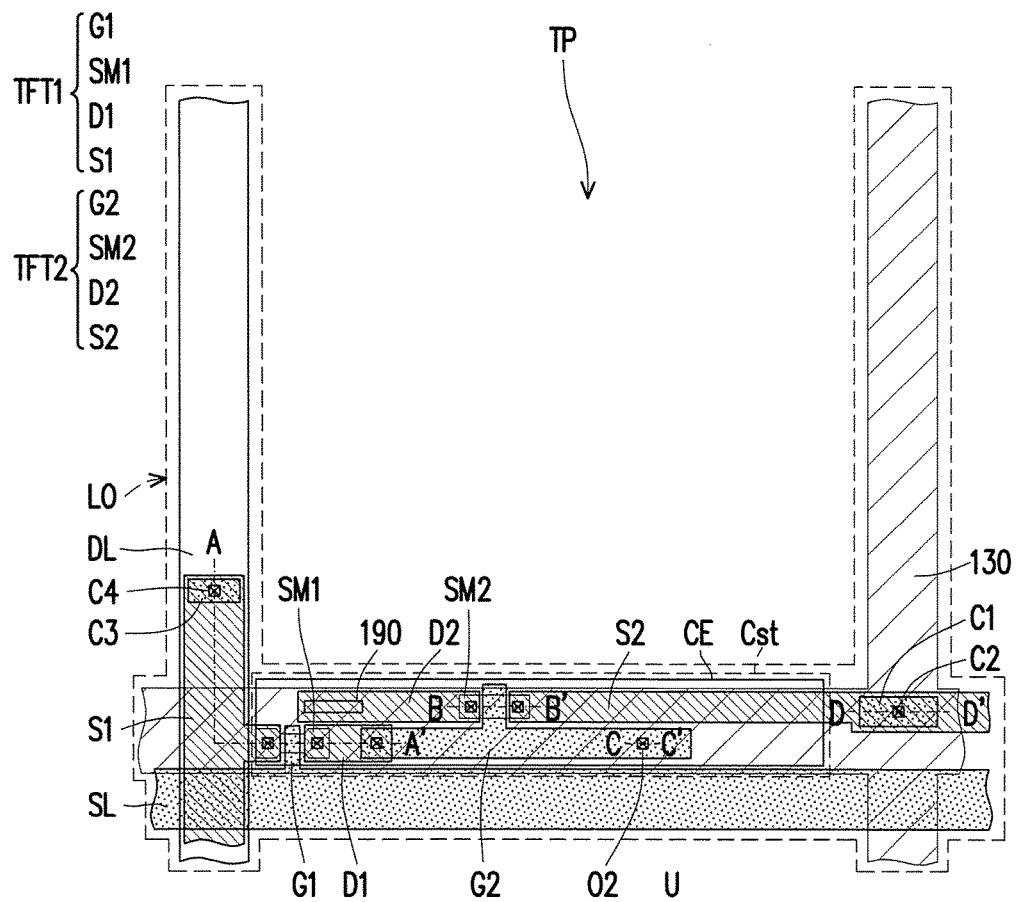

Referring to FIG. 9G and FIG. 10, the first source S1, the first drain D1, the second source S2 and the second drain D2 are formed on the dielectric layer 180. The first source S1, the first drain D1, the second source S2 and the second drain D2, for example, correspond to the layout area LO of the substrate 110.

The first source S1 and the first drain D1 are electrically connected to the first channel layer SM1 through the opening H1 and the opening H2, respectively. The first drain D1 is electrically connected to the second gate G2 through the opening H3.

The conductive structure C4 corresponds to the layout area LO of the substrate 110, and is filled in the opening H7, and the conductive structure C4 is, for example, located in the dielectric layer 180. The first source S1 is electrically connected to the conductive structure C3 through the conductive structure C4. In the present embodiment, the first source S1 is electrically connected to the data line DL through the conductive structure CT2, where the conductive structure CT2 is a multi-layered structure including the conductive structure C3 and the conductive structure C4, though the invention is not limited thereto. In other embodiments, the first source S1 may be electrically connected to the data line DL through the single layered conductive structure C4.

The second drain D2 and the second source S2 are electrically connected to the second channel layer SM2 through the opening H4 and the opening H5, respectively. The second drain D2 may be electrically connected to the display device 190.

The conductive structure C2 corresponds to the layout area LO of the substrate 110, and is filled in the opening H6, and the conductive structure C2 is, for example, located in the dielectric layer 180. The second source S2 is electrically connected to the conductive structure C1 through the conductive structure C2. In the present embodiment, the second source S2 is electrically connected to the shielding layer 130 through the conductive structure CT1, where the conductive structure CT1 is a multi-layered structure including the conductive structure C1 and the conductive structure C2, though the invention is not limited thereto. In other embodiments, the second source S2 may be electrically connected to the shielding layer 130 through the single layered conductive structure C2.

In the present embodiment, the driving circuit includes the scan line SL, the data line DL, the first active device TFT1 and the second active device TFT2. The first active device TFT1 includes the first channel layer SM1, the first gate G1, the first source S1 and the first drain D1, and the second active device TFT2 includes the second channel layer SM2, the second gate G2, the second source S2 and the second drain D2. In the present embodiment, the shielding layer 130 electrically connected to the second source S2 may be overlapped with the capacitor electrode CE electrically connected to the second gate G2, and a storage capacitor Cst is formed between the shielding layer 130 and the capacitor electrode CE.

The power line includes the shielding layer 130, and the shielding layer 130 connected to the second source S2 may transmit the signal voltage (VDD) to the second active device TFT2. In the present embodiment, a part of the capacitor electrode CE and a part of the shielding layer 130 are located between the first active device TFT1 and the substrate 110 and/or between the second active device TFT2 and the substrate 110. An orthogonal projection of the shielding layer 130 used for transmitting the signal voltage (VDD) and the capacitor electrode CE on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 and the capacitor electrode CE may be overlapped with the first active device TFT1 and/or the second active device TFT2. In an embodiment, a distance between the capacitor electrode CE and the first active device TFT1 (and the second active device TFT2) ranges between about 500 nm and about 2500 nm. In an embodiment, an electric field intensity between the capacitor electrode CE and the first active device TFT1 (and the second active device TFT2) is smaller than about 0.3 MV/cm. The shielding layer 130 and the capacitor electrode CE may mitigate an influence of the external light and/or static electricity on the first active device TFT1 and the second active device TFT2.

Figure 11:
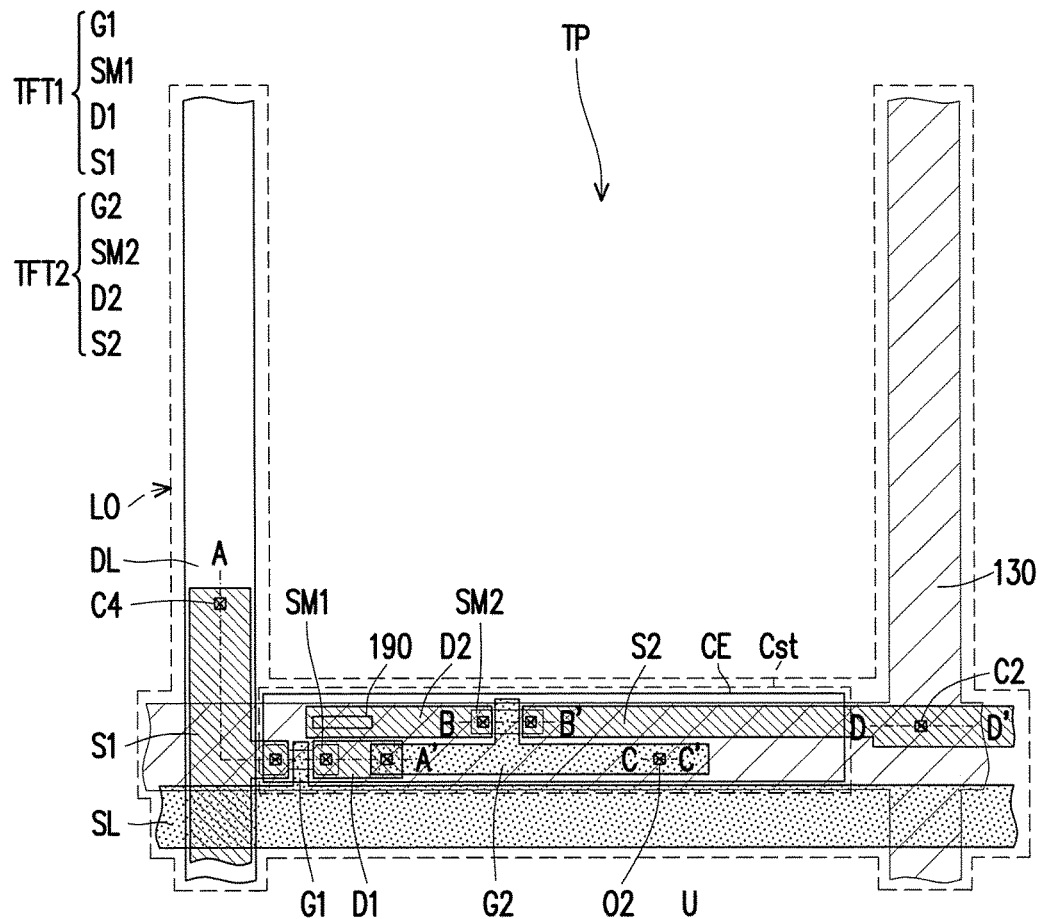
FIG. 11 is a top view of a method for manufacturing a pixel structure of a display panel according to a sixth embodiment of the disclosure.
Figure 12:
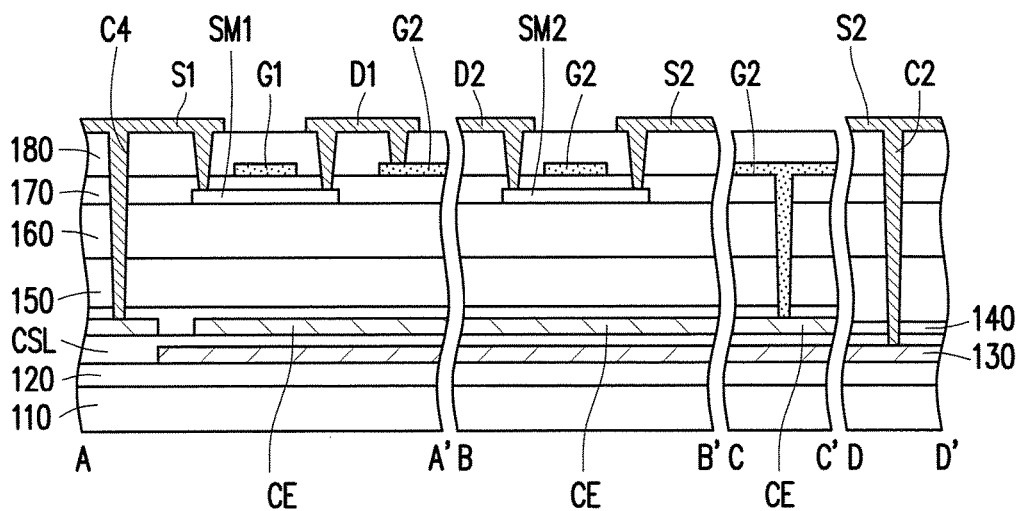
FIG. 12 is a cross-sectional view of FIG. 11 along section lines AA', BB', CC' and DD'.

FIG. 11 is a top view of a method for manufacturing a pixel structure of a display panel according to a sixth embodiment of the disclosure. FIG. 12 is a cross-sectional view of FIG. 11 along section lines AA', BB', CC' and DD'. It should be noted that reference numbers of the components and a part of contents of the third embodiment of FIGS. 9A-9G and FIG. 10 are also used in the sixth embodiment of FIG. 11 and FIG. 12, wherein the same reference numbers denote the same or like components, and descriptions of the same technical contents are omitted. The aforementioned embodiment can be referred for descriptions of the omitted parts, and detailed descriptions thereof are not repeated in the following embodiment. In the present embodiment, the first source S1 is electrically connected to the data line DL through the single layered conductive structure C4, and the second source S2 is electrically connected to the shielding layer 130 through the single layered conductive structure C2. The conductive structure C2 is, for example, located in the dielectric layer CSL, the inter-layer 140, the planarization layer 150, the buffer layer 160, the gate insulation layer 170 and the dielectric layer 180, and the conductive structure C4 is, for example, located in the inter-layer 140, the planarization layer 150, the buffer layer 160, the gate insulation layer 170 and the dielectric layer 180. Since the first source S1 of the present embodiment is electrically connected to the data line DL through the single layered conductive structure C4, and the second source S2 is electrically connected to the shielding layer 130 through the single layered conductive structure C2, a problem of inaccurate alignment of the conductive structures is not liable to be occurred, which improves a product yield. In some embodiments, by setting the conductive structure C2 in an opening formed by an etching process, more circuit layout space is acquired to improve an aperture ratio of the display panel.

In the present embodiment, the power wire includes the shielding layer 130, where the shielding layer 130 connected to the second source S2 may transmit the signal voltage (VDD) to the second active device TFT2. In the present embodiment, a part of the capacitor electrode CE and a part of the shielding layer 130 are located between the first active device TFT1 and the substrate 110 and/or between the second active device TFT2 and the substrate 110. An orthogonal projection of the shielding layer 130 used for transmitting the signal voltage (VDD) and the capacitor electrode CE on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 and the capacitor electrode CE may be overlapped with the first active device TFT1 and/or the second active device TFT2. In an embodiment, a distance between the capacitor electrode CE and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 and the capacitor electrode CE may mitigate an influence of the external light and/or static electricity on the first active device TFT1 and the second active device TFT2.

FIGS. 13A-13G are top views of a method for manufacturing a pixel structure of a display panel according to a seventh embodiment of the disclosure. FIG. 14 is a cross-sectional view of FIG. 13G along section lines AA', BB', CC' and DD'. It should be noted that reference numbers of the components and a part of contents of the third embodiment of FIGS. 5A-5G and FIG. 6 are also used in the seventh embodiment of FIGS. 13A-13G and FIG. 14, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 13A:
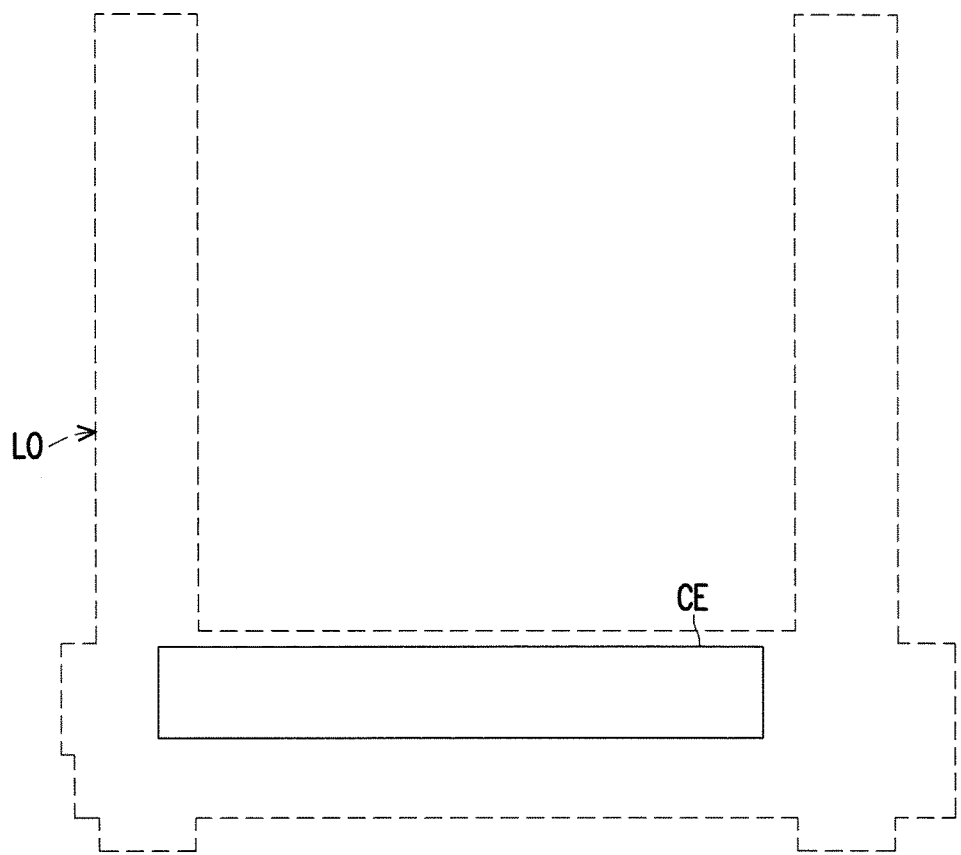
FIGS. 13A-13G are top views of a method for manufacturing a pixel structure of a display panel according to a seventh embodiment of the disclosure.
Figure 14:
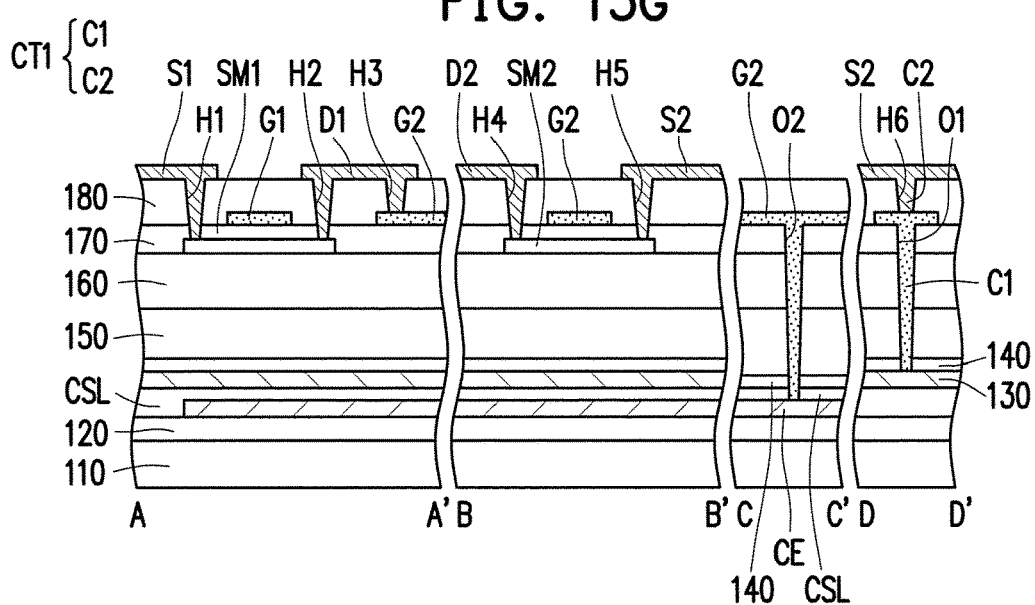
FIG. 14 is a cross-sectional view of FIG. 13G along section lines AA', BB', CC' and DD'.

Referring to FIG. 13A, the capacitor electrode CE is formed on the layout area LO of the substrate 110 (as shown in FIG. 14). In the present embodiment, the barrier layer 120 (as shown in FIG. 14) is further disposed between the capacitor electrode CE and the substrate 110. The capacitor electrode CE is formed on the barrier layer 120, and contacts the barrier layer 120.

Figure 13B:
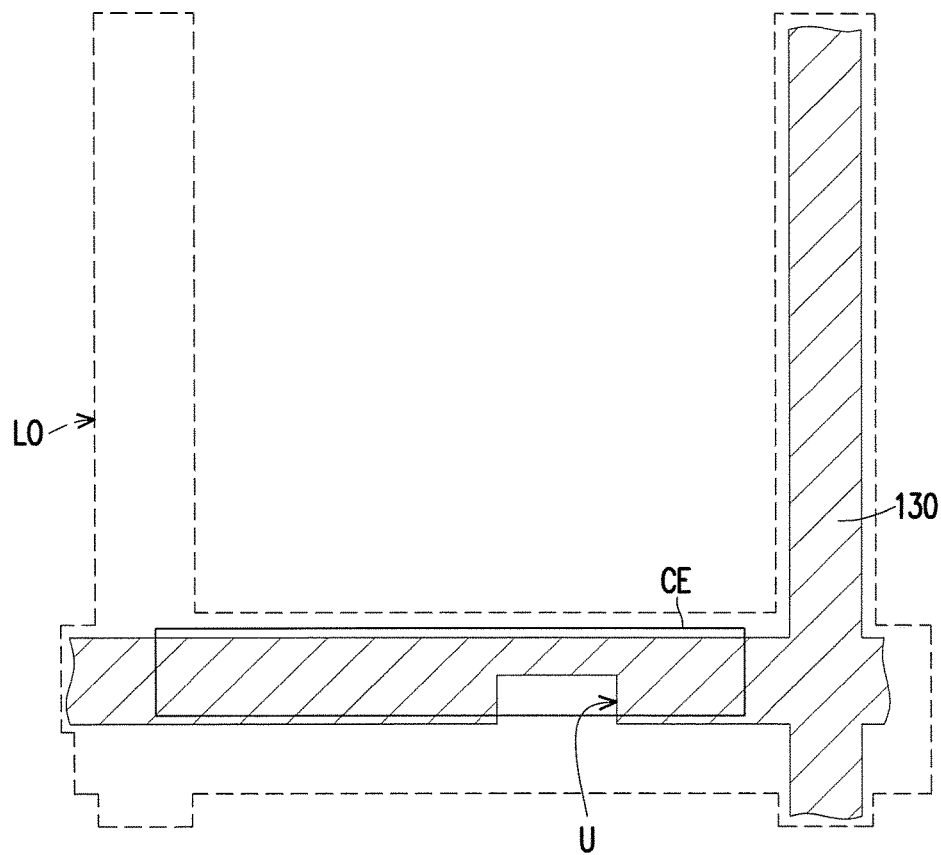

Referring to FIG. 13B, the dielectric layer CSL (as shown in FIG. 14) is formed on the capacitor electrode CE. Then, the shielding layer 130 is formed on the dielectric layer CSL. In the present embodiment, the film layer where the capacitor electrode CE belongs to may be located between a film layer where the shielding layer 130 belongs to and the substrate 110. The shielding layer 130 has an opening U corresponding to the capacitor electrode CE, where an accommodating space of the opening U may be overlapped with a part of the capacitor electrode CE. In the present embodiment, the opening U of the shielding layer 130 is a rectangle, though the invention is not limited thereto, and in other embodiments, the opening U may have a round shape, a triangular shape or other geometric shapes.

Figure 13C:
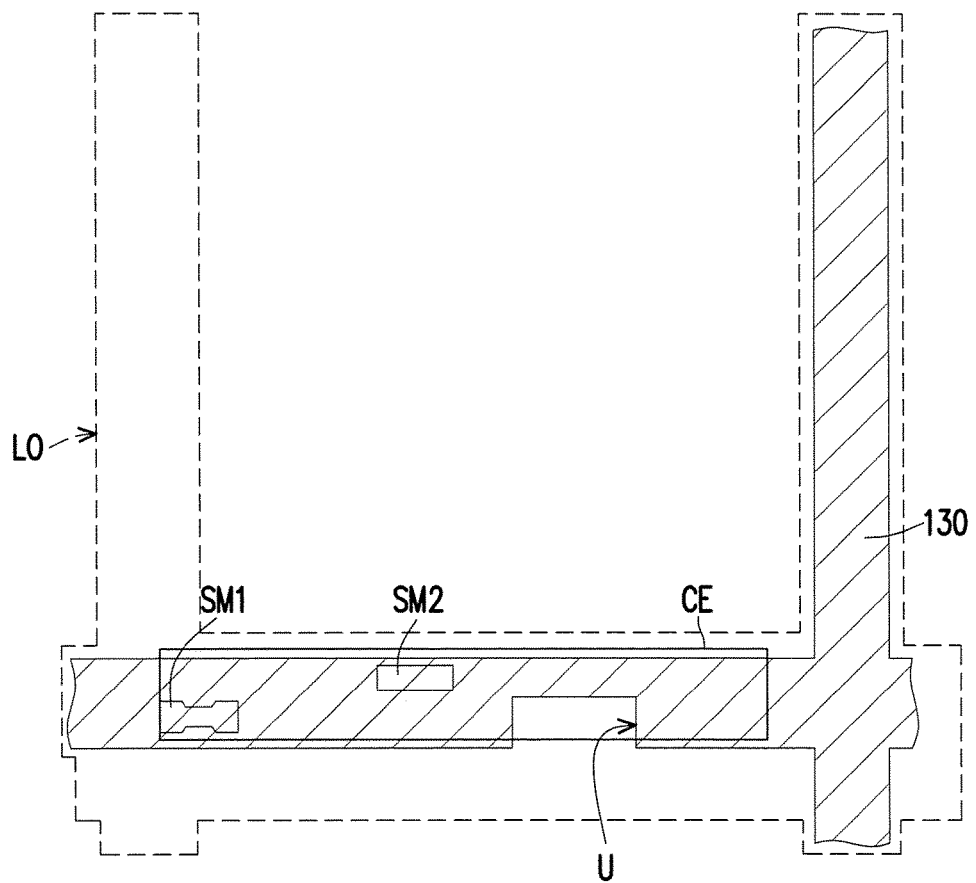

Referring to FIG. 13C, the first channel layer SM1 and the second channel layer SM2 are formed on the shielding layer 130. The first channel layer SM1 and the second channel layer SM2 are, for example, located on the layout area LO of the substrate 110. In some embodiments, the inter-layer 140, the planarization layer 150 and the buffer layer 160 are further disposed between the shielding layer 130 and the first channel layer SM1 and between the shielding layer 130 and the second channel layer SM2 (as shown in FIG. 14). The methods for forming the inter-layer 140, the planarization layer 150, the buffer layer 160, the first channel layer SM1 and the second channel layer SM2 may be similar to that of the aforementioned embodiments. After the first channel layer SM1 and the second channel layer SM2 are fabricated, the gate insulation layer 170 covering the first channel layer SM1 and the second channel layer SM2 is formed (as shown in FIG. 14).

Figure 13D:
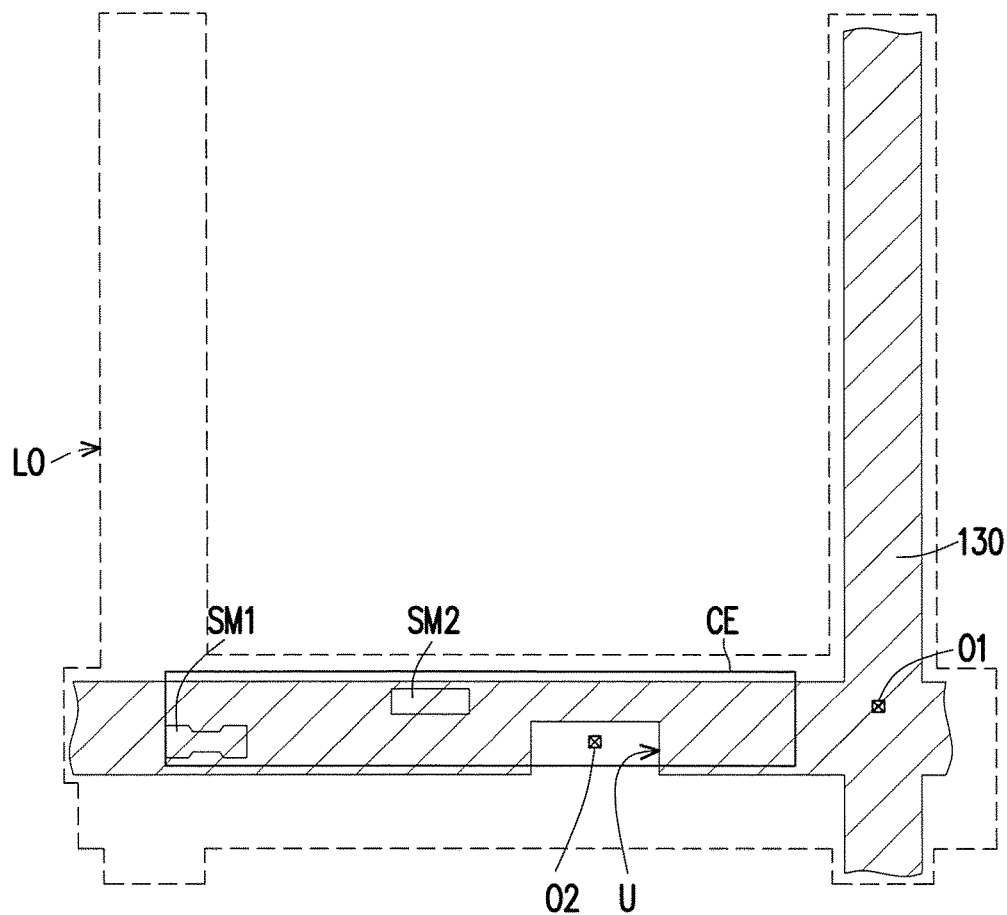

Referring to FIG. 13D, an etching process is adopted to form the opening O1 and the opening O2. The opening O1 is, for example, located in the inter-layer 140, the planarization layer 150, the buffer layer 160 and the gate insulation layer 170 (as shown in FIG. 14). The opening O1 exposes a part of the shielding layer 130. The opening O2 is, for example, located in the dielectric layer CSL, the inter-layer 140, the planarization layer 150, the buffer layer 160 and the gate insulation layer 170 (as shown in FIG. 14). The opening O2 exposes a part of the capacitor electrode CE.

Figure 13E:
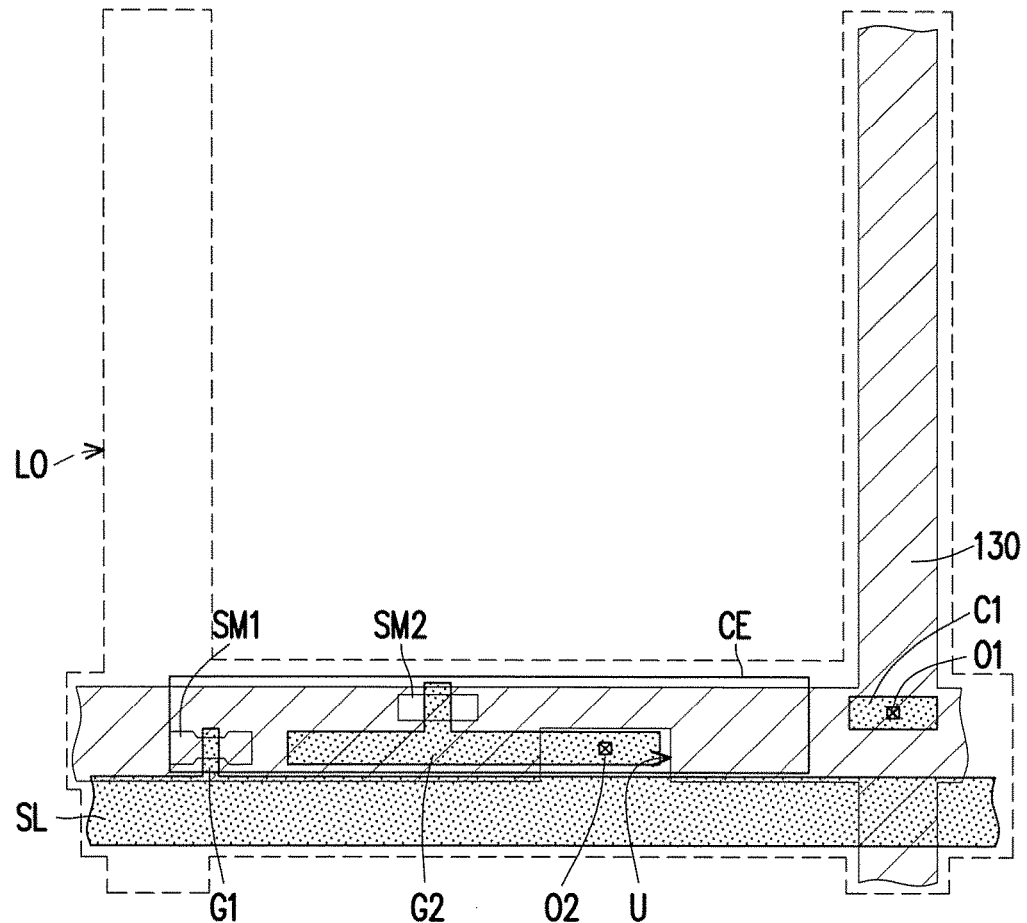

Referring to FIG. 13E, the scan line SL, the first gate G1, the second gate G2 and the conductive structure C1 are formed. The scan line SL, the first gate G1, the second gate G2 and the conductive structure C1 are, for example, located on the layout area LO of the substrate 110. The first gate G1 is connected to the scan line SL, and is located on the first channel layer SM1. The first gate G1 and the scan line SL are separated from the second gate G2. The second gate G2 is located on the second channel layer SM2. In the present embodiment, a part of the second gate G2 may be extended to the top of the opening U of the shielding layer 130, and the second gate G2 is electrically connected to the capacitor electrode CE through the opening O2. The conductive structure C1 is filled in the opening O1 and electrically connected to the shielding layer 130.

Figure 13F:
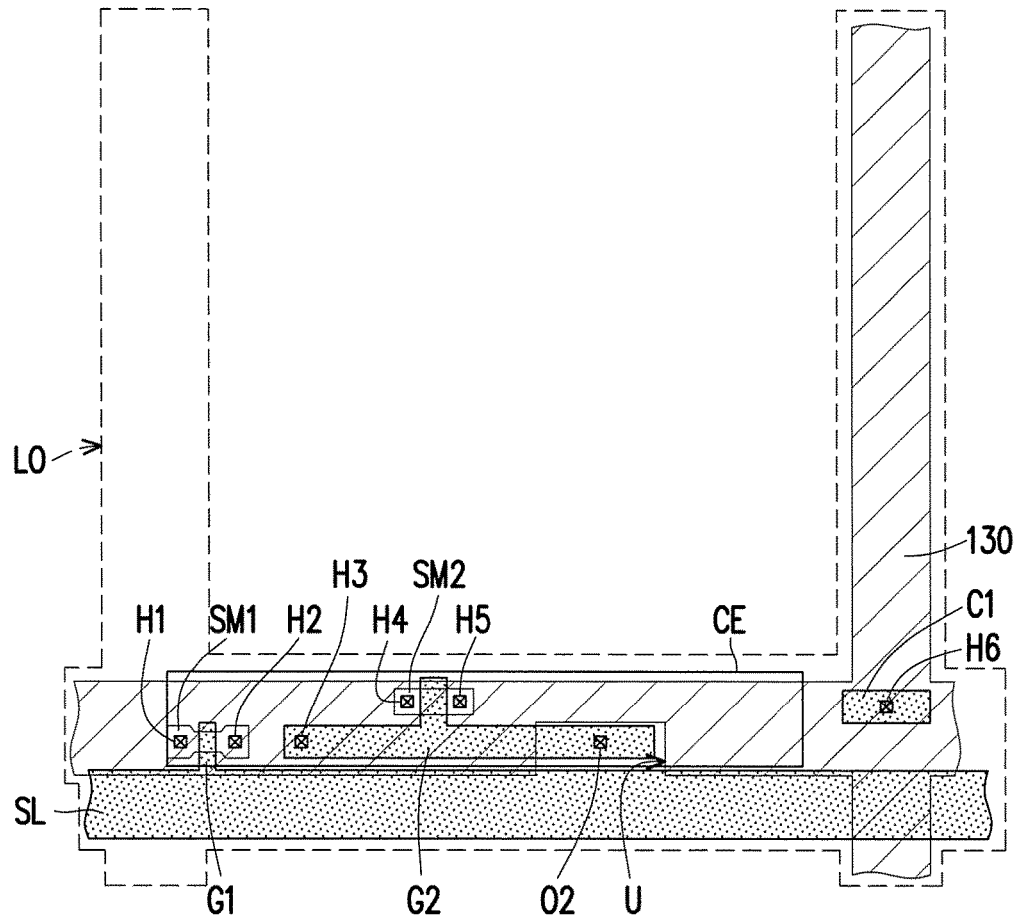

Then, referring to FIG. 13F, the dielectric layer 180 is formed on the first gate G1 and the second gate G2 (as shown in FIG. 14). The dielectric layer 180, for example, covers the conductive structure C1, the scan line SL, the first gate G1 and the second gate G2. An etching process is adopted to form the opening H1, the opening H2, the opening H3, the opening H4, the opening H5 and the opening H6 on the dielectric layer 180. In some embodiments, the opening H1, the opening H2, the opening H4 and the opening H5 are located in the dielectric layer 180 and the gate insulation layer 170. The opening H1 and the opening H2 expose a part of the first channel layer SM1, and the opening H4 and the opening H5 expose a part of the second channel layer SM2. In some embodiments, the opening H3 and the opening H6 are located in the dielectric layer 180. The opening H3 exposes a part of the second gate G2, and the opening H6 exposes a part of the conductive structure C1.

Figure 13G:
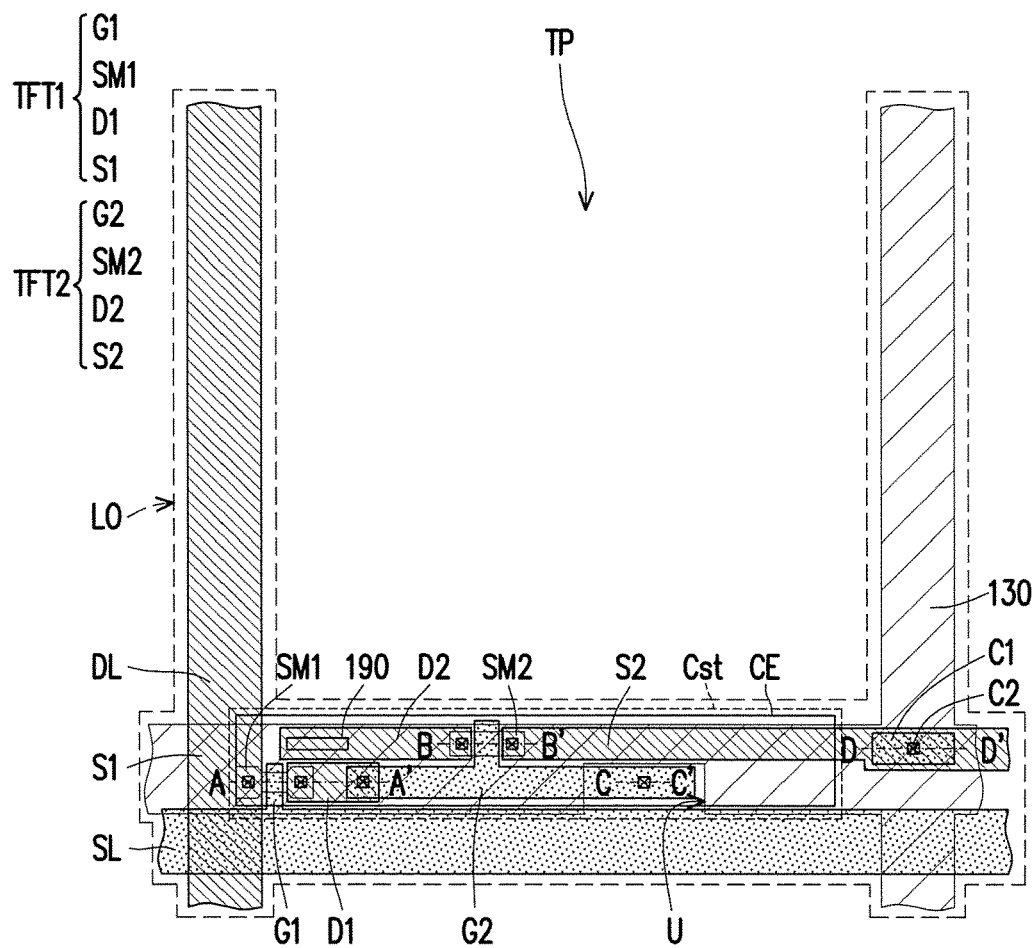

Referring to FIG. 13G and FIG. 14, the data line DL, the first source S1, the first drain D1, the second source S2 and the second drain D2 are formed on the dielectric layer 180. The data line DL, the first source S1, the first drain D1, the second source S2 and the second drain D2 are, for example, located on the layout area LO of the substrate 110. In the present embodiment, the first source S1 is connected to the data line DL.

The first source S1 and the first drain D1 are electrically connected to the first channel layer SM1 through the opening H1 and the opening H2, respectively. The first drain D1 is electrically connected to the second gate G2 through the opening H3.

The second drain D2 and the second source S2 are electrically connected to the second channel layer SM2 through the opening H4 and the opening H5, respectively. The second drain D2 is electrically connected to the display device 190.

The conductive structure C2 is filled in the opening H6, and the second source S2 is electrically connected to the conductive structure C1 through the conductive structure C2. In the present embodiment, the second source S2 is electrically connected to the shielding layer 130 through the conductive structure CT1, where the conductive structure CT1 is a multi-layered structure including the conductive structure C1 and the conductive structure C2, though the invention is not limited thereto. In other embodiments, the second source S2 may be electrically connected to the shielding layer 130 through the single layered conductive structure C2.

In the present embodiment, the driving circuit includes the scan line SL, the data line DL, the first active device TFT1 and the second active device TFT2. The first active device TFT1 includes the first channel layer SM1, the first gate G1, the first source S1 and the first drain D1, and the second active device TFT2 includes the second channel layer SM2, the second gate G2, the second source S2 and the second drain D2. In the present embodiment, the shielding layer 130 electrically connected to the second source S2 may be overlapped with the capacitor electrode CE electrically connected to the second gate G2, and a storage capacitor Cst is formed between the shielding layer 130 and the capacitor electrode CE.

The power line includes the shielding layer 130, and the shielding layer 130 connected to the second source S2 may transmit the signal voltage (VDD) to the second active device TFT2. In the present embodiment, a part of the capacitor electrode CE and a part of the shielding layer 130 are located between the first active device TFT1 and the substrate 110 and/or between the second active device TFT2 and the substrate 110. An orthogonal projection of the shielding layer 130 used for transmitting the signal voltage (VDD) and the capacitor electrode CE on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 and the capacitor electrode CE may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 and the capacitor electrode CE may mitigate an influence of the external light and/or static electricity on the first active device TFT1 and the second active device TFT2.

Figure 15:
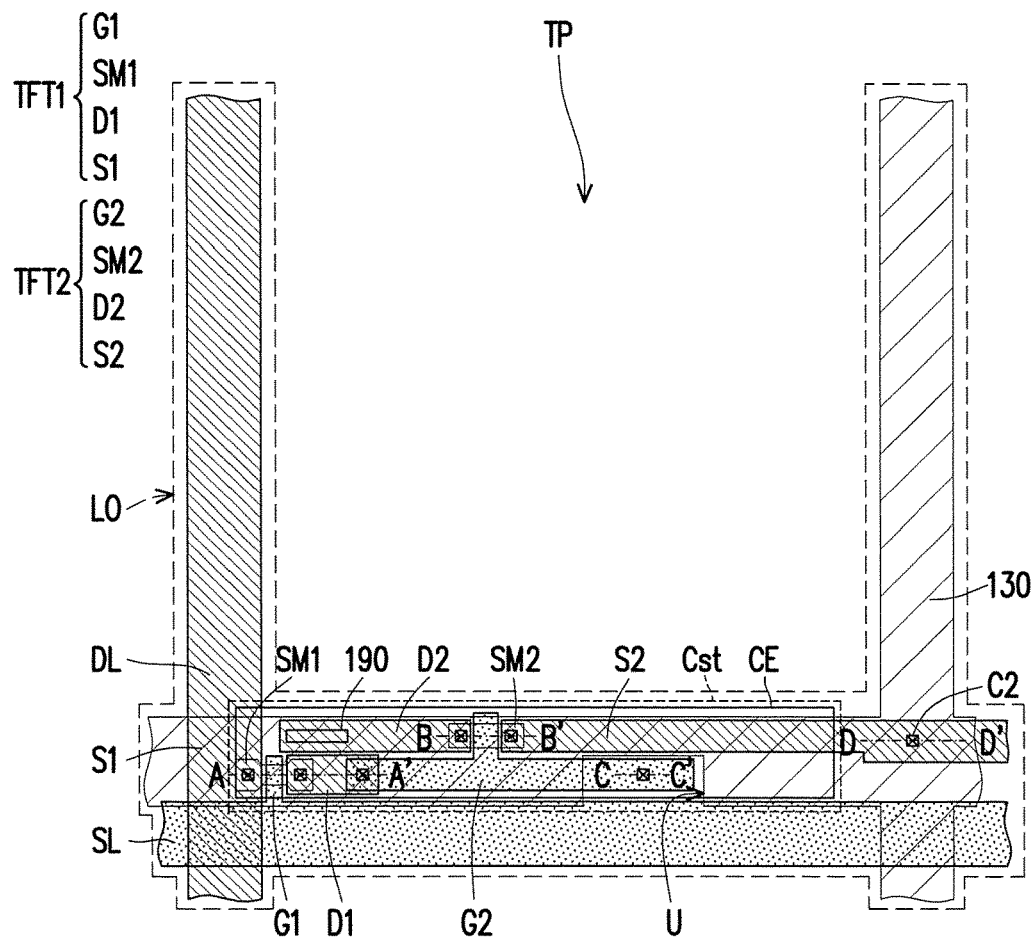
FIG. 15 is a top view of a method for manufacturing a pixel structure of a display panel according to an eighth embodiment of the disclosure.
Figure 16:
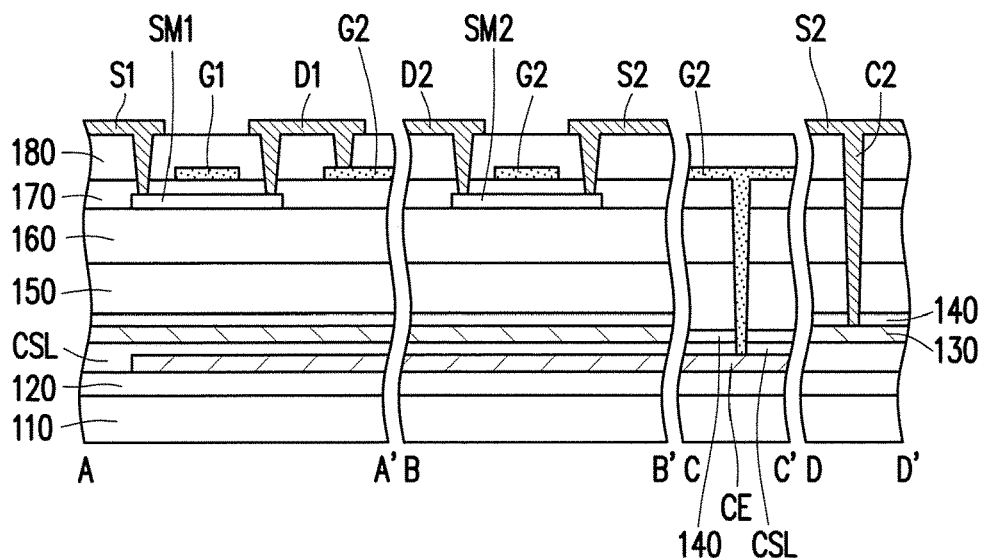
FIG. 16 is a cross-sectional view of FIG. 15 along section lines AA', BB', CC' and DD'.

FIG. 15 is a top view of a method for manufacturing a pixel structure of a display panel according to an eighth embodiment of the disclosure. FIG. 16 is a cross-sectional view of FIG. 15 along section lines AA', BB', CC' and DD'. It should be noted that reference numbers of the components and a part of contents of the seventh embodiment of FIGS. 13A-13G and FIG. 14 are also used in the eighth embodiment of FIG. 15 and FIG. 16, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, the second source S2 is electrically connected to the shielding layer 130 through the single layered conductive structure C2, so that the problem of inaccurate alignment of the conductive structure is not liable to be occurred, which improves a product yield. In some embodiments, by setting the conductive structure C2 in an opening formed by an etching process, more circuit layout space is acquired to improve an aperture ratio of the display panel.

In the present embodiment, the power line includes the shielding layer 130, and the shielding layer 130 connected to the second source S2 may transmit the signal voltage (VDD) to the second active device TFT2. In the present embodiment, a part of the capacitor electrode CE and a part of the shielding layer 130 are located between the first active device TFT1 and the substrate 110 and between the second active device TFT2 and the substrate 110. An orthogonal projection of the shielding layer 130 used for transmitting the signal voltage (VDD) and the capacitor electrode CE on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 and the capacitor electrode CE may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 and the capacitor electrode CE may mitigate an influence of the external light and/or static electricity on the first active device TFT1 and the second active device TFT2.

Figure 17:
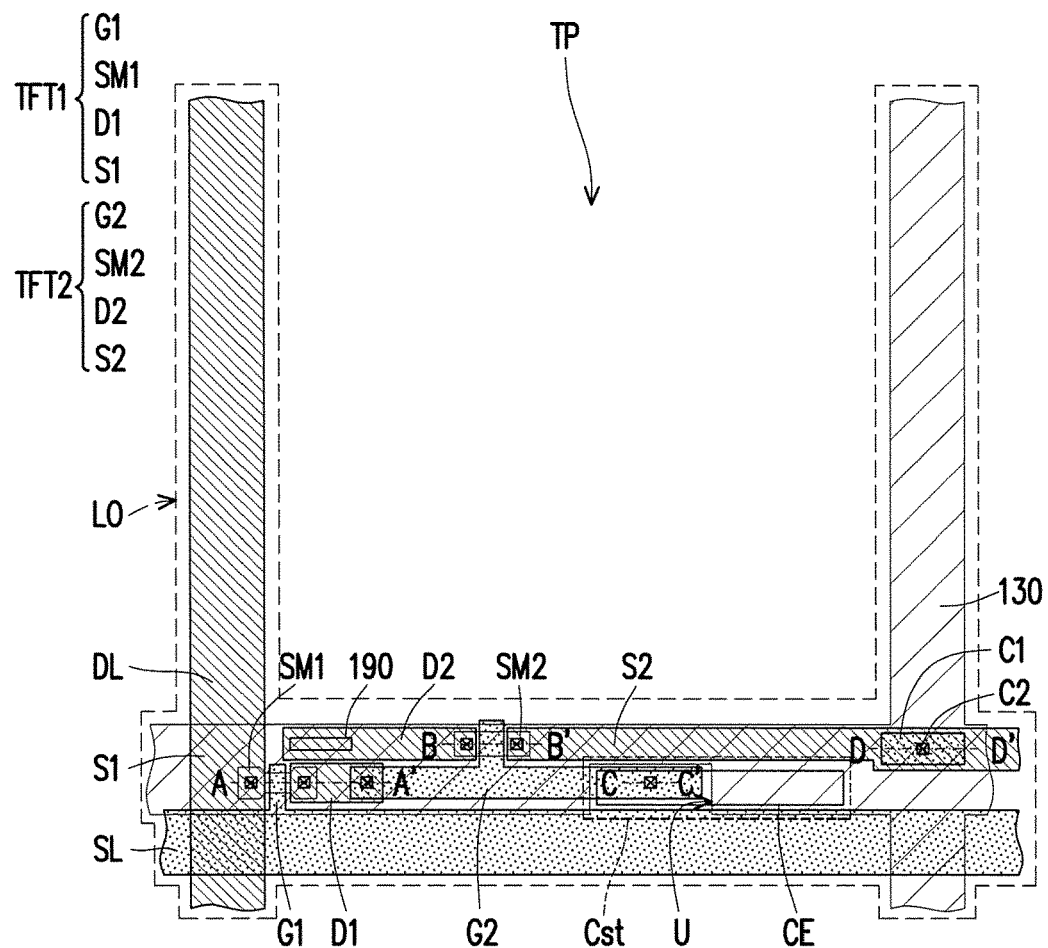
FIG. 17 is a top view of a method for manufacturing a pixel structure of a display panel according to a ninth embodiment of the disclosure.
Figure 18:
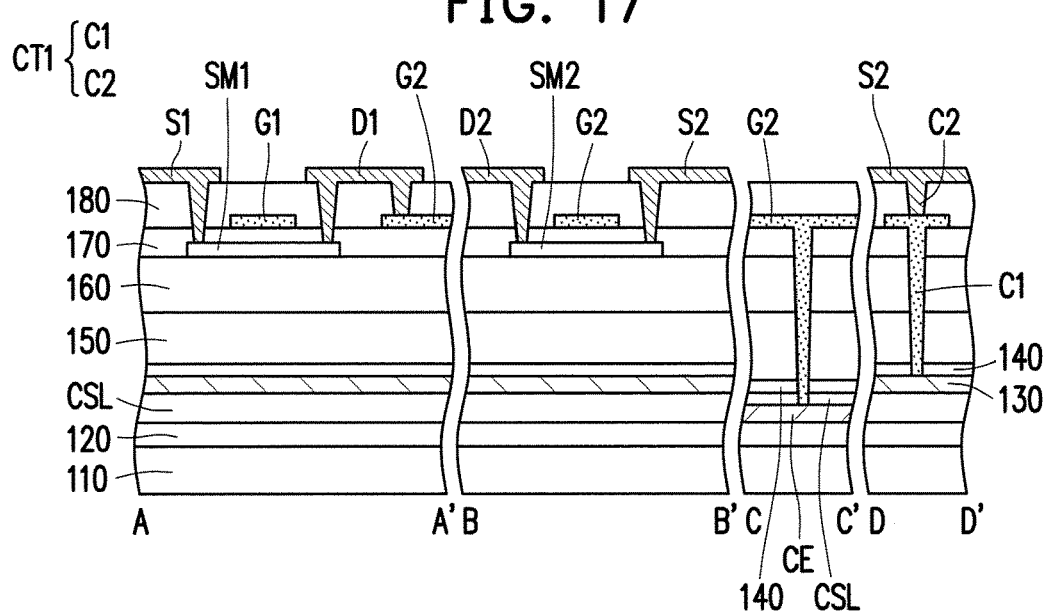
FIG. 18 is a cross-sectional view of FIG. 17 along section lines AA', BB', CC' and DD'.

FIG. 17 is a top view of a method for manufacturing a pixel structure of a display panel according to a ninth embodiment of the disclosure. FIG. 18 is a cross-sectional view of FIG. 17 along section lines AA', BB', CC' and DD'. It should be noted that reference numbers of the components and a part of contents of the seventh embodiment of FIGS. 13A-13G and FIG. 14 are also used in the ninth embodiment of FIG. 17 and FIG. 18, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, an area of the capacitor electrode CE is relatively small, and the capacitor electrode CE is not overlapped with the first channel layer SM1 of the first active device TFT1 and the second channel layer SM2 of the second active device TFT2. However, a part of the capacitor electrode CE is overlapped with the shielding layer 130 to construct the storage capacitor Cst.

In the present embodiment, the power line includes the shielding layer 130, and the shielding layer 130 connected to the second source S2 may transmit the signal voltage (VDD) to the second active device TFT2. In the present embodiment, a part of the shielding layer 130 used for transmitting the signal voltage is located between the first active device TFT1 and the substrate 110 and/or between the second active device TFT2 and the substrate 110. An orthogonal projection of the shielding layer 130 used for transmitting the signal voltage (VDD) on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 may mitigate an influence of the external light and/or static electricity on the first active device TFT1 and the second active device TFT2.

Figure 19:
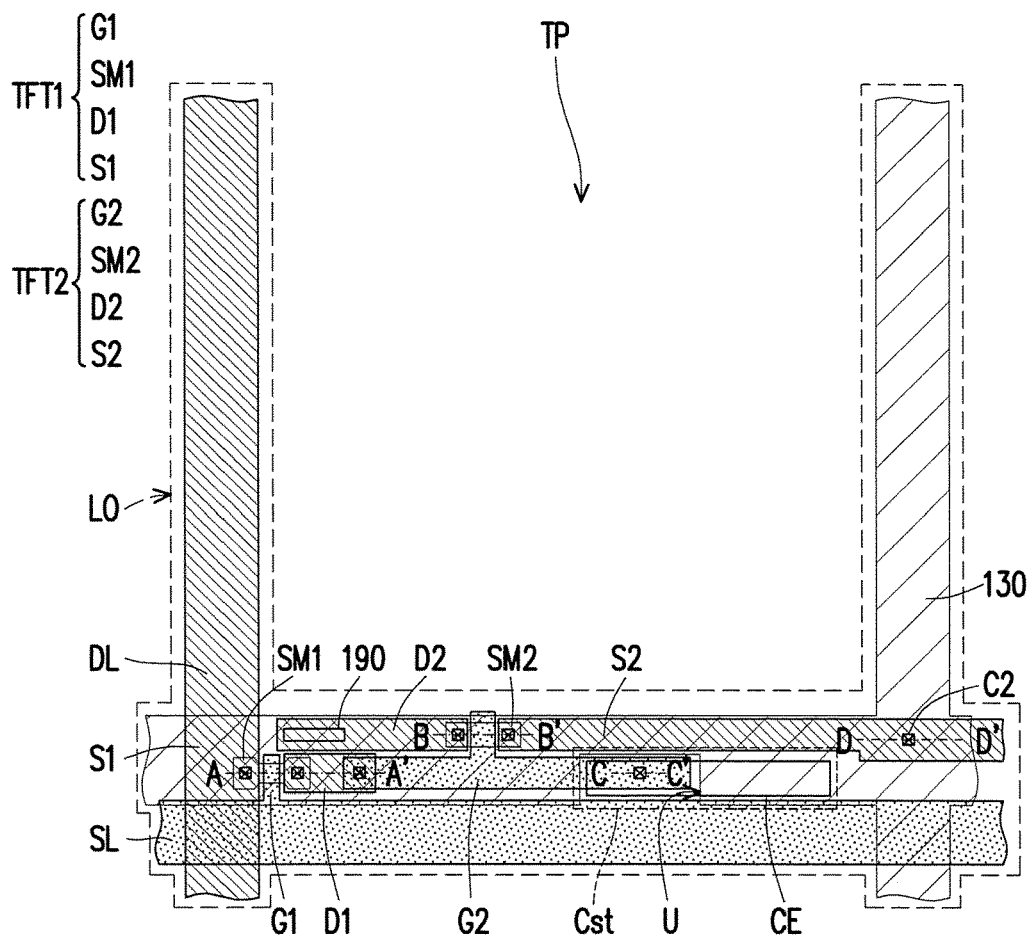
FIG. 19 is a top view of a method for manufacturing a pixel structure of a display panel according to a tenth embodiment of the disclosure.
Figure 20:
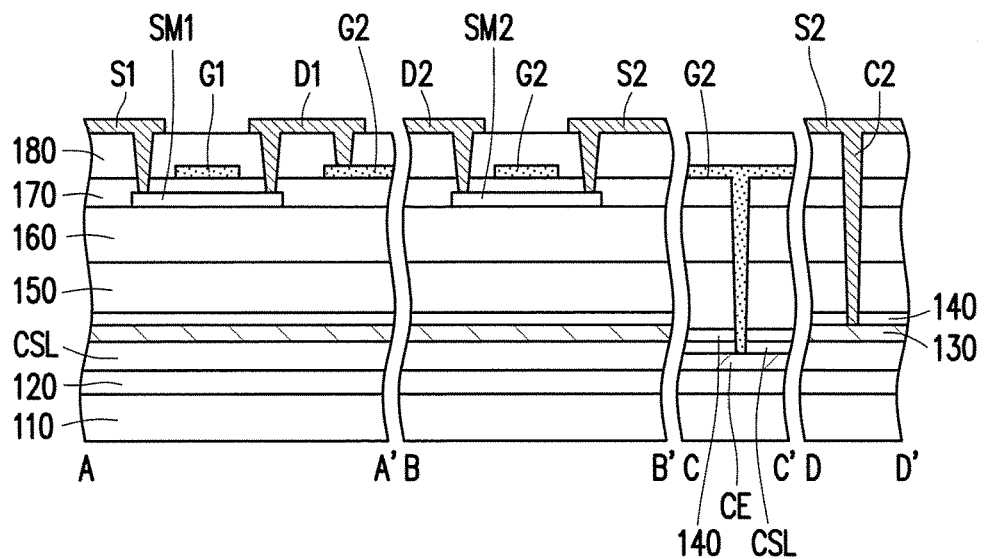
FIG. 20 is a cross-sectional view of FIG. 19 along section lines AA', BB', CC' and DD'.

FIG. 19 is a top view of a method for manufacturing a pixel structure of a display panel according to a tenth embodiment of the disclosure. FIG. 20 is a cross-sectional view of FIG. 19 along section lines AA', BB', CC' and DD'. It should be noted that reference numbers of the components and a part of contents of the ninth embodiment of FIG. 17 and FIG. 18 are also used in the tenth embodiment of FIG. 19 and FIG. 20, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, the second source S2 is electrically connected to the shielding layer 130 through the single layered conductive structure C2, so that the problem of inaccurate alignment of the conductive structure is not liable to be occurred, which improves a product yield. In some embodiments, by setting the conductive structure C2 in an opening formed by an etching process, more circuit layout space is acquired to improve an aperture ratio of the display panel.

In the present embodiment, the power line includes the shielding layer 130, and the shielding layer 130 connected to the second source S2 may transmit the signal voltage (VDD) to the second active device TFT2. In the present embodiment, a part of the shielding layer 130 used for transmitting the signal voltage is located between the first active device TFT1 and the substrate 110 and/or between the second active device TFT2 and the substrate 110. An orthogonal projection of the shielding layer 130 used for transmitting the signal voltage (VDD) on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 may mitigate an influence of the external light and/or static electricity on the first active device TFT1 and the second active device TFT2.

FIGS. 21A-21G are top views of a method for manufacturing a pixel structure of a display panel according to an eleventh embodiment of the disclosure. FIG. 22 is a cross-sectional view of FIG. 21G along section lines AK, BB', CC' and DD'. It should be noted that reference numbers of the components and a part of contents of the third embodiment of FIGS. 5A-5G and FIG. 6 are also used in the eleventh embodiment of FIGS. 21A-21G and FIG. 22, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 21A:
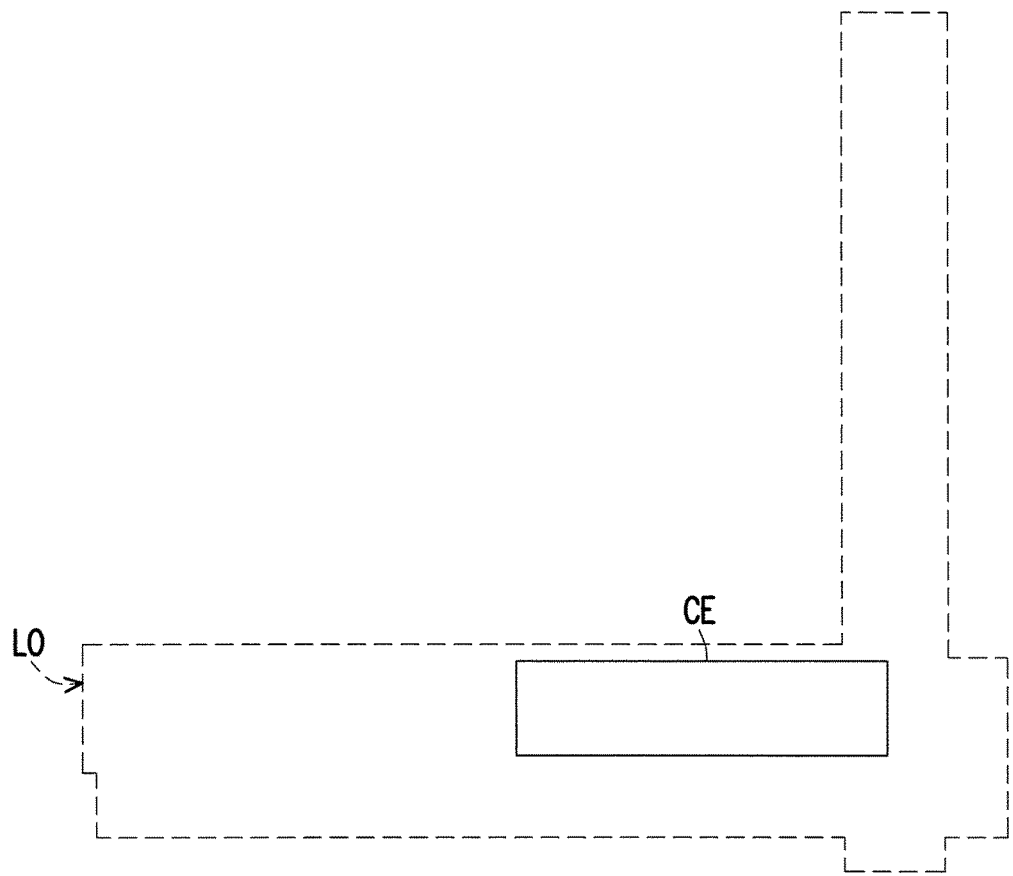
FIGS. 21A-21G are top views of a method for manufacturing a pixel structure of a display panel according to an eleventh embodiment of the disclosure.
Figure 22:
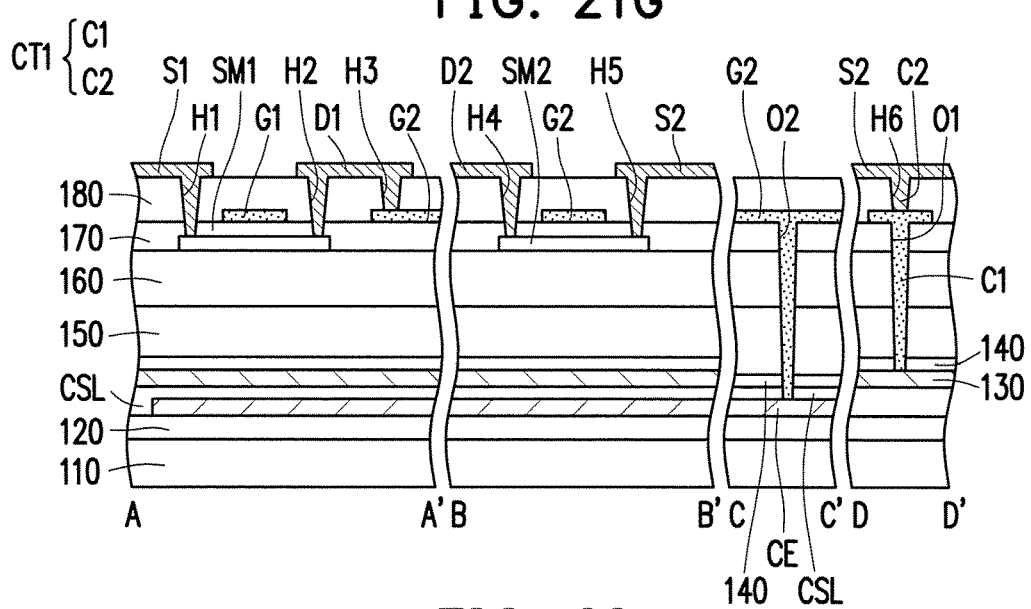
FIG. 22 is a cross-sectional view of FIG. 21G along section lines AA', BB', CC' and DD'.

Referring to FIG. 21A, the capacitor electrode CE is formed on the layout area LO of the substrate 110 (as shown in FIG. 22). In the present embodiment, the barrier layer 120 (as shown in FIG. 22) is further disposed between the capacitor electrode CE and the substrate 110. The capacitor electrode CE is formed on the barrier layer 120, and contacts the barrier layer 120.

Figure 21B:
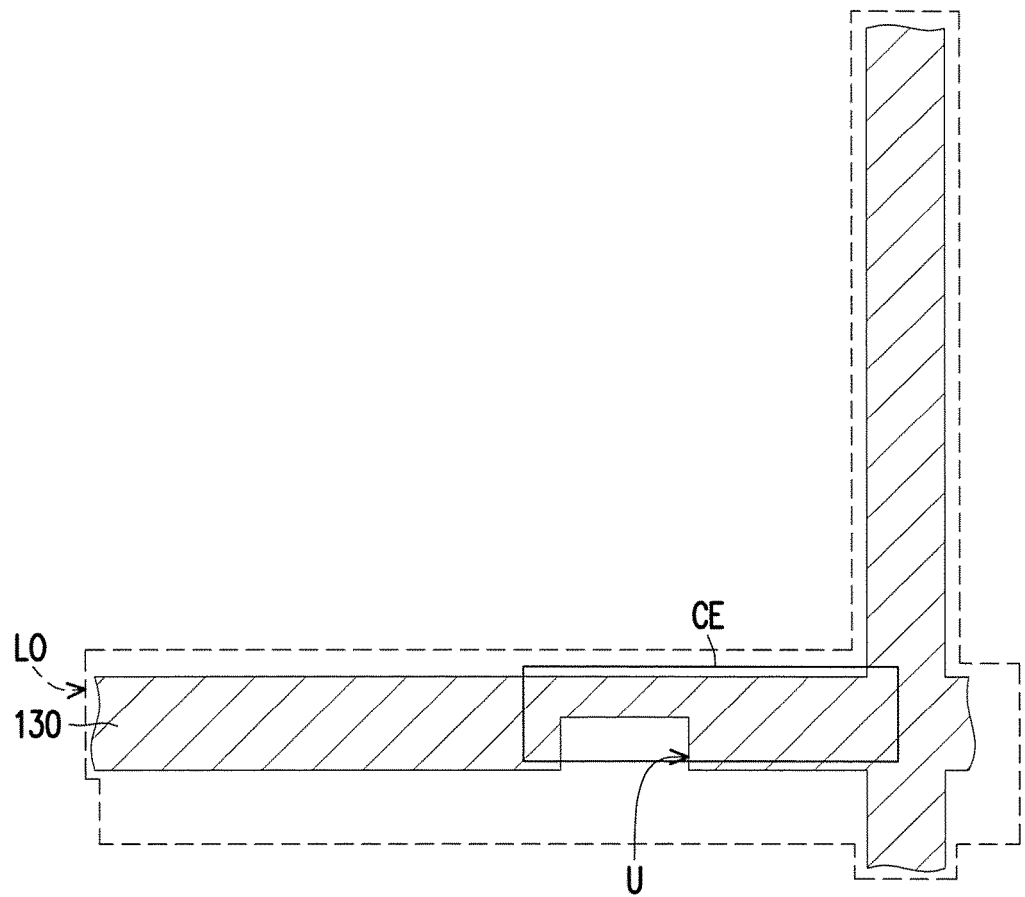

Referring to FIG. 21B, the dielectric layer CSL (as shown in FIG. 22) is formed on the capacitor electrode CE. Then, the shielding layer 130 is formed on the dielectric layer CSL. The shielding layer 130 is, for example, located on the layout area LO of the substrate. In the present embodiment, the film layer where the capacitor electrode CE belongs to is located between a film layer where the shielding layer 130 belongs to and the substrate 110. The shielding layer 130 has an opening U corresponding to the capacitor electrode CE, where an accommodating space of the opening U may be overlapped with a part of the capacitor electrode CE. In the present embodiment, the opening U of the shielding layer 130 is a rectangle, though the invention is not limited thereto, and in other embodiments, the opening U may have a round shape, a triangular shape or other geometric shapes.

Figure 21C:
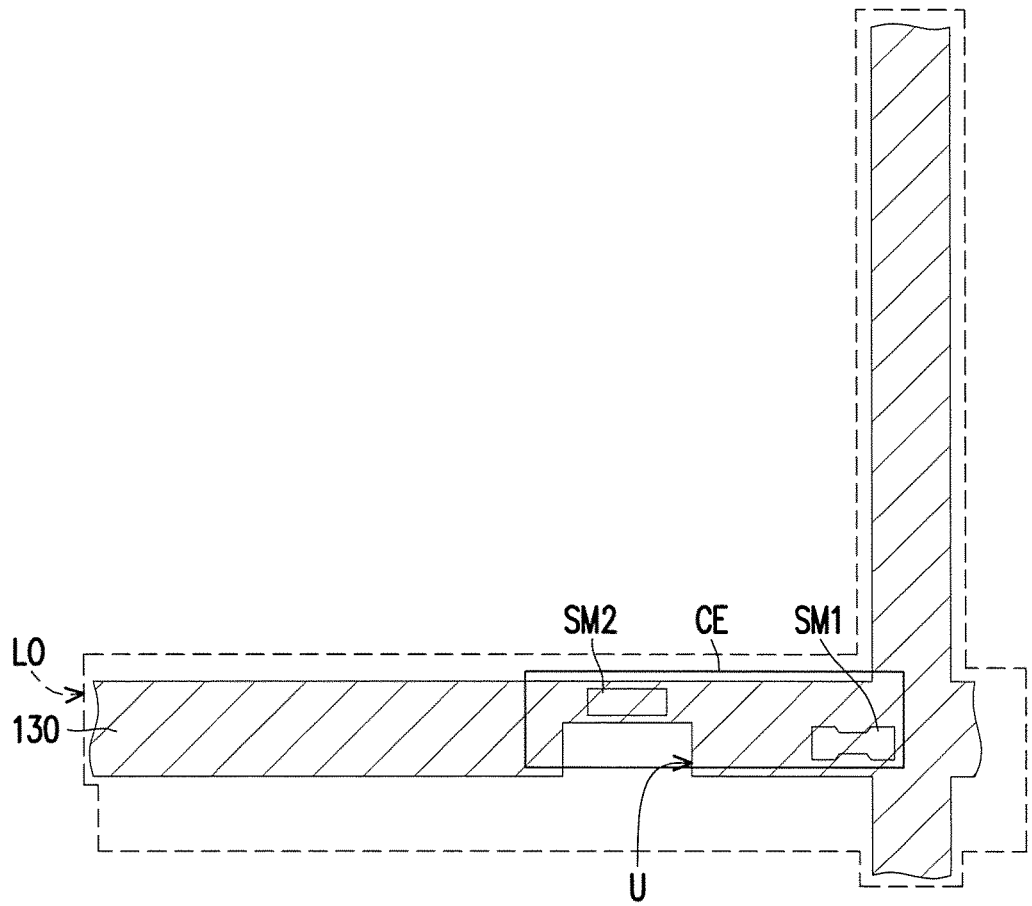

Referring to FIG. 21C, the first channel layer SM1 and the second channel layer SM2 are formed on the shielding layer 130. In some embodiments, the inter-layer 140, the planarization layer 150 and the buffer layer 160 are further disposed between the shielding layer 130 and the first channel layer SM1 and between the shielding layer 130 and the second channel layer SM2 (as shown in FIG. 22). The methods for forming the inter-layer 140, the planarization layer 150, the buffer layer 160, the first channel layer SM1 and the second channel layer SM2 may be similar to that of the aforementioned embodiments. After the first channel layer SM1 and the second channel layer SM2 are fabricated, the gate insulation layer 170 covering the first channel layer SM1 and the second channel layer SM2 is formed (as shown in FIG. 22).

Figure 21D:
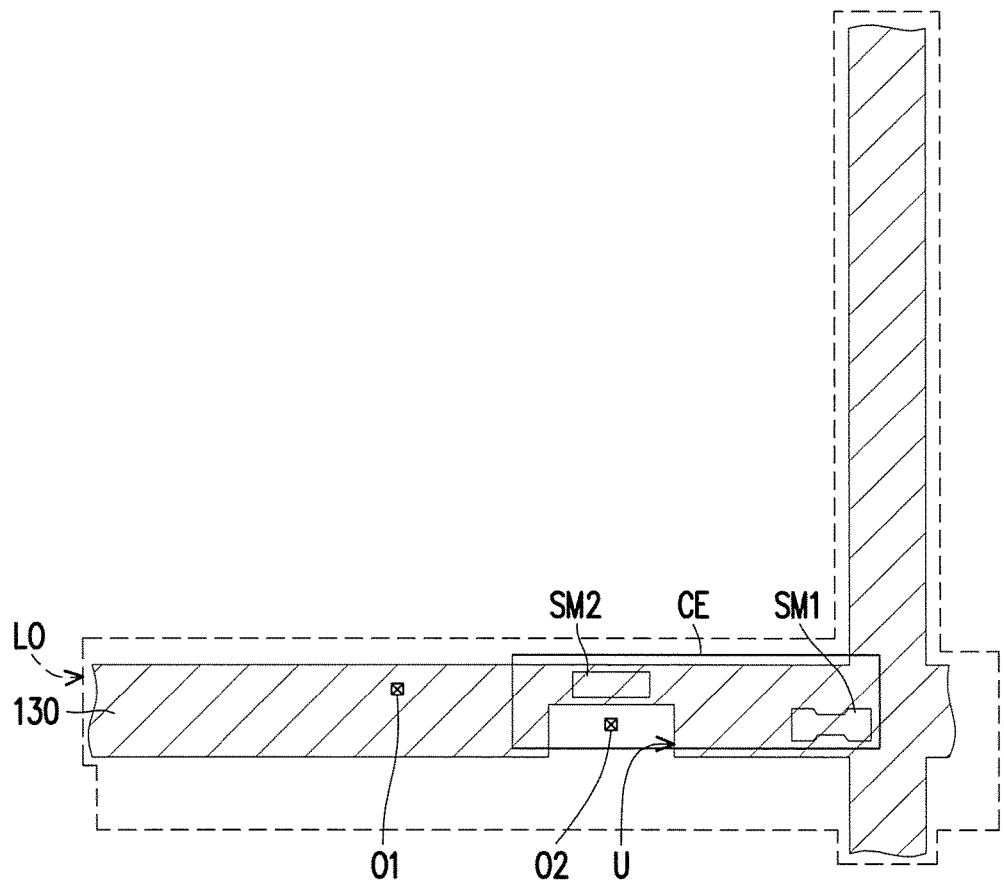

Referring to FIG. 21D, an etching process is adopted to form the opening O1 and the opening O2. The opening O1 is, for example, located in the inter-layer 140, the planarization layer 150, the buffer layer 160 and the gate insulation layer 170 (as shown in FIG. 22). The opening O1 exposes a part of the shielding layer 130. The opening O2 is, for example, located in the dielectric layer CSL, the inter-layer 140, the planarization layer 150, the buffer layer 160 and the gate insulation layer 170 (as shown in FIG. 22). The opening O2 exposes a part of the capacitor electrode CE.

Figure 21E:
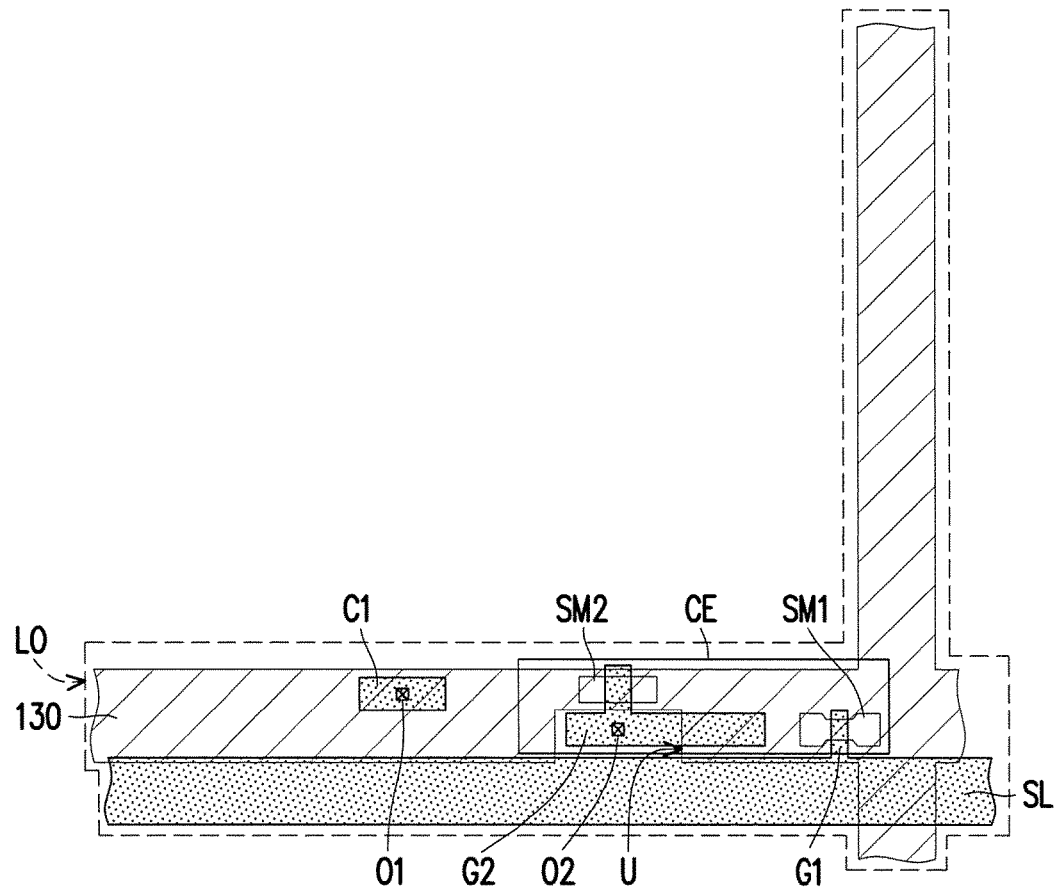

Referring to FIG. 21E, the scan line SL, the first gate G1, the second gate G2 and the conductive structure C1 are formed. The scan line SL, the first gate G1, the second gate G2 and the conductive structure C1 are, for example, located on the layout area LO of the substrate 110. The first gate G1 is connected to the scan line SL, and is located on the first channel layer SM1. The first gate G1 and the scan line SL are separated from the second gate G2. The second gate G2 is located on the second channel layer SM2. In the present embodiment, a part of the second gate G2 may be extended to the top of the opening U of the shielding layer 130, and the second gate G2 is electrically connected to the capacitor electrode CE through the opening O2. The conductive structure C1 is filled in the opening O1 and electrically connected to the shielding layer 130.

Figure 21F:
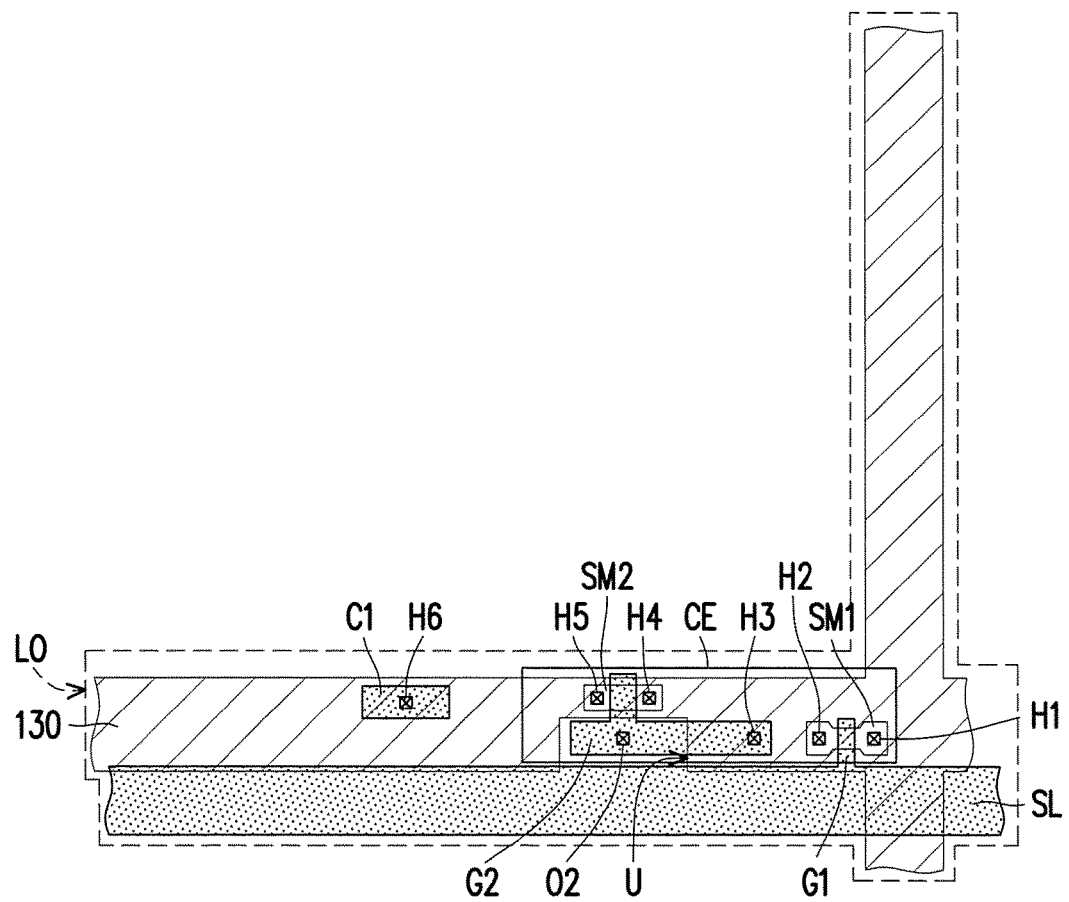

Then, referring to FIG. 21F, the dielectric layer 180 is formed on the first gate G1 and the second gate G2 (as shown in FIG. 22). The dielectric layer 180, for example, covers the conductive structure C1, the scan line SL, the first gate G1 and the second gate G2. An etching process is adopted to form the opening H1, the opening H2, the opening H3, the opening H4, the opening H5 and the opening H6 on the dielectric layer 180. In some embodiments, the opening H1, the opening H2, the opening H4 and the opening H5 are located in the dielectric layer 180 and the gate insulation layer 170. The opening H1 and the opening H2 expose a part of the first channel layer SM1, and the opening H4 and the opening H5 expose a part of the second channel layer SM2. In some embodiments, the opening H3 and the opening H6 are located in the dielectric layer 180. The opening H3 exposes a part of the second gate G2, and the opening H6 exposes a part of the conductive structure C1

Figure 21G:
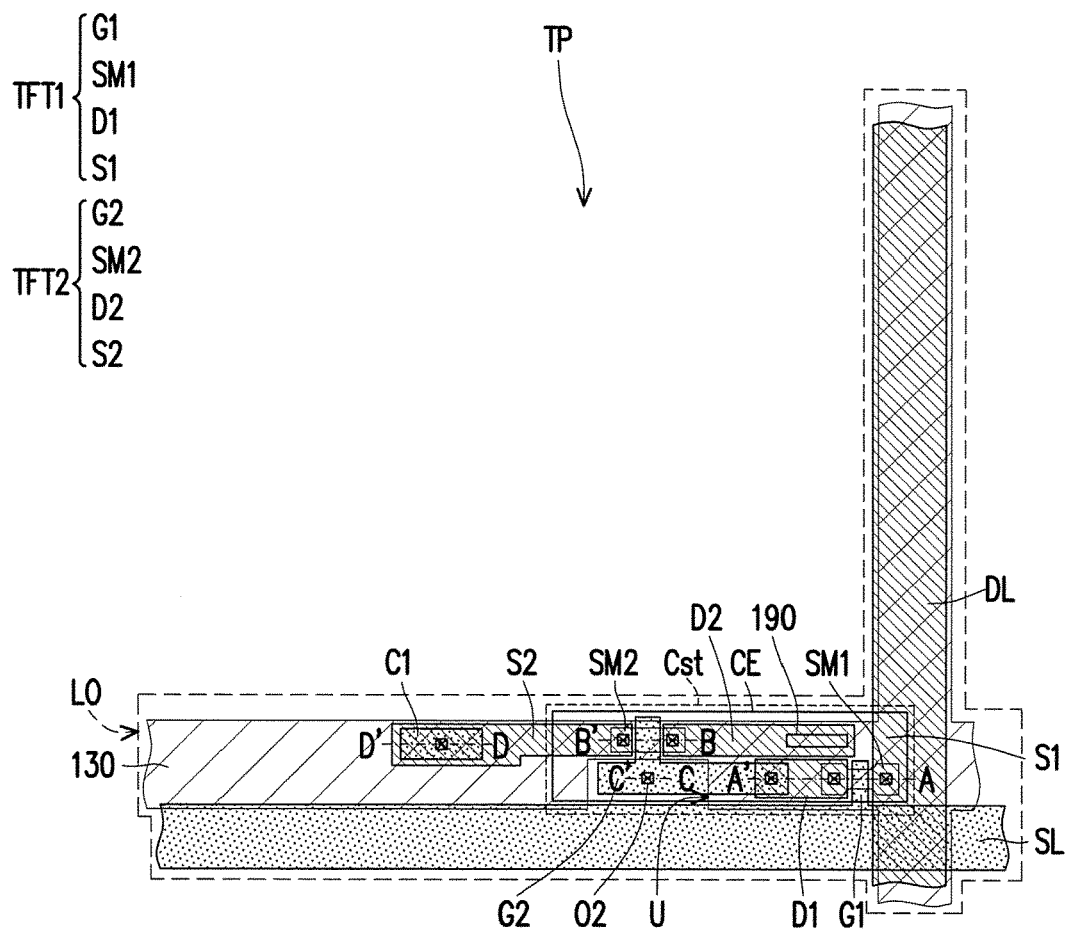

Referring to FIG. 21G and FIG. 22, the data line DL, the first source S1, the first drain D1, the second source S2 and the second drain D2 are formed on the dielectric layer 180. The data line DL, the first source S1, the first drain D1, the second source S2 and the second drain D2 are, for example, located on the layout area LO of the substrate 110. In the present embodiment, the data line DL is located above the shielding layer 130, and the first source S1 is connected to the data line DL. In the present embodiment, orthogonal projections of the data line DL and the shielding layer 130 on the substrate 110 are overlapped with each other, such that the light-transmitting area TP on the substrate 110 may have a larger area.

The first source S1 and the first drain D1 are electrically connected to the first channel layer SM1 through the opening H1 and the opening H2, respectively. The first drain D1 is electrically connected to the second gate G2 through the opening H3.

The second drain D2 and the second source S2 are electrically connected to the second channel layer SM2 through the opening H4 and the opening H5, respectively. The second drain D2 may be electrically connected to the display device 190.

The conductive structure C2 is filled in the opening H6, and the second source S2 is electrically connected to the conductive structure C1 through the conductive structure C2. In the present embodiment, the second source S2 is electrically connected to the shielding layer 130 through the conductive structure CT1, where the conductive structure CT1 is a multi-layered structure including the conductive structure C1 and the conductive structure C2, though the invention is not limited thereto. In other embodiments, the second source S2 may be electrically connected to the shielding layer 130 through the single layered conductive structure C2.

In the present embodiment, the driving circuit includes the scan line SL, the data line DL, the first active device TFT1 and the second active device TFT2. The first active device TFT1 includes the first channel layer SM1, the first gate G1, the first source S1 and the first drain D1, and the second active device TFT2 includes the second channel layer SM2, the second gate G2, the second source S2 and the second drain D2. In the present embodiment, the shielding layer 130 electrically connected to the second source S2 may be overlapped with the capacitor electrode CE electrically connected to the second gate G2, and the storage capacitor Cst is formed between the shielding layer 130 and the capacitor electrode CE.

The power line includes the shielding layer 130, and the shielding layer 130 connected to the second source S2 may transmit the signal voltage (VDD) to the second active device TFT2. In the present embodiment, a part of the capacitor electrode CE and a part of the shielding layer 130 are located between the first active device TFT1 and the substrate 110 and/or between the second active device TFT2 and the substrate 110. An orthogonal projection of the shielding layer 130 used for transmitting the signal voltage (VDD) and the capacitor electrode CE on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 and the capacitor electrode CE may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 and the capacitor electrode CE may mitigate an influence of the external light and/or static electricity on the first active device TFT1 and the second active device TFT2.

Figure 23:
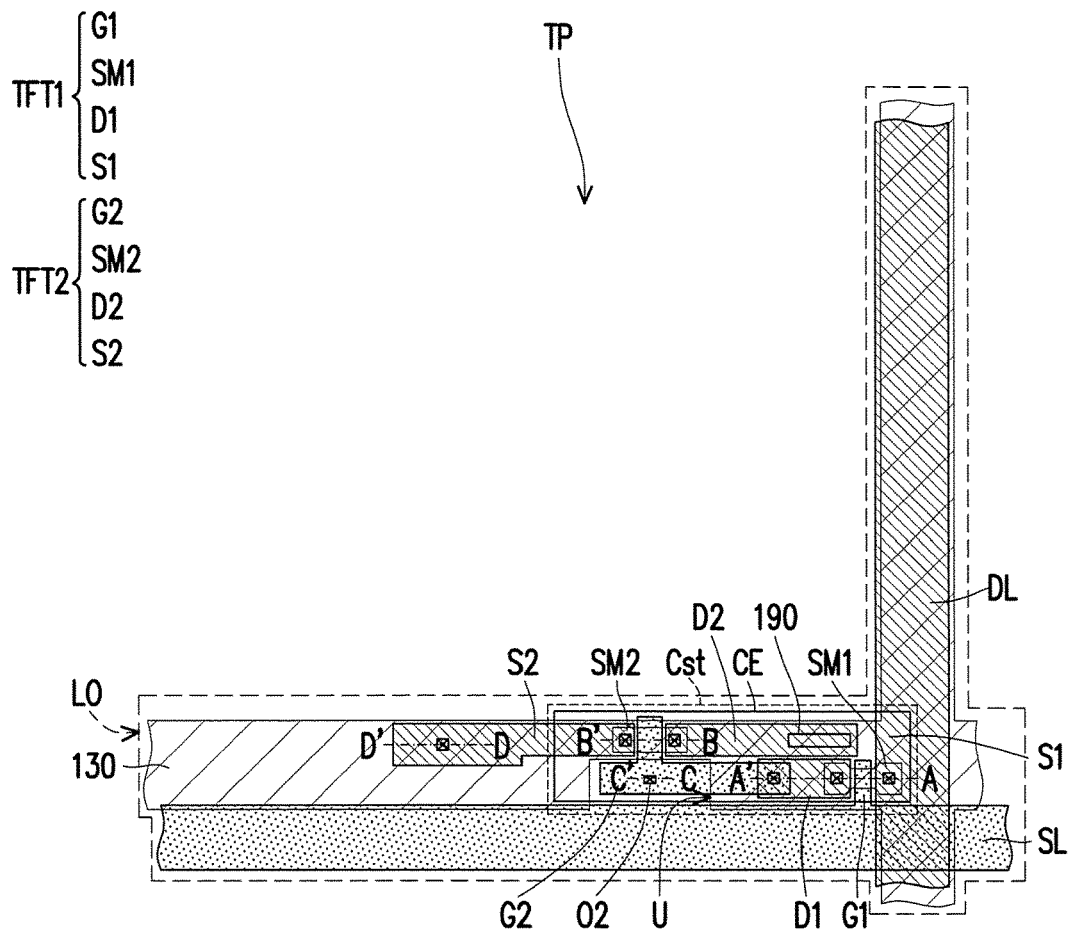
FIG. 23 is a top view of a method for manufacturing a pixel structure of a display panel according to a twelfth embodiment of the disclosure.
Figure 24:
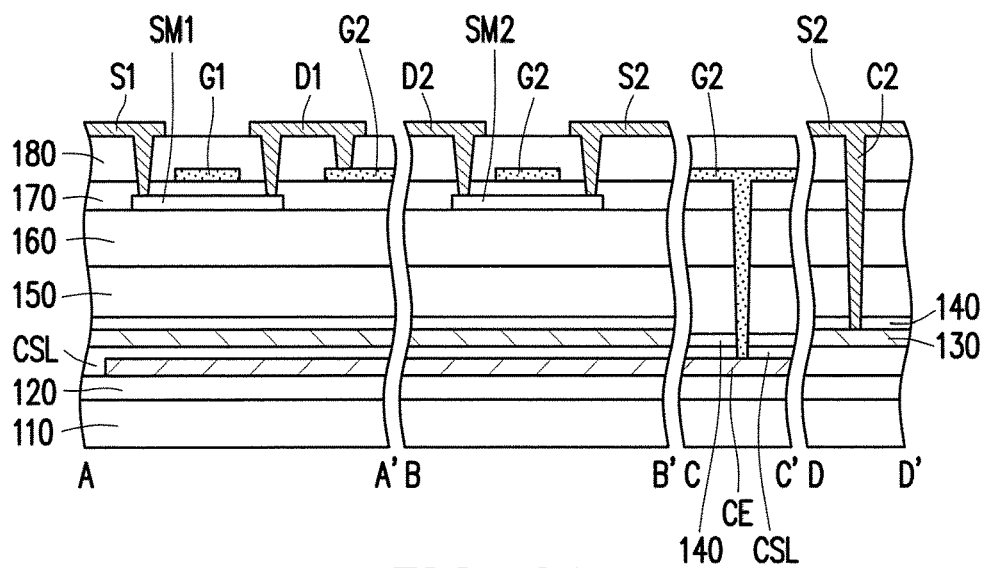
FIG. 24 is a cross-sectional view of FIG. 23 along section lines AA', BB', CC' and DD'.

FIG. 23 is a top view of a method for manufacturing a pixel structure of a display panel according to a twelfth embodiment of the disclosure. FIG. 24 is a cross-sectional view of FIG. 23 along section lines AA', BB', CC' and DD'. It should be noted that reference numbers of the components and a part of contents of the eleventh embodiment of FIGS. 21A-21G and FIG. 22 are also used in the twelfth embodiment of FIG. 23 and FIG. 24, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, the second source S2 is electrically connected to the shielding layer 130 through the single layered conductive structure C2, so that the problem of inaccurate alignment of the conductive structure is not liable to be occurred, which improves a product yield. In some embodiments, by setting the conductive structure C2 in an opening formed by an etching process, more circuit layout space is acquired to improve an aperture ratio of the display panel.

In the present embodiment, the power line includes the shielding layer 130, and the shielding layer 130 connected to the second source S2 may transmit the signal voltage (VDD) to the second active device TFT2. In the present embodiment, a part of the capacitor electrode CE and a part of the shielding layer 130 are located between the first active device TFT1 and the substrate 110 and/or between the second active device TFT2 and the substrate 110. An orthogonal projection of the shielding layer 130 used for transmitting the signal voltage (VDD) and the capacitor electrode CE on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 and the capacitor electrode CE may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 and the capacitor electrode CE may mitigate an influence of the external light and/or static electricity on the first active device TFT1 and the second active device TFT2.

Figure 25:
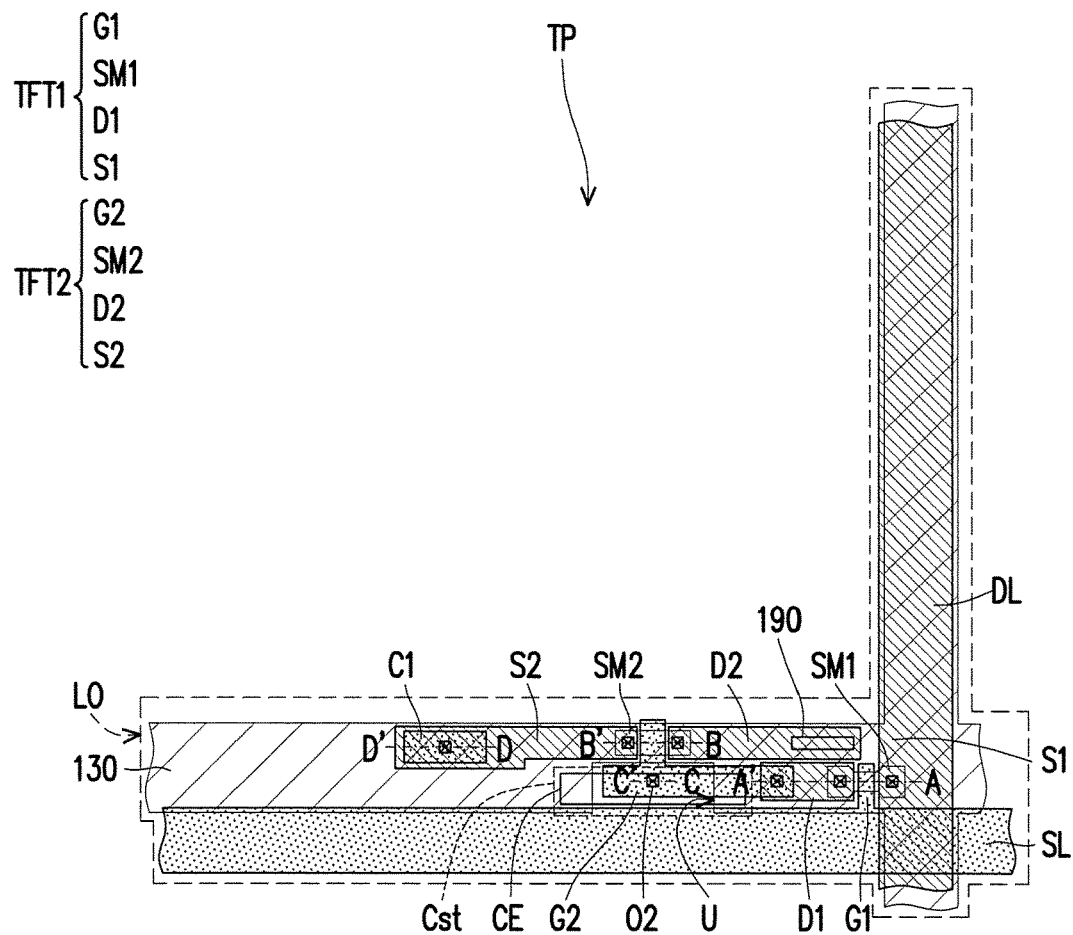
FIG. 25 is a top view of a method for manufacturing a pixel structure of a display panel according to a thirteenth embodiment of the disclosure.
Figure 26:
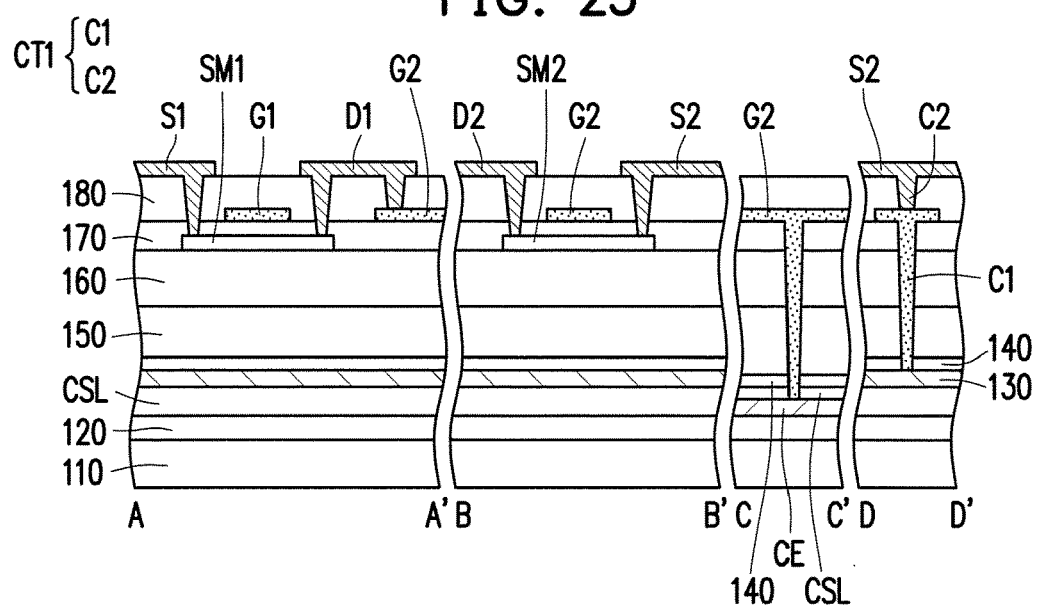
FIG. 26 is a cross-sectional view of FIG. 25 along section lines AA', BB', CC' and DD'.

FIG. 25 is a top view of a method for manufacturing a pixel structure of a display panel according to a thirteenth embodiment of the disclosure. FIG. 26 is a cross-sectional view of FIG. 25 along section lines AA', BB', CC' and DD'. It should be noted that reference numbers of the components and a part of contents of the eleventh embodiment of FIGS. 21A-21G and FIG. 22 are also used in the thirteenth embodiment of FIG. 25 and FIG. 26, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, an area of the capacitor electrode CE is relatively small, and the capacitor electrode CE is not overlapped with the first channel layer SM1 of the first active device TFT1 and the second channel layer SM2 of the second active device TFT2. However, a part of the capacitor electrode CE is overlapped with the shielding layer 130 to construct the storage capacitor Cst.

In the present embodiment, the power line includes the shielding layer 130, and the shielding layer 130 connected to the second source S2 may transmit the signal voltage (VDD) to the second active device TFT2. In the present embodiment, a part of the shielding layer 130 used for transmitting the signal voltage is located between the first active device TFT1 and the substrate 110 and/or between the second active device TFT2 and the substrate 110. An orthogonal projection of the shielding layer 130 used for transmitting the signal voltage (VDD) on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 may mitigate an influence of the external light and/or static electricity on the first active device TFT1 and the second active device TFT2.

Figure 27:
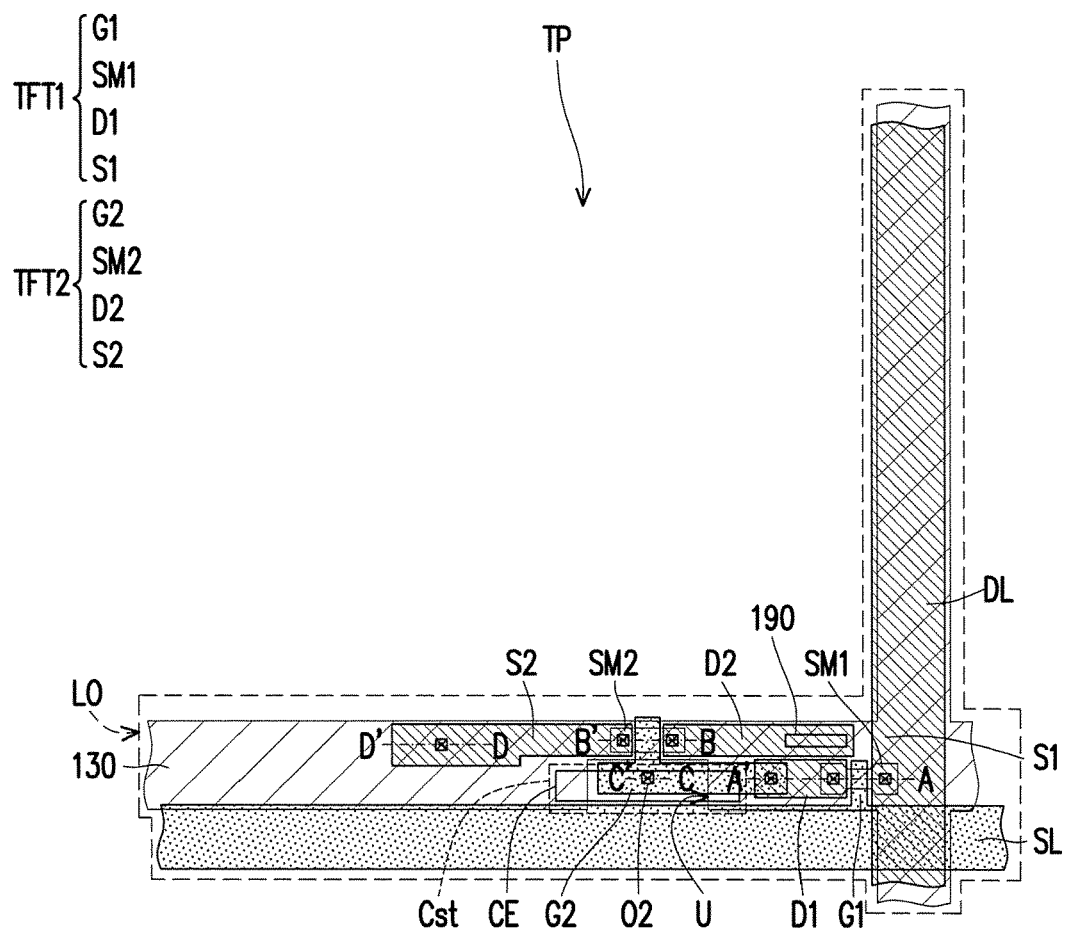
FIG. 27 is a top view of a method for manufacturing a pixel structure of a display panel according to a fourteenth embodiment of the disclosure.
Figure 28:
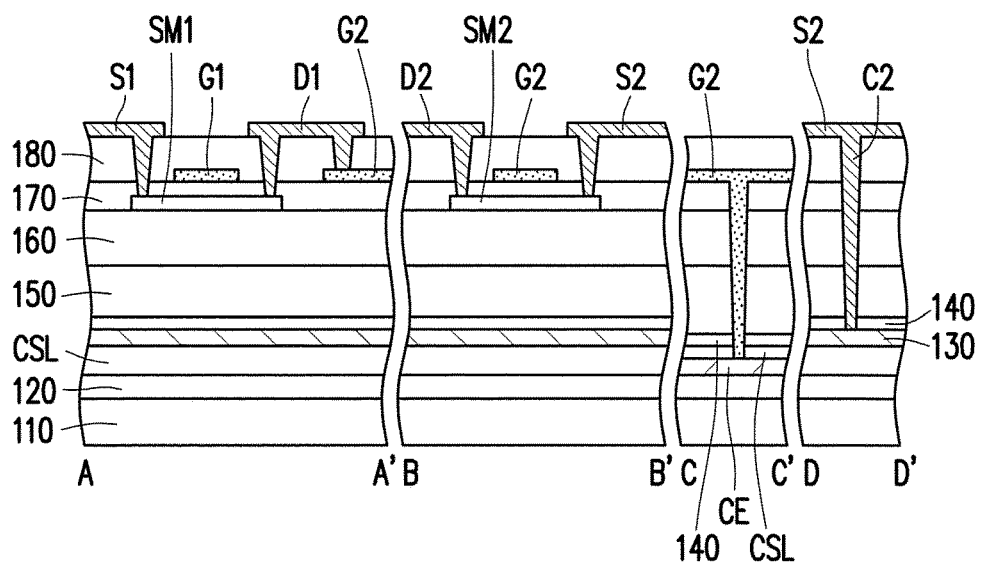
FIG. 28 is a cross-sectional view of FIG. 27 along section lines AA', BB', CC' and DD'.

FIG. 27 is a top view of a method for manufacturing a pixel structure of a display panel according to a fourteenth embodiment of the disclosure. FIG. 28 is a cross-sectional view of FIG. 27 along section lines AA', BB', CC' and DD'. It should be noted that reference numbers of the components and a part of contents of the twelfth embodiment of FIG. 23 and FIG. 24 are also used in the fourteenth embodiment of FIG. 27 and FIG. 28, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, an area of the capacitor electrode CE is relatively small, and the capacitor electrode CE is not overlapped with the first channel layer SM1 of the first active device TFT1 and the second channel layer SM2 of the second active device TFT2. However, a part of the capacitor electrode CE is overlapped with the shielding layer 130 to construct the storage capacitor Cst.

In the present embodiment, the power line includes the shielding layer 130, and the shielding layer 130 connected to the second source S2 may transmit the signal voltage (VDD) to the second active device TFT2. In the present embodiment, a part of the shielding layer 130 used for transmitting the signal voltage is located between the first active device TFT1 and the substrate 110 and/or between the second active device TFT2 and the substrate 110. An orthogonal projection of the shielding layer 130 used for transmitting the signal voltage (VDD) on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 may be overlapped with the first active device TFT1 and/or the second active device TFT2. In an embodiment, a distance between the shielding layer 130 and the first active device TFT1 (and the second active device TFT2) ranges between about 500 nm and about 2500 nm. In an embodiment, an electric field intensity between the shielding layer 130 and the first active device TFT1 (and the second active device TFT2) is smaller than about 0.3 MV/cm. The shielding layer 130 may mitigate an influence of the external light and/or static electricity on the first active device TFT1 and the second active device TFT2.

Figure 29:
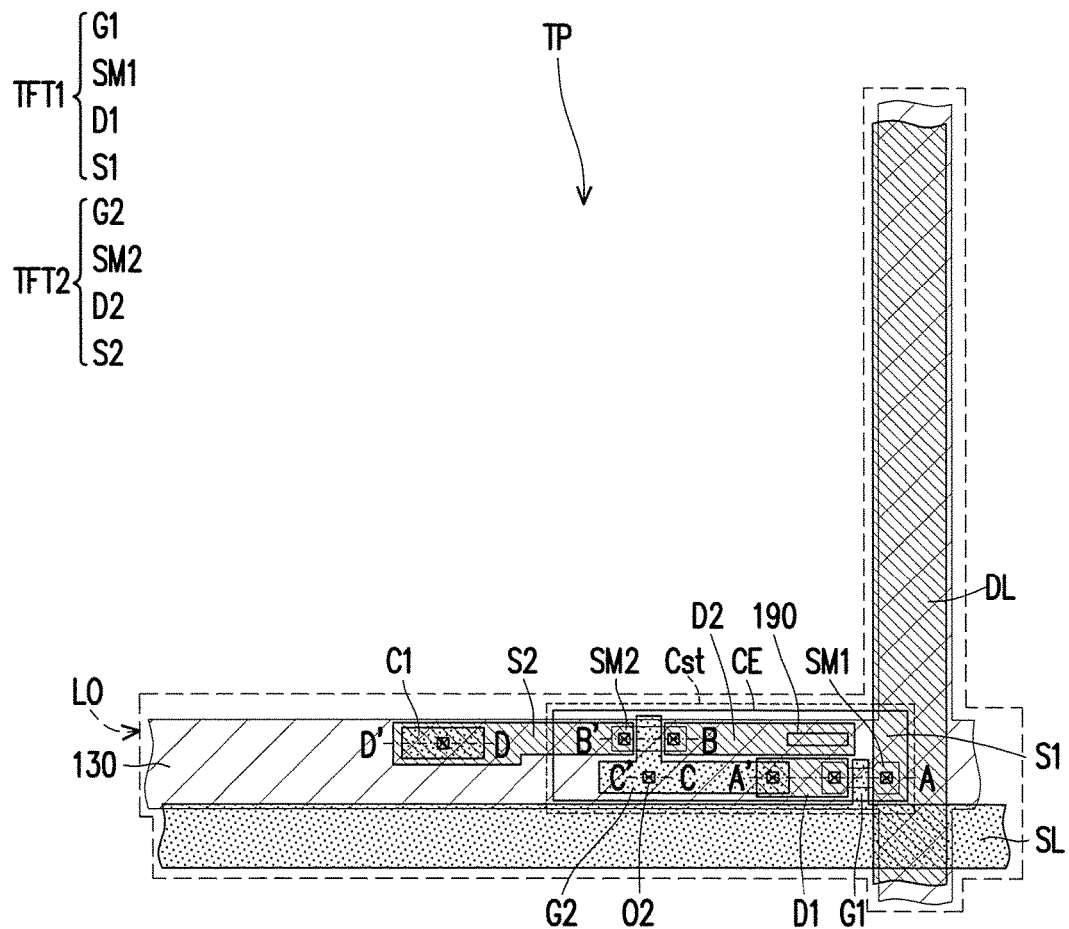
FIG. 29 is a top view of a method for manufacturing a pixel structure of a display panel according to a fifteenth embodiment of the disclosure.
Figure 30:
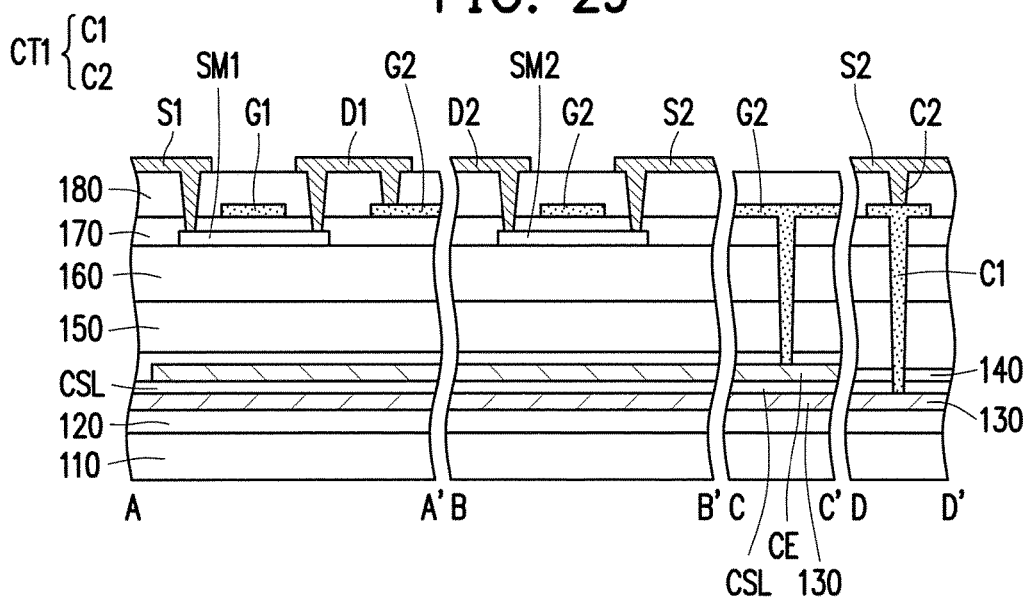
FIG. 30 is a cross-sectional view of FIG. 29 along section lines AA', BB', CC' and DD'.

FIG. 29 is a top view of a method for manufacturing a pixel structure of a display panel according to a fifteenth embodiment of the disclosure. FIG. 30 is a cross-sectional view of FIG. 29 along section lines AA', BB', CC' and DD'. It should be noted that reference numbers of the components and a part of contents of the fifth embodiment of FIGS. 9A-9G and FIG. 10 are also used in the fifteenth embodiment of FIG. 29 and FIG. 30, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, the data line DL and the first source S1 belong to a same film layer and are connected to each other, and the data line DL is located above the shielding layer 130. Orthogonal projections of the data line DL and the shielding layer 130 on the substrate 110 are overlapped with each other, and the light-transmitting area TP on the substrate 110 may have a larger area.

The power line includes the shielding layer 130, and the shielding layer 130 connected to the second source S2 may transmit the signal voltage (VDD) to the second active device TFT2. In the present embodiment, a part of the capacitor electrode CE and a part of the shielding layer 130 are located between the first active device TFT1 and the substrate 110 and/or between the second active device TFT2 and the substrate 110. An orthogonal projection of the shielding layer 130 used for transmitting the signal voltage (VDD) and the capacitor electrode CE on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 and the capacitor electrode CE may be overlapped with the first active device TFT1 and/or the second active device TFT2. In an embodiment, a distance between the capacitor electrode CE and the first active device TFT1 (and the second active device TFT2) ranges between about 500 nm and about 2500 nm. In an embodiment, an electric field intensity between the capacitor electrode CE and the first active device TFT1 (and the second active device TFT2) is smaller than about 0.3 MV/cm. The shielding layer 130 and the capacitor electrode CE may mitigate an influence of the external light and/or static electricity on the first active device TFT1 and the second active device TFT2.

Figure 31:
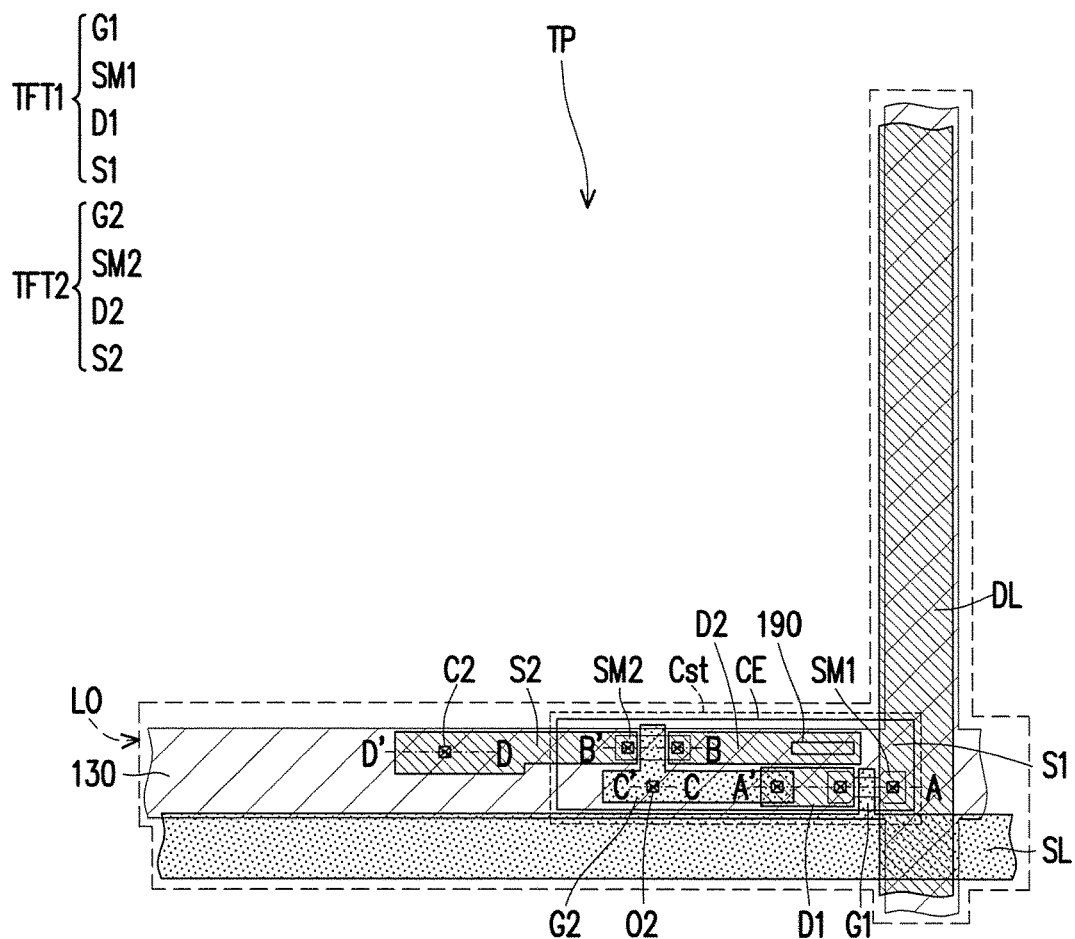
FIG. 31 is a top view of a method for manufacturing a pixel structure of a display panel according to a sixteenth embodiment of the disclosure.
Figure 32:
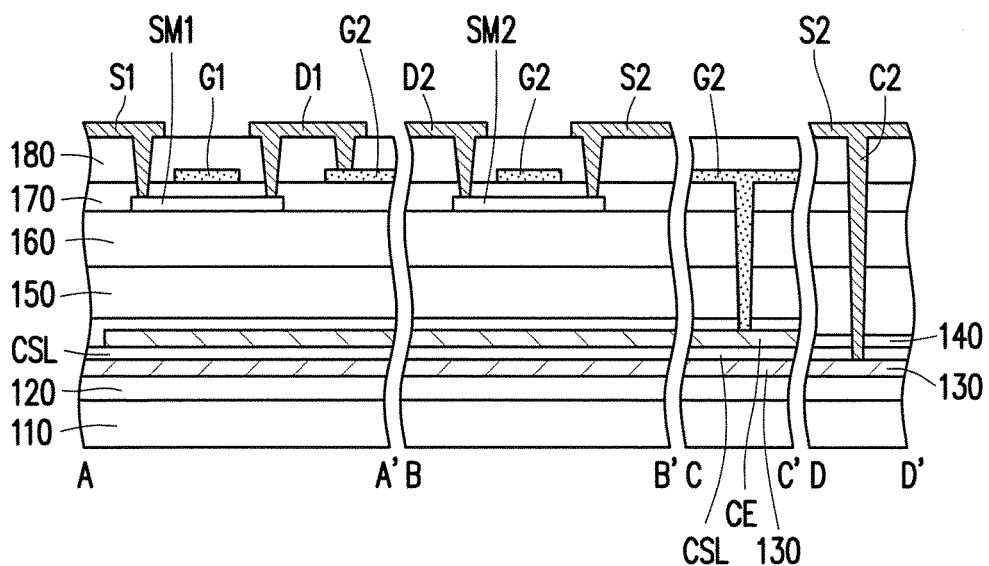
FIG. 32 is a cross-sectional view of FIG. 31 along section lines AA', BB', CC' and DD'.

FIG. 31 is a top view of a method for manufacturing a pixel structure of a display panel according to a sixteenth embodiment of the disclosure. FIG. 32 is a cross-sectional view of FIG. 31 along section lines AA', BB', CC' and DD'. It should be noted that reference numbers of the components and a part of contents of the sixth embodiment of FIG. 11 and FIG. 12 are also used in the sixteenth embodiment of FIG. 31 and FIG. 32, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, the data line DL and the first source S1 belong to a same film layer and are connected to each other, and the data line DL is located above the shielding layer 130. Since the orthogonal projections of the data line DL and the shielding layer 130 on the substrate 110 are overlapped with each other, the light-transmitting area TP on the substrate 110 may have a larger area.

The power line includes the shielding layer 130, and the shielding layer 130 connected to the second source S2 may transmit the signal voltage (VDD) to the second active device TFT2. In the present embodiment, a part of the capacitor electrode CE and a part of the shielding layer 130 are located between the first active device TFT1 and the substrate 110 and/or between the second active device TFT2 and the substrate 110. An orthogonal projection of the shielding layer 130 used for transmitting the signal voltage (VDD) and the capacitor electrode CE on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 and the capacitor electrode CE may be overlapped with the first active device TFT1 and/or the second active device TFT2. In an embodiment, a distance between the capacitor electrode CE and the first active device TFT1 (and the second active device TFT2) ranges between about 500 nm and about 2500 nm. In an embodiment, an electric field intensity between the capacitor electrode CE and the first active device TFT1 (and the second active device TFT2) is smaller than about 0.3 MV/cm. The shielding layer 130 and the capacitor electrode CE may mitigate an influence of the external light and/or static electricity on the first active device TFT1 and the second active device TFT2.

Figure 33:
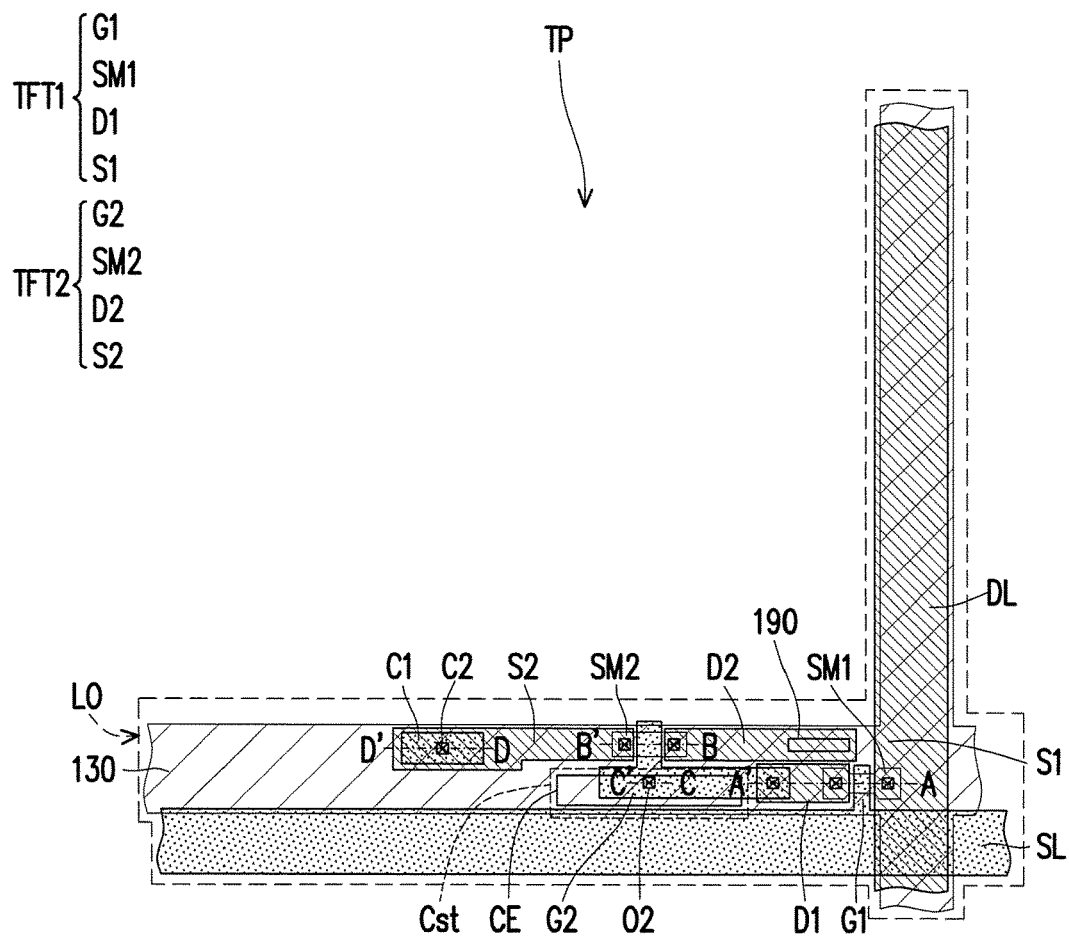
FIG. 33 is a top view of a method for manufacturing a pixel structure of a display panel according to a seventeenth embodiment of the disclosure.
Figure 34:
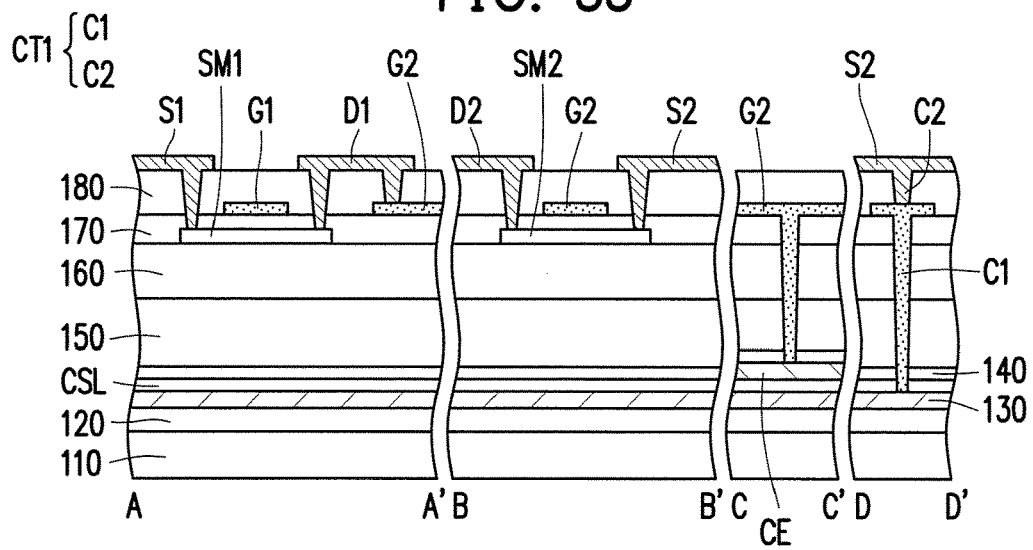
FIG. 34 is a cross-sectional view of FIG. 33 along section lines AA', BB', CC' and DD'.

FIG. 33 is a top view of a method for manufacturing a pixel structure of a display panel according to a seventeenth embodiment of the disclosure. FIG. 34 is a cross-sectional view of FIG. 33 along section lines AA', BB', CC' and DD'. It should be noted that reference numbers of the components and a part of contents of the fifteenth embodiment of FIG. 29 and FIG. 30 are also used in the seventeenth embodiment of FIG. 33 and FIG. 34, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, au area of the capacitor electrode CE is relatively small, and the capacitor electrode CE is not overlapped with the first channel layer SM1 of the first active device TFT1 and the second channel layer SM2 of the second active device TFT2. However, a part of the capacitor electrode CE is overlapped with the shielding layer 130 to construct the storage capacitor Cst.

In the present embodiment, the power line includes the shielding layer 130, and the shielding layer 130 connected to the second source S2 may transmit the signal voltage (VDD) to the second active device TFT2. In the present embodiment, a part of the shielding layer 130 used for transmitting the signal voltage is located between the first active device TFT1 and the substrate 110 and/or between the second active device TFT2 and the substrate 110. An orthogonal projection of the shielding layer 130 used for transmitting the signal voltage (VDD) on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 may be overlapped with the first active device TFT1 and/or the second active device TFT2. In an embodiment, a distance between the capacitor electrode CE and the first active device TFT1 (and the second active device TFT2) ranges between about 500 nm and about 2500 nm. In an embodiment, an electric field intensity between the capacitor electrode CE and the first active device TFT1 (and the second active device TFT2) is smaller than about 0.3 MV/cm. The shielding layer 130 may mitigate an influence of the external light and/or static electricity on the first active device TFT1 and the second active device TFT2.

Figure 35:
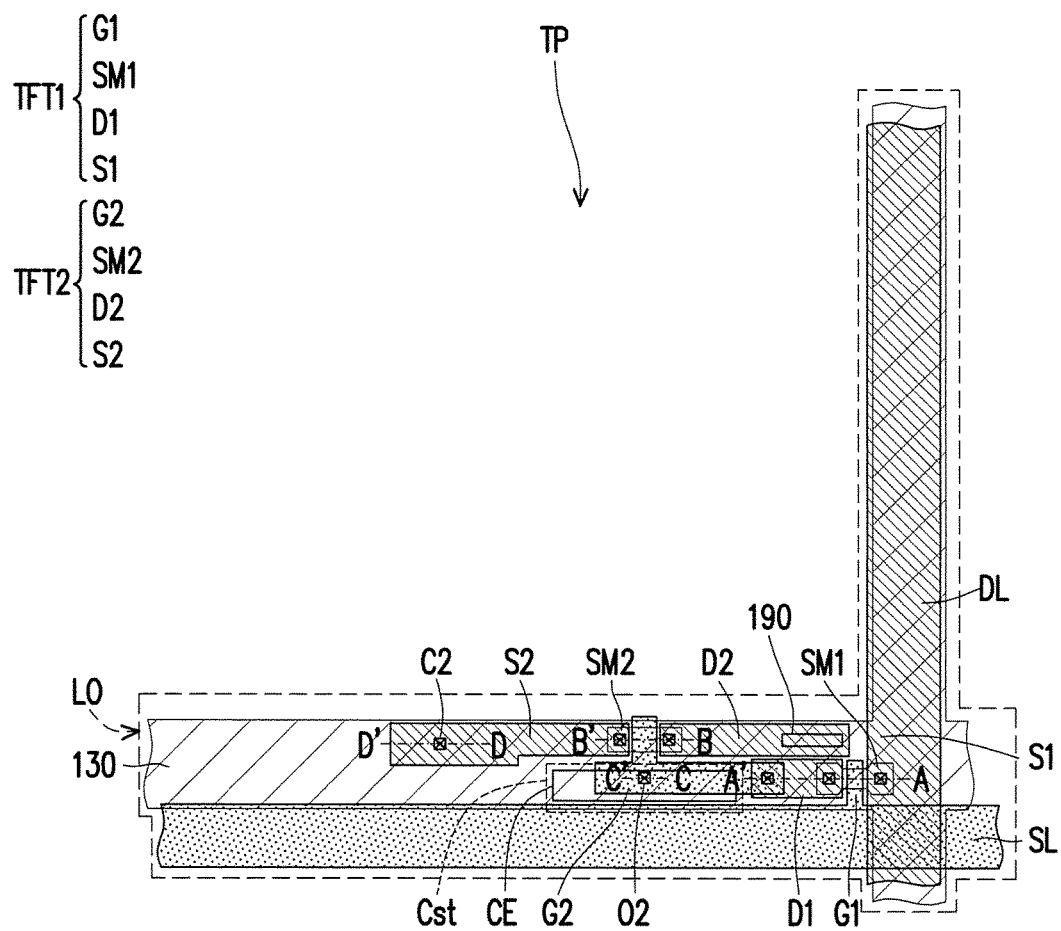
FIG. 35 is a top view of a method for manufacturing a pixel structure of a display panel according to an eighteenth embodiment of the disclosure.
Figure 36:
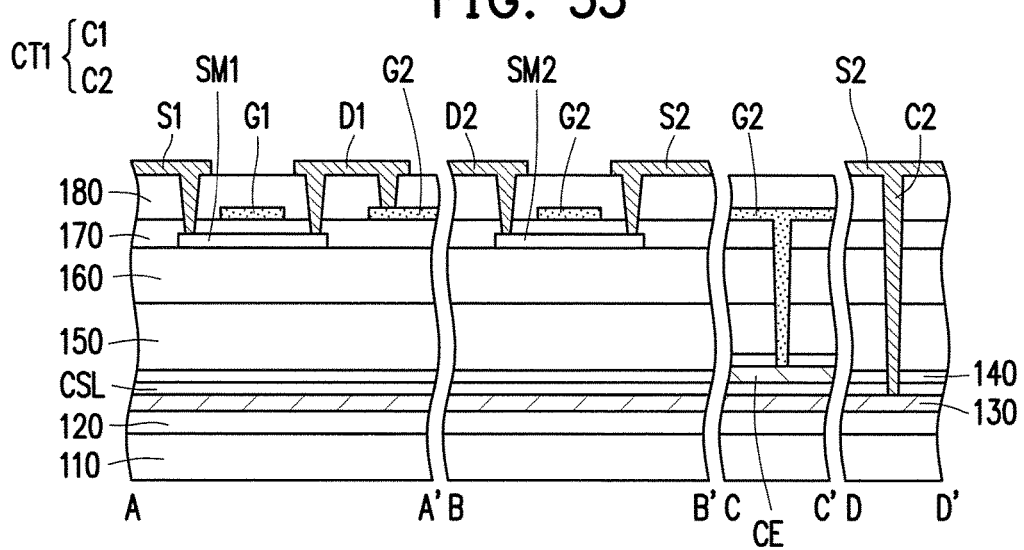
FIG. 36 is a cross-sectional view of FIG. 35 along section lines AA', BB', CC' and DD'.

FIG. 35 is a top view of a method for manufacturing a pixel structure of a display panel according to an eighteenth embodiment of the disclosure. FIG. 36 is a cross-sectional view of FIG. 35 along section lines AA', BB', CC' and DD'. It should be noted that reference numbers of the components and a part of contents of the sixteenth embodiment of FIG. 31 and FIG. 32 are also used in the eighteenth embodiment of FIG. 35 and FIG. 36, wherein the same reference numbers denote the same or like components, and descriptions of the same technical contents are omitted. The aforementioned embodiment can be referred for descriptions of the omitted parts, and detailed descriptions thereof are not repeated in the following embodiment.

In the present embodiment, an area of the capacitor electrode CE is relatively small, and the capacitor electrode CE is not overlapped with the first channel layer SM1 of the first active device TFT1 and the second channel layer SM2 of the second active device TFT2. However, a part of the capacitor electrode CE is overlapped with the shielding layer 130 to construct the storage capacitor Cst.

In the present embodiment, the power line includes the shielding layer 130, and the shielding layer 130 connected to the second source S2 may transmit the signal voltage (VDD) to the second active device TFT2. In the present embodiment, a part of the shielding layer 130 used for transmitting the signal voltage is located between the first active device TFT1 and the substrate 110 and/or between the second active device TFT2 and the substrate 110. An orthogonal projection of the shielding layer 130 used for transmitting the signal voltage (VDD) on the substrate 110 may be partially overlapped with an orthogonal projection of the first active device TFT1 and/or the second active device TFT2 on the substrate 110. The light-transmitting area TP on the substrate 110 may have a larger area, such that transparency of the display panel is increased. The shielding layer 130 may be overlapped with the first active device TFT1 and/or the second active device TFT2. In an embodiment, a distance between the capacitor electrode CE and the first active device TFT1 (and the second active device TFT2) ranges between about 500 nm and about 2500 nm. In an embodiment, an electric field intensity between the capacitor electrode CE and the first active device TFT1 (and the second active device TFT2) is smaller than about 0.3 MV/cm. The shielding layer 130 may mitigate an influence of the external light and/or static electricity on the first active device TFT1 and the second active device TFT2.

In summary, in an embodiment of the invention, the shielding layer used for transmitting the signal voltage may be located under the active device. The orthogonal projection of the shielding layer used for transmitting the signal voltage (VDD) on the substrate may be partially overlapped with the orthogonal projection of the active device on the substrate. The light-transmitting area on the substrate may have a larger area, such that transparency of the display panel is increased. Moreover, the shielding layer may be overlapped with the active device, so as to mitigate the influence of the external light and/or static electricity on the active device. In some embodiments, the storage electrode and the shielding layer are located between the active device and the substrate, which may further mitigate the influence of the external light and/or static electricity on the active device. In some embodiments, the data line is located above the shielding layer, where the orthogonal projections of the data line and the shielding layer on the substrate are overlapped with each other, such that the light-transmitting area on the substrate may have a larger area.

It will be clear that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A pixel structure, comprising:
a substrate, having a layout area and a light-transmitting area located outside the layout area;
a power wire, disposed on the layout area of the substrate, and comprising a shielding layer;
a planarization layer, disposed on the substrate to cover the power wire; and
a driving circuit, disposed corresponding to the layout area, wherein the driving circuit comprises a data line, a scan line arranged in intersection with the data line, a first active device electrically connected to the data line and the scan line, a second active device electrically connected to a first drain of the first active device and the shielding layer, a first source of the first active device is electrically connected to the data line, a first gate of the first active device is electrically connected to the scan line, and the shielding layer is overlapped with the first active device, and wherein the data line is between the substrate and the shielding layer; and
a conductive structure, disposed in the planarization layer and distributed corresponding to the layout area, wherein the power wire is electrically connected with the driving circuit through the conductive structure.

2. The pixel structure as claimed in claim 1, wherein the first active device comprising:
a first channel layer, located on the substrate;
the first gate; and
the first source and the first drain, electrically connected to the first channel layer;
the second active device comprising:
a second channel layer, located on the substrate;
a second gate, electrically connected to the first drain; and
a second source and a second drain, electrically connected to the second channel layer, and the second source being electrically connected to the shielding layer.

3. The pixel structure as claimed in claim 2, wherein an orthogonal projection of a part of the second gate on the substrate is overlapped with an orthogonal projection of a part of the second source on the substrate.

4. The pixel structure as claimed in claim 2, further comprising a capacitor electrode, wherein the capacitor electrode is located between the shielding layer and the substrate, and the capacitor electrode is isolated with the shielding layer.

5. The pixel structure as claimed in claim 2, further comprising a capacitor electrode, wherein the shielding layer is located between the capacitor electrode and the substrate, and the capacitor electrode is isolated with the shielding layer.

6. The pixel structure as claimed in claim 2, further comprising a capacitor electrode, wherein the capacitor electrode and the data line belong to a same film layer.

7. The pixel structure as claimed in claim 2, wherein a part of the shielding layer is located between a part of the data line and a part of the substrate.

8. The pixel structure as claimed in claim 2, further comprising a capacitor electrode, wherein a part of the capacitor electrode and a part of the shielding layer are located between the first active device and the substrate and between the second active device and the substrate.

9. The pixel structure as claimed in claim 2, wherein the conductive structure is a single layered structure.

10. The pixel structure as claimed in claim 2, wherein the conductive structure is a multi-layered structure.

11. The pixel structure as claimed in claim 2, wherein a grain size of the first channel layer ranges between 0.1 μm and 1 μm.

12. The pixel structure as claimed in claim 1, wherein a flatness of the planarization layer is greater than or equal to 50%.

13. The pixel structure as claimed in claim 1, wherein a material of the planarization layer comprises phenol-formaldehyde, polyimide, siloxane, polymethylmethacrylate, polyetherimide, phenolics, polybenzoxazole, benzocyclobutene, or a combination thereof.

14. The pixel structure as claimed in claim 1, wherein an electric field intensity between the shielding layer and the first active device is smaller than 0.3 MV/cm.

15. The pixel structure as claimed in claim 1, wherein a distance between the shielding layer and the first active device ranges between 500 nm and 2500 nm.

16. The pixel structure as claimed in claim 1, further comprising an inter-layer disposed between the planarization layer and the shielding layer.

17. The pixel structure as claimed in claim 1, further comprising a barrier layer disposed between the shielding layer and the substrate.

18. A display panel, comprising:
the pixel structure as claimed in the claim 1; and
a display device, electrically connected to the driving circuit.

19. The display panel as claimed in claim 18, wherein the display device is disposed on the layout area.

20. The display panel as claimed in claim 18, wherein the display device comprises an organic light-emitting material.

* * * * *